(12) United States Patent
Honickman

(10) Patent No.: US 11,562,107 B2
(45) Date of Patent: *Jan. 24, 2023

(54) SYSTEMS AND METHODS FOR GENERATING A DESIGN FOR A GLIDING BOARD

(71) Applicant: Shinc Inc., Toronto (CA)

(72) Inventor: Hart Noah Honickman, Toronto (CA)

(73) Assignee: Shinc Inc., Toronto (CA)

( * ) Notice: Subject to any disclaimer, the term of this patent is extended or adjusted under 35 U.S.C. 154(b) by 265 days.

This patent is subject to a terminal disclaimer.

(21) Appl. No.: 16/998,075

(22) Filed: Aug. 20, 2020

(65) Prior Publication Data
US 2020/0380181 A1 Dec. 3, 2020

Related U.S. Application Data

(63) Continuation-in-part of application No. 16/434,662, filed on Jun. 7, 2019.
(Continued)

(30) Foreign Application Priority Data

Dec. 20, 2019 (EP) .................................... 19218904

(51) Int. Cl.
*G06F 30/17* (2020.01)
*A63C 5/12* (2006.01)
*A63C 5/04* (2006.01)

(52) U.S. Cl.
CPC .............. *G06F 30/17* (2020.01); *A63C 5/128* (2013.01); *A63C 5/0405* (2013.01)

(58) Field of Classification Search
CPC ....... G06F 30/17; A63C 5/128; A63C 5/0405; A63C 2203/18; A63C 2203/24; A63C 5/12
See application file for complete search history.

(56) References Cited

U.S. PATENT DOCUMENTS

| | | | |
|---|---|---|---|
| 2,510,794 | A | 6/1950 | Beerli |
| 5,405,161 | A | 4/1995 | Petkov |

(Continued)

FOREIGN PATENT DOCUMENTS

| | | |
|---|---|---|
| CN | 108595899 A | 9/2018 |
| EP | 182776 A2 | 5/1986 |

(Continued)

OTHER PUBLICATIONS

European Patent Office. Document relating to counterpart European Appl. No. 19218904, dated May 26, 2020 (Extended European Search Report), 7 pages.

(Continued)

*Primary Examiner* — David T Welch
(74) *Attorney, Agent, or Firm* — Bereskin & Parr LLP/S.E.N.C.R.L., s.r.l.

(57) ABSTRACT

Systems and methods are provided for generating a design for a gliding board. The methods involve operating a processor to: define a desired carved turn of the gliding board; define a desired global curvature profile; generate a desired deformed shape of the gliding board during the desired carved turn; generate a sidecut profile of the gliding board; generate a width profile of the gliding board; generate a camber profile of the gliding board; generate at least one stiffness design variable profile; generate a total load profile; modify at least the width profile, the sidecut profile and at least one of the at least one stiffness design variable profile at least once; and define the design for the gliding board based at least on the width profile, the camber profile, and the at least one stiffness design variable profile.

21 Claims, 17 Drawing Sheets

Related U.S. Application Data

(60) Provisional application No. 62/787,443, filed on Jan. 2, 2019.

(56) References Cited

U.S. PATENT DOCUMENTS

| | | | |
|---|---|---|---|
| 6,105,991 A | 8/2000 | Dodge et al. | |
| 6,113,113 A * | 9/2000 | Longoni | A63C 9/003 280/14.22 |
| 6,382,658 B1 | 5/2002 | Stubblefield | |
| 6,499,759 B2 | 12/2002 | DeBorde et al. | |
| 6,986,525 B2 | 1/2006 | Liard | |
| 7,341,271 B2 | 3/2008 | Bunter | |
| 9,044,664 B1 | 6/2015 | Canaday et al. | |
| 9,305,120 B2 | 4/2016 | Failing | |
| 2007/0182129 A1* | 8/2007 | Wilson | A63C 9/003 280/602 |
| 2008/0106069 A1* | 5/2008 | Holzer | A63C 5/003 280/602 |
| 2009/0273161 A1 | 11/2009 | Kessler | |
| 2013/0154237 A1* | 6/2013 | Karlsen | A63C 5/052 280/601 |
| 2015/0268038 A1* | 9/2015 | Thorndike | G01B 11/306 33/274 |
| 2018/0147476 A1 | 5/2018 | Nazarian et al. | |
| 2019/0255421 A1* | 8/2019 | Gross | A63C 5/07 |

FOREIGN PATENT DOCUMENTS

| | | |
|---|---|---|
| EP | 1050396 B1 | 8/2003 |
| EP | 1410826 A1 | 4/2004 |
| JP | 2955201 B2 | 10/1999 |
| JP | 2007313273 A | 12/2007 |
| WO | 2004016329 A1 | 2/2004 |

OTHER PUBLICATIONS

Clifton, Michael Patrick "Investigation and Customisation of Snowboard Performance Characteristics for Different Riding Styles", Apr. 30, 2011 (Apr. 30, 2011), XP055692383, Retrieved from the Internet: URL:https://researchbank.rmit.edu.au/eserv/rmit:11220/Clifton.pdf [retrieved on May 6, 2020], 199 pages.

Federolf et al: "Finite element simulation of the ski-snow interaction of an alpine ski in a carved turn", Sports Engineering, vol. 12, No. 3, Mar. 31, 2010 (Mar. 31, 2010), , pp. 123-133, XP055692386, London, ISSN: 1369-7072, DOI: 10.1007/S12283-010-0038-Z, 11 pages.

Brennan et al: "Modeling the mechanical characteristics and on-snow performance of snowboards", Jun. 30, 2003 (Jun. 30, 2003), XP055692388, Retrieved from the Internet: URL:https://link.springer.com/content/pdf/10.1007/BF02844023.pdf [retrieved on May 6, 2020], 14 pages.

Cesnik et al, (1997) VABS: A New Concept for Composite Rotor Blade Cross-Sectional Modeling, Journal of the American Helicopter Society, 42(1): pp. 27-38, DOI: 10.4050/JAHS.42.27, XP000642968.

Heinrich D., Mössner M., Kaps P., and Nachbauer W., (2011), A Parameter Optimization Method to Determine Ski Stiffness Properties From Ski Deformation Data, Journal of Applied Biomechanics, 27: pp. 81-86, DOI: 10.1123/iab.27.1.81.

Mössner M., Heinrich D., Schindelwig K., Kaps P., Lugner P., Schmiedmayer H.-B., Schretter H., and Nachbauer W., (2006), Modeling of the Ski-Snow Contact for a Carved Turn, The Engineering of Sport, 6: pp. 195-200, DOI: 10.1007/978-0-387-46051-2_35.

Mössner M., Heinrich D., Schindelwig K., Kaps P., Schretter H., Nachbauer W., (2014), Modeling the ski-snow contact in skiing turns using a hypoplastic vs an elastic force-penetration relation, Scandinavian Journal of Medicine and Science in Sports, 24: pp. 577-585, DOI: 10.1111/sms.12035.

Mössner M., Innerhofer G., Schindelwig K., Kaps P., Schretter H., and Nachbauer W., (2013), Measurement of mechanical properties of snow for simulation of skiing, Journal of Glaciology, 59(218): pp. 1170-1178, DOI: 0.3189/2013JoG13J031.

Federolf P., (2005), Finite Element Simulation of a Carving Ski, Doctor of Technical Sciences, Swiss Federal Institute of Technology Zurich, DISS. ETH No. 16065, 140 pages.

Federolf P., JeanRichard F., Fauve M., Lüthi A., Rhyner H.-U., Dual J., (2006), Deformation of snow during a carved ski turn, Cold Regions Science and Technology, 46: pp. 69-77, DOI: 10.1016/j.coldregions.2006.06.006.

Federolf P., Roos M., Lüthi A., Dual J., (2010), Finite element simulation of the ski-snow interaction of an alpine ski in a carved turn. Sports Engineering, 12: pp. 123-133, DOI 10.1007/s12283-010-0038-.

Honickman H., Johrendt J., and Frise P., (2014), On the torsional stiffness of thick laminated plates, Journal of Composite Materials, 48(21): pp. 2639-2655, DOI: 10.1177/0021998313501919.

Cesnik C, Hodges D, and Sutyrin V, (1996) Cross-sectional analysis of composite beams including large initial twist and curvature effects, AIAA Journal, 34(9): pp. 1913-1920, DOI: 10.2514/3.13325.

Yu, Webin et al., (2002) Validation of the variational asymptotic beam sectional analysis (VABS), AIAA Journal, 40(10): pp. 2105-2113, DOI: 10.2514/2.1545.

Brennan S., (2003), Modeling the mechanical characteristics and on-snow performance of snowboards, Doctor of Philosophy (PhD), Department of Aeronautics and Astronautics, Stanford University—A Dissertation Submitted To The Department Of Aeronautics And Astronautics And The Committee On Graduate Studies Of Stanford University In Partial Fulfillment Of The Requirements For The Degree Of Doctor Of Philosophy, 153 pages.

Perger F., Szabo D., and Rhyner H., (2016), Development of alpine skis using FE simulations, 11th conference of the International Sports Engineering Association (ISEA), Procedia Engineering, 147: pp. 366-371, DOI: 10.1016/j.proeng.2016.06.314.

Yoneyama T. et al (2010), Investigation on the ski-snow interaction in a carved turn based on the actual measurement, 8th Conference of the International Sports Engineering Association (ISEA), Procedia Engineering, 2(2): pp. 2901-2906, DOI: 10.1016/j.proeng.2010.04.085.

Jentschura U., and Fahrbach F., (2008), Physics of Skiing: The Ideal-Carving Equation and Its Applications, Canadian Journal of Physics, 82(4): pp. 249-261, DOI: 10.1139/p04-010.

Truong J., and Desbiens A.L., (2018), Evaluating the Directional Stability of Alpine Skis through the Simulation of Ski Deformation during a Steady-State Turn, 12th Conference of the International Sports Engineering Association (ISEA), Proceedings, 2(6), 315, DOI: 10.3390/proceedings2060315, 7 pages.

Jones R.M., (1975), Mechanics of composite materials, Hemisphere Publishing Corporation, New York, New York, USA, 43 pages.

Mallick P.K., (2008), Fiber-Reinforced Composites: Materials, Manufacturing, and Design, CRC Press—Taylor and Francis Group, Boca Raton, Florida, USA, 3rd edition, ISBN 978-0-8493-4205-9, 31 pages.

Budynas R.G., (1999), Advanced Strength and Applied Stress Analysis, McGraw-Hill, The McGraw-Hill Companies, New York, New York, USA, 2nd Edition, ISBN 978-0-07-008985-3, 5 pages.

Subic, A. et al (2009), Investigation of snowboard stiffness and camber characteristics for different riding styles, Sports Engineering, 11: pp. 93-101, DOI: 10.1007/s12283-008-0008-x.

Reid, R.C. et al (2020), Alpine Ski Motion Characteristics in Slalom, Frontiers in Sports and Active Living, 2:25, DOI: 10.3389/fspor.2020.00025, 12 pages.

\* cited by examiner

SYSTEMS AND METHODS FOR GENERATING A DESIGN FOR A GLIDING BOARD

CROSS-REFERENCE TO RELATED APPLICATIONS

This application claims the benefit of E.P. Patent Application No. 19218904.1 filed on Dec. 20, 2019 and is a continuation-in-part of U.S. patent application Ser. No. 16/434,662 filed on Jun. 7, 2019, which claims the benefit of U.S. Provisional Patent Application No. 62/787,443 filed on Jan. 2, 2019. The entire contents of the applications are hereby incorporated by reference.

FIELD

The described embodiments relate to systems and methods for generating a design for a gliding board, as well as a gliding board having said design.

BACKGROUND

Skiing is an activity that has broad appeal. Skis have been developed for use in a variety of skiing activities. Examples include downhill skis and cross-country skis.

Generally, athletes use skis which have been roughly sized and configured according to the environment and conditions in which those skis are to be used. For example, a larger athlete will typically use larger skis than will a smaller athlete.

However, although skis customized for the athlete and conditions offer many performance benefits, many athletes continue to use skis which are, at best, roughly chosen to correspond to conditions of use.

In the context of alpine (downhill) skiing, a carved turn can be characterized as a turn that is executed in a manner that minimizes the quantity of snow that is displaced from its resting position on the ground, thus minimizing the drag (snow resistance) that is imposed upon the ski during the turn. The term "carving" is often used in reference to the act of carrying out carved turns while skiing.

A broad variety of alpine skiing activities exist, and a correspondingly broad variety of alpine skis has been developed in order to accommodate each type of alpine skiing activity. For example, athletes wishing to ski on freshly fallen unprepared virgin snow (powder snow) would likely choose to use skis that are relatively wide, thus offering a large total surface area that would help the skis to float near the surface of the snow. Conversely, athletes wishing to ski on prepared pistes comprising smooth surfaces of firm snow (groomed trails or race courses) would likely choose to use skis that are relatively narrow, and feature precisely engineered flexural stiffness profiles that help to maximize the engagement of the edges of the skis with the snow, thus maximizing grip and minimizing drag during carved turns.

When a ski interacts with a soft substrate (such as a thick layer of powder snow), any small discrepancies in the deflected shape of the ski would have a relatively minute influence upon the overall snow pressure distribution that acts upon the base surface of the ski. Conversely, when a ski interacts with a firm substrate (such as a groomed alpine trail), any small discrepancies in the deflected shape of the ski could have a marked influence upon the snow pressure distribution that acts upon the base surface of the ski. Consequently, alpine skis that are intended for on-piste carving are particularly sensitive to the relationship that exists between the various geometric and mechanical specifications of the ski design, as well as the precision and accuracy with which said skis were manufactured.

Existing approaches to ski design attempt to account for the complex geometric and mechanical aspects of skis, and the interaction between those skis and various types of snow conditions, largely based on design experience and/or engineering judgement, and often in the context of extremely simplified models of the skis and snow. There exists a need for an automated approach to alpine ski design that integrates a comprehensive model of the skis and the snow on which they will be used.

SUMMARY

The various embodiments described herein generally relate to systems and methods for generating a design of a gliding board.

In accordance with some embodiments, there is provided a computer-implemented method for generating a design for a gliding board. The method involves operating a processor to: define a desired carved turn of the gliding board, the desired carved turn being defined at least by a nominal edging angle and an athlete load profile, wherein the athlete load profile represents a load that is applied by an athlete to the gliding board during the desired carved turn; define a desired global curvature profile, wherein the desired global curvature profile corresponds to a desired snow trace profile for the desired carved turn; generate a desired deformed shape of the gliding board during the desired carved turn, the desired deformed shape of the gliding board being defined at least by a desired total curvature profile, wherein the desired total curvature profile is initially set to correspond to the desired global curvature profile; generate a sidecut profile of the gliding board; generate a width profile of the gliding board based at least on the sidecut profile; generate a camber profile of the gliding board; generate at least one stiffness design variable profile, wherein the at least one stiffness design variable profile, in conjunction with at least the width profile and at least one gliding board material property, dictates at least a resulting flexural stiffness profile and at least one resulting auxiliary stiffness profile of the gliding board; generate a total load profile based at least on the athlete load profile, wherein the total load profile represents a total load that is applied to the gliding board during the desired carved turn, and wherein generating the total load profile involves generating a desired snow penetration depth profile; modify at least the width profile, the sidecut profile and at least one of the at least one stiffness design variable profile at least once; and define the design for the gliding board based at least on the width profile, the camber profile, and the at least one stiffness design variable profile. The processor can modify at least the width profile, the sidecut profile and at least one of the at least one stiffness design variable profile at least once by: calculating a desired flexural stiffness profile of the gliding board based at least on the total load profile, such that the gliding board approximately achieves the desired total curvature profile during the carved turn; modifying at least one of the at least one stiffness design variable profile such that the resulting flexural stiffness profile is approximately equal to the desired flexural stiffness profile; calculating at least one auxiliary deformation profile of the gliding board during the carved turn based at least on the total load profile; modifying the desired total curvature profile based at least on the at least one auxiliary deformation profile in order to achieve a resulting global curvature profile that is approximately equal to the desired global curvature profile during the carved turn; modifying the sidecut profile based at least on the at least one auxiliary deformation profile in order to achieve a resulting snow penetration depth profile that is approximately equal to the desired snow penetration depth profile; and modifying the width profile based at least on the modified sidecut profile.

In some embodiments, modifying at least the width profile, the sidecut profile and at least one of the at least one stiffness design variable profile at least once involves: iteratively repeating the steps of calculating the desired flexural stiffness profile, modifying at least one of the at least one stiffness design variable profile, calculating the at least one auxiliary deformation profile, modifying the desired total curvature profile, modifying the sidecut profile, and modifying the width profile until a difference between at least one of the width profile, the sidecut profile, and at least one of the at least one stiffness design variable profile associated with a current iteration and at least one of the width profile, the sidecut profile, and at least one of the at least one stiffness design variable profile associated with the previous iteration is less than a predetermined threshold.

In some embodiments, defining the desired global curvature profile involves: defining the desired global curvature profile to correspond to a carved turn that exhibits an approximately constant turning radius.

In some embodiments, each of the desired global curvature profile and the resulting global curvature profile embodies a curvilinear form that can be determined by projecting a curvilinear geometry of a corresponding snow trace profile onto an oblique projection plane that is inclined with respect to the plane on which the respective snow trace profile exists.

In some embodiments, generating the sidecut profile involves: defining a desired geometry of a snow penetration depth profile, wherein the snow penetration depth profile represents the penetration depth of the gliding board into snow during the desired carved turn; and generating the sidecut profile based at least on the desired global curvature profile, the desired geometry of the snow penetration depth profile, and the nominal edging angle.

In some embodiments, defining the desired geometry of the snow penetration depth profile involves: defining the desired geometry of the snow penetration depth profile to approximately follow a linear function over a length of an effective base region of the gliding board.

In some embodiments, generating the camber profile involves: determining a first total curvature profile of the gliding board and a first load profile of the gliding board corresponding to a first gliding board edging angle; determining a second total curvature profile of the gliding board and a second load profile of the gliding board corresponding to a second gliding board edging angle; and generating the camber profile such that it facilitates a gliding board design that is capable of satisfying the first total curvature profile with the first load profile, and is also capable of satisfying the second total curvature profile with the second load profile.

In some embodiments, at least one of the at least one stiffness design variable profile includes a core thickness profile of the gliding board.

In some embodiments, calculating the desired flexural stiffness profile involves: calculating the desired flexural stiffness profile of the gliding board based at least on the camber profile, the desired total curvature profile, and the total load profile.

In some embodiments, modifying at least one of the at least one stiffness design variable profile involves: finding the at least one stiffness design variable profile such that the resulting flexural stiffness profile is approximately equal to the desired flexural stiffness profile, wherein the at least one stiffness design variable profile includes a plurality of local stiffness design variable values, wherein each local stiffness design variable value is limited to a predetermined range of allowable values.

In some embodiments, modifying at least the width profile, the sidecut profile and at least one of the at least one stiffness design variable profile at least once further involves modifying the camber profile at least once by: determining a resulting flexural stiffness profile of the gliding board based at least on the at least one stiffness design variable profile, the width profile, and at least one gliding board material property; determining a resulting flexural curvature profile based at least on the resulting flexural stiffness profile and the total load profile; and modifying the camber profile based at least on the resulting flexural curvature profile and the desired total curvature profile.

In some embodiments, at least one of the at least one auxiliary deformation profile is a torsional deformation profile and at least one of the at least one resulting auxiliary stiffness profile is a resulting torsional stiffness profile. In some embodiments, calculating the at least one auxiliary deformation profile involves: determining the resulting torsional stiffness profile of the gliding board based at least on the at least one stiffness design variable profile, the width profile, and at least one gliding board material property; and generating the torsional deformation profile based at least on the resulting torsional stiffness profile and the total load profile.

In some embodiments, the total load profile includes a snow load profile, wherein generating the total load profile involves calculating the snow load profile by: determining a desired snow penetration depth profile such that a total magnitude of the resulting snow load profile is approximately equal to the total magnitude of a relevant component of the athlete load profile, and such that a position of a centroid of the resulting snow load profile is approximately equal to a position of a centroid of the relevant component of the athlete load profile.

In some embodiments, the total load profile includes the athlete load profile.

In some embodiments, the total load profile includes at least one binding load profile.

In some embodiments, modifying the desired total curvature profile involves: determining a resulting deformed shape of the gliding board during the carved turn based at least on the desired total curvature profile and the at least one auxiliary deformation profile; determining a position and an orientation for the resulting deformed shape of the gliding board, wherein the position and orientation correspond to the desired snow penetration depth profile; determining a resulting snow trace profile based at least on the resulting deformed shape of the gliding board and the determined position and orientation; determining a resulting global curvature profile based at least on the resulting snow trace profile; comparing the resulting global curvature profile to the desired global curvature profile; and modifying the desired total curvature profile based at least on the comparison between the resulting global curvature profile and the desired global curvature profile.

In some embodiments, determining the position and the orientation for the resulting deformed shape of the gliding board involves: determining at least one anchor point along a length of the gliding board; and determining the position and the orientation for the resulting deformed shape of the gliding board such that, at each of the at least one anchor point, a resulting snow penetration depth is approximately equal to a corresponding desired snow penetration depth value from the desired snow penetration depth profile.

In some embodiments, modifying the sidecut profile involves: determining a resulting deformed shape of the gliding board during the carved turn based at least on the desired total curvature profile and the at least one auxiliary deformation profile; determining a position and an orientation for the resulting deformed shape of the gliding board, wherein the position and orientation correspond to the desired snow penetration depth profile; and modifying the sidecut profile such that a resulting snow penetration depth profile is approximately equal to the desired snow penetration depth profile.

In some embodiments, determining the position and the orientation for the resulting deformed shape of the gliding board involves: determining at least one anchor point along a length of the gliding board; and determining the position and the orientation for the resulting deformed shape of the gliding board such that, at each of the at least one anchor point, a resulting snow penetration depth is approximately equal to a corresponding desired snow penetration depth value from the desired snow penetration depth profile.

In some embodiments modifying at least the width profile, the sidecut profile and at least one of the at least one stiffness design variable profile at least once further involves: modifying the total load profile based at least on the athlete load profile.

In accordance with some embodiments, there is provided a system for generating a design for a gliding board. The system includes a memory and a processor. The memory can store a width profile, a camber profile, and at least one stiffness design variable profile. The processor is operable to: define a desired carved turn of the gliding board, the desired carved turn being defined at least by a nominal edging angle and an athlete load profile, wherein the athlete load profile represents a load that is applied by an athlete to the gliding board during the desired carved turn; define a desired global curvature profile, wherein the desired global curvature profile corresponds to a desired snow trace profile for the desired carved turn; generate a desired deformed shape of the gliding board during the desired carved turn, the desired deformed shape of the gliding board being defined at least by a desired total curvature profile, wherein the desired total curvature profile is initially set to correspond to the desired global curvature profile; generate a sidecut profile of the gliding board; generate a width profile of the gliding board based at least on the sidecut profile; generate a camber profile of the gliding board; generate at least one stiffness design variable profile, wherein the at least one stiffness design variable profile, in conjunction with at least the width profile and at least one gliding board material property, dictates at least a resulting flexural stiffness profile and at least one resulting auxiliary stiffness profile of the gliding board; generate a total load profile based at least on the athlete load profile, wherein the total load profile represents a total load that is applied to the gliding board during the desired carved turn, and wherein generating the total load profile involves generating a desired snow penetration depth profile; modify at least the width profile, the sidecut profile and at least one of the at least one stiffness design variable profile at least once; and define the design for the gliding board based at least on the width profile, the camber profile, and the at least one stiffness design variable profile. The processor can modify at least the width profile, the sidecut profile and at least one of the at least one stiffness design variable profile at least once by: calculating a desired flexural stiffness profile of the gliding board based at least on the total load profile, such that the gliding board approximately achieves the desired total curvature profile during the carved turn; modifying at least one of the at least one stiffness design variable profile such that the resulting flexural stiffness profile is approximately equal to the desired flexural stiffness profile; calculating at least one auxiliary deformation profile of the gliding board during the carved turn based at least on the total load profile; modifying the desired total curvature profile based at least on the at least one auxiliary deformation profile in order to achieve a resulting global curvature profile that is approximately equal to the desired global curvature profile during the carved turn; modifying the sidecut profile based at least on the at least one auxiliary deformation profile in order to achieve a resulting snow penetration depth profile that is approximately equal to the desired snow penetration depth profile; and modifying the width profile based at least on the modified sidecut profile.

In some embodiments, modifying at least the width profile, the sidecut profile and at least one of the at least one stiffness design variable profile at least once involves: iteratively repeating the steps of calculating the desired flexural stiffness profile, modifying at least one of the at least one stiffness design variable profile, calculating the at least one auxiliary deformation profile, modifying the desired total curvature profile, modifying the sidecut profile, and modifying the width profile until a difference between at least one of the width profile, the sidecut profile, and at least one of the at least one stiffness design variable profile associated with a current iteration and at least one of the width profile, the sidecut profile, and at least one of the at least one stiffness design variable profile associated with the previous iteration is less than a predetermined threshold.

In some embodiments, defining the desired global curvature profile involves: defining the desired global curvature profile to correspond to a carved turn that exhibits an approximately constant turning radius.

In some embodiments, each of the desired global curvature profile and the resulting global curvature profile embodies a curvilinear form that can be determined by projecting a curvilinear geometry of a corresponding snow trace profile onto an oblique projection plane that is inclined with respect to the plane on which the respective snow trace profile exists.

In some embodiments, generating the sidecut profile involves: defining a desired geometry of a snow penetration depth profile, wherein the snow penetration depth profile represents the penetration depth of the gliding board into snow during the desired carved turn; and generating the sidecut profile based at least on the desired global curvature profile, the desired geometry of the snow penetration depth profile, and the nominal edging angle.

In some embodiments, defining the desired geometry of the snow penetration depth profile involves: defining the desired geometry of the snow penetration depth profile to approximately follow a linear function over a length of an effective base region of the gliding board.

In some embodiments, generating the camber profile involves: determining a first total curvature profile of the gliding board and a first load profile of the gliding board corresponding to a first gliding board edging angle; determining a second total curvature profile of the gliding board and a second load profile of the gliding board corresponding to a second gliding board edging angle; and generating the camber profile such that it facilitates a gliding board design that is capable of satisfying the first total curvature profile with the first load profile, and is also capable of satisfying the second total curvature profile with the second load profile.

In some embodiments, at least one of the at least one stiffness design variable profile includes a core thickness profile of the gliding board.

In some embodiments, calculating the desired flexural stiffness profile involves: calculating the desired flexural stiffness profile of the gliding board based at least on the camber profile, the desired total curvature profile, and the total load profile.

In some embodiments, modifying at least one of the at least one stiffness design variable profile involves: finding the at least one stiffness design variable profile such that the resulting flexural stiffness profile is approximately equal to the desired flexural stiffness profile, wherein the at least one stiffness design variable profile includes a plurality of local stiffness design variable values, wherein each local stiffness design variable value is limited to a predetermined range of allowable values.

In some embodiments, modifying at least the width profile, the sidecut profile and at least one of the at least one stiffness design variable profile at least once further involves modifying the camber profile at least once by: determining a resulting flexural stiffness profile of the gliding board based at least on the at least one stiffness design variable profile, the width profile, and at least one gliding board material property; determining a resulting flexural curvature profile based at least on the resulting flexural stiffness profile and the total load profile; and modifying the camber profile based at least on the resulting flexural curvature profile and the desired total curvature profile.

In some embodiments, at least one of the at least one auxiliary deformation profile is a torsional deformation profile and at least one of the at least one resulting auxiliary stiffness profile is a resulting torsional stiffness profile. In some embodiments, calculating the at least one auxiliary deformation profile involves: determining the resulting torsional stiffness profile of the gliding board based at least on the at least one stiffness design variable profile, the width profile, and at least one gliding board material property; and generating the torsional deformation profile based at least on the resulting torsional stiffness profile and the total load profile.

In some embodiments, the total load profile includes a snow load profile, wherein generating the total load profile involves calculating the snow load profile by: determining a desired snow penetration depth profile such that a total magnitude of the resulting snow load profile is approximately equal to the total magnitude of a relevant component of the athlete load profile, and such that a position of a centroid of the resulting snow load profile is approximately equal to a position of a centroid of the relevant component of the athlete load profile.

In some embodiments, the total load profile includes the athlete load profile.

In some embodiments, the total load profile includes at least one binding load profile.

In some embodiments, modifying the desired total curvature profile involves: determining a resulting deformed shape of the gliding board during the carved turn based at least on the desired total curvature profile and the at least one auxiliary deformation profile; determining a position and an orientation for the resulting deformed shape of the gliding board, wherein the position and orientation correspond to the desired snow penetration depth profile; determining a resulting snow trace profile based at least on the resulting deformed shape of the gliding board and the determined position and orientation; determining a resulting global curvature profile based at least on the resulting snow trace profile; comparing the resulting global curvature profile to the desired global curvature profile; and modifying the desired total curvature profile based at least on the comparison between the resulting global curvature profile and the desired global curvature profile.

In some embodiments, determining the position and the orientation for the resulting deformed shape of the gliding board involves: determining at least one anchor point along a length of the gliding board; and determining the position and the orientation for the resulting deformed shape of the gliding board such that, at each of the at least one anchor point, a resulting snow penetration depth is approximately equal to a corresponding desired snow penetration depth value from the desired snow penetration depth profile.

In some embodiments, modifying the sidecut profile involves: determining a resulting deformed shape of the gliding board during the carved turn based at least on the desired total curvature profile and the at least one auxiliary deformation profile; determining a position and an orientation for the resulting deformed shape of the gliding board, wherein the position and orientation correspond to the desired snow penetration depth profile; and modifying the sidecut profile such that a resulting snow penetration depth profile is approximately equal to the desired snow penetration depth profile.

In some embodiments, determining the position and the orientation for the resulting deformed shape of the gliding board involves: determining at least one anchor point along a length of the gliding board; and determining the position and the orientation for the resulting deformed shape of the gliding board such that, at each of the at least one anchor point, a resulting snow penetration depth is approximately equal to a corresponding desired snow penetration depth value from the desired snow penetration depth profile.

In some embodiments modifying at least the width profile, the sidecut profile and at least one of the at least one stiffness design variable profile at least once further involves: modifying the total load profile based at least on the athlete load profile.

In accordance with some embodiments, there is provided a gliding board having a design generated by computer-implemented method. The method can involve operating a processor to: define a desired carved turn of the gliding board, the desired carved turn being defined at least by a nominal edging angle and an athlete load profile, wherein the athlete load profile represents a load that is applied by an athlete to the gliding board during the desired carved turn; define a desired global curvature profile, wherein the desired global curvature profile corresponds to a desired snow trace profile for the desired carved turn; generate a desired deformed shape of the gliding board during the desired carved turn, the desired deformed shape of the gliding board being defined at least by a desired total curvature profile, wherein the desired total curvature profile is initially set to correspond to the desired global curvature profile; generate a sidecut profile of the gliding board; generate a width profile of the gliding board based at least on the sidecut profile; generate a camber profile of the gliding board; generate at least one stiffness design variable profile, wherein the at least one stiffness design variable profile, in conjunction with at least the width profile and at least one gliding board material property, dictates at least a resulting flexural stiffness profile and at least one resulting auxiliary stiffness profile of the gliding board; generate a total load profile based at least on the athlete load profile, wherein the total load profile represents a total load that is applied to the gliding board during the desired carved turn, and wherein generating the total load profile involves generating a desired snow penetration depth profile; modify at least the width profile, the sidecut profile and at least one of the at least one stiffness design variable profile at least once; and define the design for the gliding board based at least on the width profile, the camber profile, and the at least one stiffness design variable profile. The processor can modify at least the width profile, the sidecut profile and at least one of the at least one stiffness design variable profile at least once by: calculating a desired flexural stiffness profile of the gliding board based at least on the total load profile, such that the gliding board approximately achieves the desired total curvature profile during the carved turn; modifying at least one of the at least one stiffness design variable profile such that the resulting flexural stiffness profile is approximately equal to the desired flexural stiffness profile; calculating at least one auxiliary deformation profile of the gliding board during the carved turn based at least on the total load profile; modifying the desired total curvature profile based at least on the at least one auxiliary deformation profile in order to achieve a resulting global curvature profile that is approximately equal to the desired global curvature profile during the carved turn; modifying the sidecut profile based at least on the at least one auxiliary deformation profile in order to achieve a resulting snow penetration depth profile that is approximately equal to the desired snow penetration depth profile; and modifying the width profile based at least on the modified sidecut profile.

BRIEF DESCRIPTION OF THE DRAWINGS

Several embodiments will now be described in detail with reference to the drawings, in which.

Figure 1:
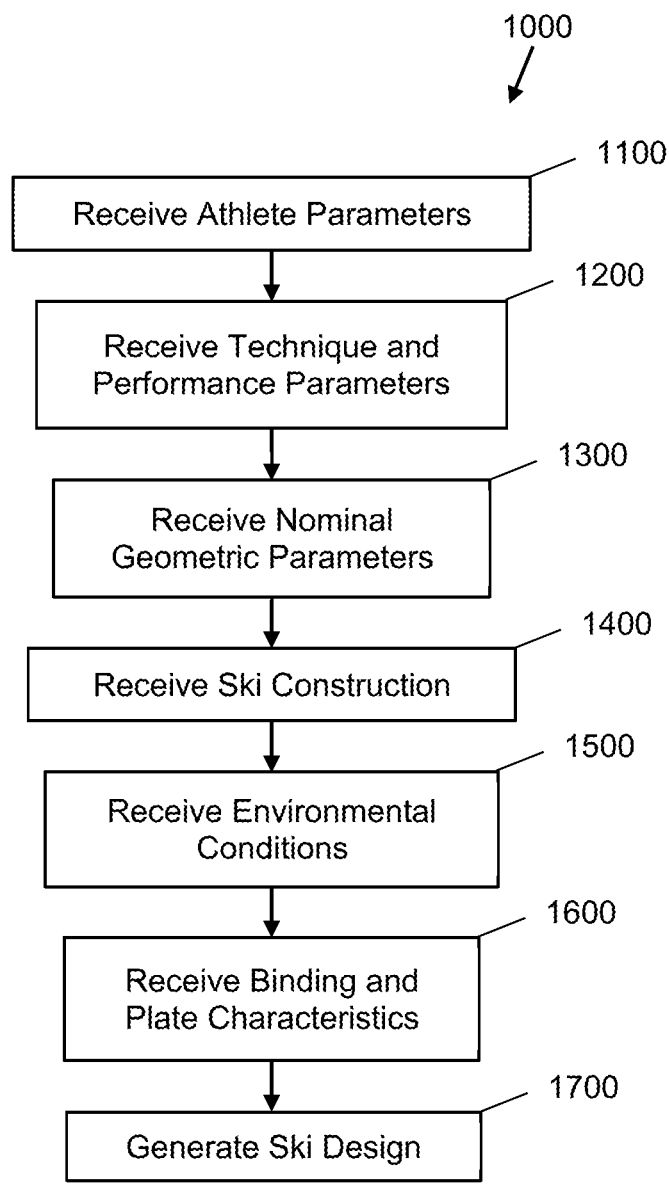
FIG. 1 shows a flowchart of a method for operating a ski design system, in accordance with an example embodiment.

The drawings, described below, are provided for purposes of illustration, and not of limitation, of the aspects and features of various examples of embodiments described herein. For simplicity and clarity of illustration, elements shown in the drawings have not necessarily been drawn to scale. The dimensions of some of the elements may be exaggerated relative to other elements for clarity. It will be appreciated that for simplicity and clarity of illustration, where considered appropriate, reference numerals may be repeated among the drawings to indicate corresponding or analogous elements or steps.

DESCRIPTION OF EXAMPLE EMBODIMENTS

The various embodiments described herein generally relate to systems and methods for generating a design for a ski. The ski design system disclosed herein utilizes a novel inverse-analysis methodology in order to rapidly generate an optimized design for a ski. In essence, the user provides the system with information pertaining to the desired ski-snow interaction under certain user-stipulated conditions, and the system generates a ski design that would achieve this desired ski-snow interaction under the stated conditions. The ski design system disclosed herein can generate ski designs which are customized or optimized for a particular athlete and/or for particular conditions. The ski design system can generate ski designs which can achieve a particular snow trace geometry and a particular snow pressure distribution.

Various embodiments also provide a gliding board having a design generated by the systems and methods described herein. It should be understood that the gliding board may have minor variations in design from the generated design. For example, the gliding board may have some differences in order to account for manufacturing constraints. The gliding board may be built having reference to the generated design and may substantially have the generated design.

In order to prescribe a flexural stiffness profile that varies over the length of the ski, as well as a torsional stiffness profile that varies over the length of the ski, it may be necessary to define at least one "stiffness design variable"; at any position along the length of the ski, the flexural stiffness and torsional stiffness of the ski can then be dictated by the relationship between the local value of this stiffness design variable, the local width of the ski, the construction architecture of the ski, and the mechanical properties of the materials that are present within the ski construction. The "stiffness design variable profile" defines the value of the relevant stiffness design variable at any position along the length of the ski.

For example, skis that employ sandwich-type construction (which is described below) commonly employ core thickness as the primary stiffness design variable. In other words, the thickness of the core of the ski varies over the length of the ski in order to achieve a desired flexural stiffness value and torsional stiffness value at each position along the length of the ski. In such embodiments, at least one of the at least one stiffness design variable profile is represented by a core thickness profile.

Most of the example embodiments discussed herein employ core thickness as the only stiffness design variable; however, it should be understood that a broad range of alternative stiffness design variables could be employed by alternative embodiments. For example, alternative embodiments could employ a ski construction that is of substantially constant thickness over its entire length, but features longitudinally oriented stiffening ribs on its upper surface; in this case, the stiffness design variable could take the form of one or more characteristic of these stiffening ribs (such as the height and/or width of each rib), such that the targeted flexural and/or torsional stiffness at any position along the length of the ski can be achieved by adjusting said variable characteristic(s) of the stiffening ribs. It should also be understood that a ski could be designed such that it exhibits two or more zones over its length, wherein two or more of these zones differ in their construction architecture and/or their dominant stiffness design variable.

In order to design a ski that is capable of simultaneously achieving an ideal snow trace geometry and an ideal snow pressure distribution, it is desirable to optimize the design of the ski such that a harmonious relationship exists between its sidecut profile, its camber profile, its flexural stiffness profile, and its torsional stiffness profile. The aforementioned optimization is further complicated by the fact that the flexural stiffness and torsional stiffness profiles of the ski can be coupled to each other in a manner that is dependent upon the relationship between the at least one stiffness design variable profile, the width profile, the construction architecture of the ski, and the mechanical properties of the materials that are present within the ski construction. Furthermore, practical limitations may prohibit the use of an ideal flexural stiffness profile—for example, it is not practicable to build a ski that exhibits a thickness profile that tapers to zero. The example embodiments described herein provide a ski design system for the design of alpine skis in a manner that accurately captures the many structural, physical, and geometric phenomenon that govern alpine ski carving mechanics.

The ski design system disclosed herein can use iterative or recursive methods to simultaneously consider the relationship between the width profile, the camber profile, and the at least one stiffness design variable profile of the ski, while at the same time avoiding divergence. As will be described below, the ski design system can consider the practical limitations of ski construction and compensate the ski design accordingly. The ski design system can generate a design for a ski that maximizes performance for a particular athlete, under particular conditions, by minimizing drag while maximizing grip during carved turns.

The term "optimization" is used herein to describe a process or methodology of improving an aspect of a ski design to a desired extent, while accounting for relevant conditions and constraints. The present inventor recognizes that recent literature frequently uses the term "optimization" in reference to mathematical optimization, wherein mathematical procedures (numerical and/or analytical) are employed to find the global or local maxima or minima of a mathematical function. Conversely, the present descriptions herein employ the more general meaning of "optimization" as any process or methodology (mathematical or otherwise) of achieving a notably improved result. This distinction is important, as some embodiments can achieve a reasonably optimized ski design without employing the types of mathematical optimization techniques that are commonly cited in general literature that makes use of the term "optimization".

The term "gliding board" is used herein in reference to an apparatus that is intended to slide along low-friction surfaces (such as snow or ice-covered terrain). A gliding board may feature one or more boot retention systems (bindings) to which an athlete can fasten a boot (shoe) or boots (shoes), thus facilitating a connection between the gliding board and one or both of the athlete's feet. Some gliding boards may utilize an intermediary system or structure between the athlete and the gliding board; for example, so called "ski-bikes" and "ski-scooters" feature structural frames that are mounted to the upper surface of the gliding board(s), and the athlete interacts primarily with said structural frames. Typical examples of gliding boards include (but are not limited to): alpine (downhill) skis, snowboards, skiboards, monoskis, toboggans, sit-skis, ski-bikes, ski-scooters, Nordic skis (including, but not limited to, cross-country skis, telemark skis, and roller skis), and other similar equipment. Some gliding board activities (such as alpine skiing) require the use of more than one gliding board; as such, the term "gliding board" may refer to a single stand-alone gliding board (such as a snowboard), but it also may refer to one of a pair of gliding boards (such as a pair of alpine skis), or one of a larger number of corresponding gliding boards that are intended to be used together. While the following description is presented in the context of alpine (downhill) skis, some embodiments may include generating a design for other types of gliding boards. In particular, some embodiments may facilitate the design of athlete-customized snowboards. Accordingly, it should be appreciated that the term "ski" is used herein for ease of exposition, and may, in some embodiments, be substituted by the term "gliding board".

The present document describes a variety of quantitative variables (physical, mechanical, and geometric) that vary along the length of the ski; the term "profile" is used herein in reference to the collection of data that describes how the value of each such quantitative variable can be found at any position along the length of the ski. Stated another way, the term "profile" is used herein to denote the topography of a certain quantitative variable (physical, mechanical, or geometric) along the length of the ski. For example, the "width profile" of the ski defines the width of the ski at any position along its length. Similarly, the "flexural curvature profile" of the ski defines the flexural curvature exhibited by the ski at any position along its length.

The present descriptions herein use the term "elevation" in reference to any projection plane (viewing plane) that is parallel to the longitudinal axis of the ski and perpendicular to the base surface of the ski. As such, any geometry that is described in the context of being viewed in elevation shall be assumed to have been projected onto a plane that is parallel to the longitudinal axis of the ski and perpendicular to the base surface of the ski. In such an elevation projection plane, the "upward" direction denotes the direction that is approximately perpendicular to the base surface of the ski, and points away from the snow. The term "elevation profile" is used herein in reference to some two-dimensional geometric contours that exist on a plane that is parallel to the longitudinal axis of the ski and perpendicular to the base surface of the ski.

The present descriptions herein make reference to numerous angles, and some of said angles are referenced in equations. It should be understood that all of said angles referenced in equations are intended to be expressed in units of radians. All equations, formulae, and mathematical expressions incorporated herein were formulated under the assumption that said angles are expressed in units of radians.

Figure 3A:
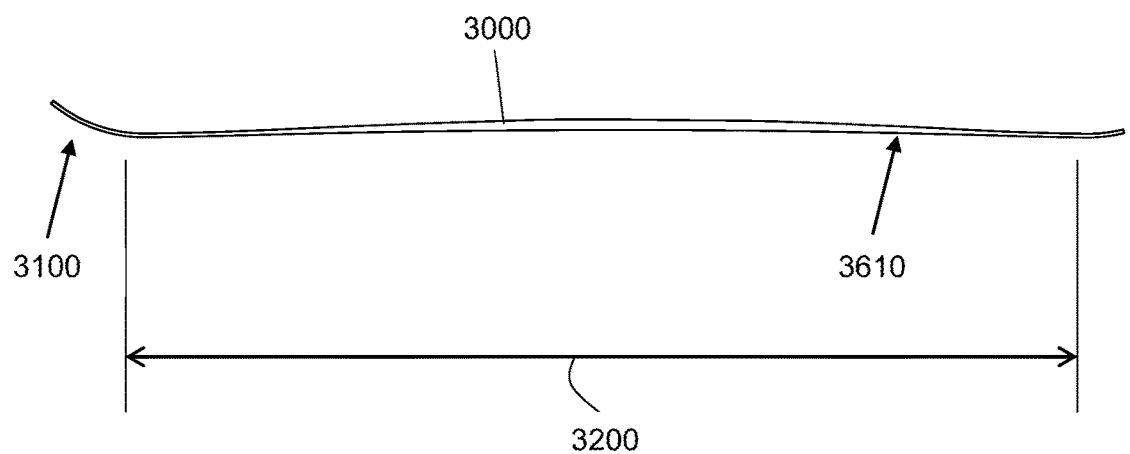
FIG. 3A shows an elevation view of an example ski, in accordance with an example embodiment.
Figure 3B:
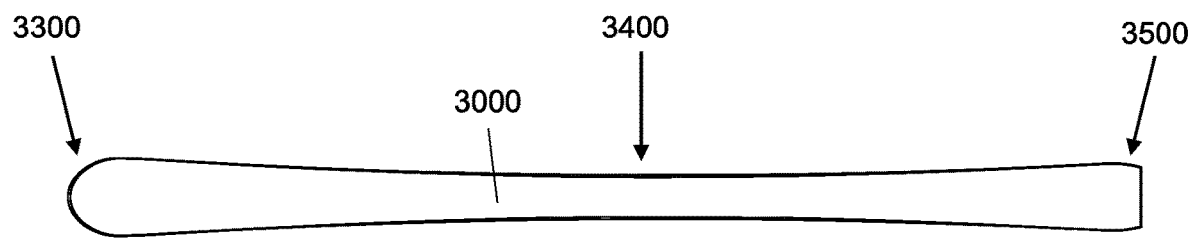
FIG. 3B shows a planform view of the ski shown in FIG. 3A, in accordance with an example embodiment.

Referring now to FIGS. 3A and 3B, shown therein is an elevation view and a planform view, respectively, of an example alpine ski 3000. As depicted in FIGS. 3A and 3B, alpine skis can generally be characterized as long, narrow, and thin leaf spring elements having a tip 3300 (forward extremity), a tail 3500 (rearward extremity), and a boot-binding system (not shown) for affixing the athlete's foot to the top surface of the ski 3000 at a position that is typically slightly aft of the mid-point between the tip 3300 and tail 3500 of the ski 3000. The tip 3300 of the ski features a shovel region 3100, which is characterized as having an upward curve (concave upward geometry) when viewed in elevation. Similarly, the tail 3500 of the ski often also features an upward curve (concave upward geometry) when viewed in elevation; however, the upward curve of the tail 3500 is often less pronounced than that present at the shovel 3100. The base 3610 is the bottom surface of the ski, which makes direct contact with the snow (see FIG. 10 for additional detail).

The main running length of the ski that interacts most intimately with the snow is the region that lies between the aforementioned upward curves at the shovel 3100 and tail 3500 of the ski. In the case of alpine skis that are intended for racing and/or on-piste carving, this main running length region often exhibits a cambered geometry, wherein the base 3610 of the ski exhibits a concave downward (convex upward) geometry when viewed in elevation. In some cases, some regions of the main running length of the ski may exhibit rocker (reverse-camber), wherein the base 3610 of the ski exhibits a concave upward (convex downward) geometry when viewed in elevation. Most alpine skis that are intended for racing and/or on-piste carving exhibit predominantly cambered geometries within their main running lengths; however, it is becoming increasingly common for such skis to feature small regions of rockered geometry.

The "camber elevation profile" denotes the overall geometry of the base surface of the unloaded ski, when viewed in elevation, wherein said elevation profile exists on a plane that is parallel to the longitudinal axis of the ski and perpendicular to the base surface of the ski. The "camber curvature profile" of the ski defines the curvature of the camber elevation profile at any position along the length of the ski, wherein said curvature is measured within a plane that is parallel to the longitudinal axis of the ski and perpendicular to the base surface of the ski. The camber elevation profile may include some combination of cambered regions and rockered regions in order to achieve the desired characteristics of the ski.

The "edging angle" of a ski is defined as the angle between the base of the ski and the surface upon which the ski is gliding (for example: the surface of the snow), measured about an axis that is approximately parallel to the longitudinal axis of the ski.

The "inclination angle" of an athlete is defined as the angle between the surface upon which the ski is gliding (for example: the surface of the snow) and a straight line drawn between the centre-of-mass of the athlete and the centroid of the total snow pressure distribution that acts upon both skis, measured about an axis that is parallel to the instantaneous velocity vector of the athlete (which is approximately parallel to the longitudinal axis of the skis). As such, it can be reasoned that the inclination angle is equal to the angle between the surface upon which the ski is gliding (for example: the surface of the snow) and the total force vector that the athlete is imposing upon the snow, measured about an axis that is parallel to the instantaneous velocity vector of the athlete (which is approximately parallel to the longitudinal axis of the skis).

The "angulation angle" of the athlete is then defined as the difference between the edging angle and the inclination angle.

When a ski is pressed downward onto a flat surface by a force that is applied in the vicinity of the boot-binding system, wherein said force acts approximately perpendicular to the base surface of the ski, the ski will typically become bent in a direction that opposes the downward concavity of its camber elevation profile such that at least one of its edges makes contact with said flat surface over a majority of the ski's length (excluding the shovel and tail regions that exhibit upward curves); when this occurs, the ski is said to be "de-cambered". The degree to which a ski is de-cambered onto a flat surface depends upon the edging angle of the ski on said flat surface. A ski that is de-cambered onto a flat surface with an edging angle of zero will typically adopt a quasi-flat base surface over a majority of the ski's length (excluding the shovel and tail regions that exhibit upward curves), since the ski will deform until its base comes into contact with the flat surface. Conversely, a ski that is de-cambered onto a flat surface with an edging angle that is non-zero will generally adopt a curved base geometry, wherein the base of the ski exhibits a concave upward (convex downward) geometry when viewed in elevation.

Continuing with reference to FIGS. 3A and 3B, the effective base 3200 of the ski 3000 is often defined as the region of the ski's base 3610 that would contact a flat rigid surface if the ski 3000 were to be fully de-cambered onto said surface with an edging angle of zero. As such, the effective base region 3200 typically excludes the shovel 3100 and tail regions 3500 that exhibit upward curves. The length of the effective base region is typically referred to as the "effective base length". In the following descriptions herein, the term "mid-base" denotes the mid-point between the forward-most point within the effective base region of the ski and the rearward-most point within the effective base region of the ski. The term "forebody" is used herein in reference to the region of the ski that is located forward of the mid-base point, and the term "afterbody" is used herein in reference to the region of the ski that is located aft of the mid-base point.

As depicted in FIGS. 3A and 3B, an alpine ski that is intended for racing and on-piste carving generally exhibits a waisted (hour-glass shaped) planform geometry, wherein said ski is relatively narrow near its mid-base and is wider in the vicinity of its tip 3300 and tail 3500. The waist 3400 of the ski 3000 is defined as the narrowest point of the ski within its effective base region 3200, and is typically positioned slightly aft of the mid-base of the ski 3000.

This waisted planform geometry is generally achieved through the creation of curved sidecuts along either side of the ski. The sidecut on each edge of the ski characterizes the extent to which the planform geometry of the corresponding edge of the ski deviates from a straight line. At each position along the length of the ski, the local "sidecut depth" represents the distance between the local position of the edge of the ski and a straight line drawn from the tip of the ski to the tail of the ski, wherein said straight line is parallel to the longitudinal axis of the ski and is tangential to the relevant edge of the ski at the widest point of the ski, and wherein the local sidecut depth is measured perpendicular to said straight line.

The "sidecut profile" of the ski defines the local sidecut depth of the ski at any position along the length of the ski; as such, the sidecut profile represents the planform geometry of one of the edges of the ski. While the sidecut profile of a ski is not necessarily of constant radius geometry, the nominal radius of curvature of the sidecut geometry (denoted herein by "nominal sidecut radius") is often reported as the radius of an arc that can be fitted through three points along one of the edges of the ski 3000, wherein one of said points is positioned at or near the waist 3400, one of said points is positioned slightly aft of the widest point of the ski 3000 that is forward of the waist 3400, and one of said points is positioned slightly forward of the widest point of the ski 3000 that is aft of the waist 3400.

The taper of the ski 3000 is defined as the difference between the width of the widest point of the ski 3000 that is forward of the waist 3400 and the width of the widest point of the ski that is aft of the waist 3400.

The "width profile" of the ski defines the width of the ski at any position along the length of the ski. If the right hand and left hand sidecut profiles of the ski are symmetrical about the longitudinal axis of the ski, then the sidecut profile of the ski can be calculated as a function of the width profile of the ski. For ease of exposition, most of the example embodiments discussed herein will assume that the right hand and left hand sidecut profiles of the ski are symmetrical about the longitudinal axis of the ski; however, this should not be considered restrictive, as some embodiments could also be applied to the design of skis that do not have right hand and left hand sidecut profiles of the ski that are symmetrical about the longitudinal axis of the ski.

A broad variety of boot-binding systems exist for the various types of gliding board sports. Within the context of downhill skiing, there currently exist a few different types of binding systems, including: alpine bindings, alpine touring bindings, and telemark bindings. Although each type of binding is ultimately intended to serve the same general purpose of fastening a boot to the upper surface of a ski, each type of binding does so using a unique mechanical architecture which, in turn, imposes a unique set of loads upon the ski. While some embodiments could be used with any boot-binding architecture, the following descriptions herein will focus on the use of alpine ski bindings that comply with the International Organization for Standardization (ISO) specification ISO 9462, as well as the use of alpine ski boots that comply with ISO specification ISO 5355.

Figure 4:
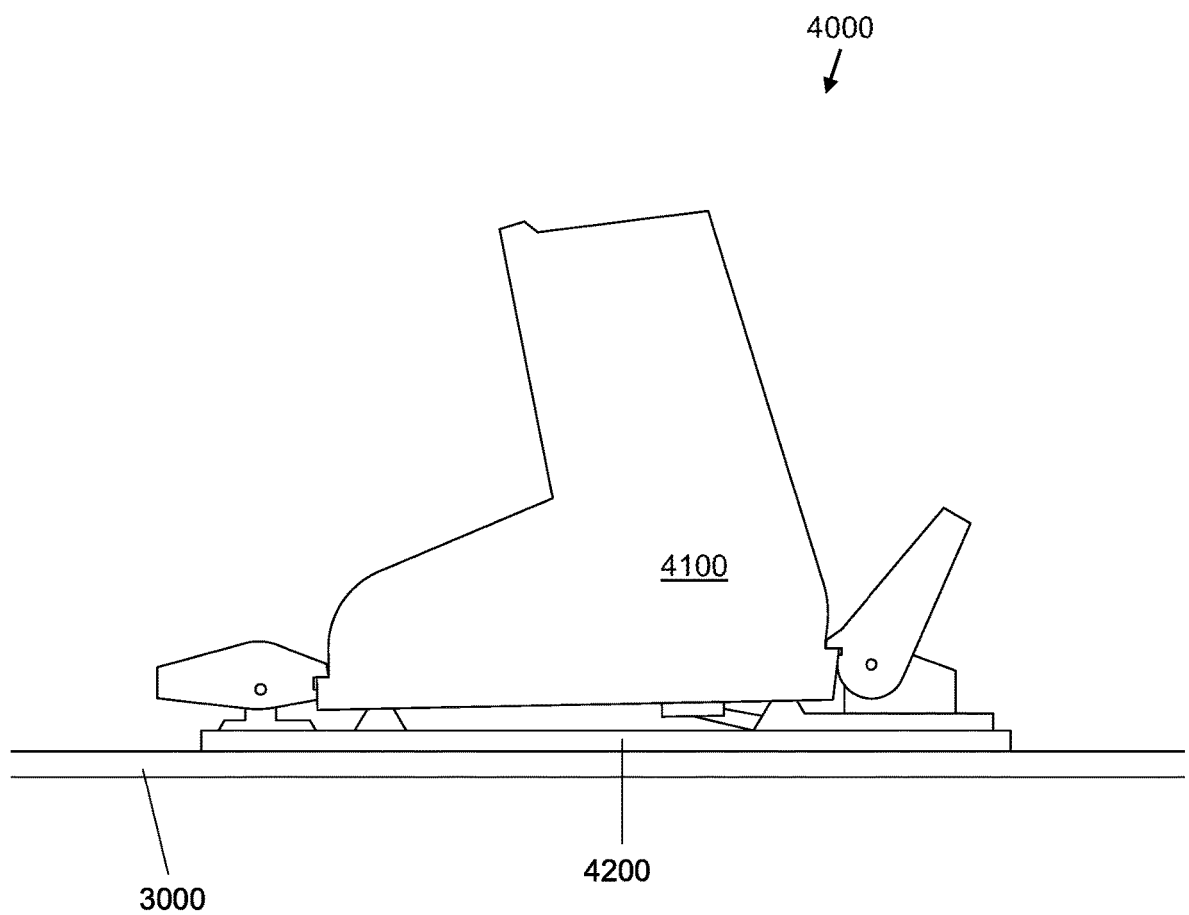
FIG. 4 shows an elevation view of an example boot-binding system for the ski shown in FIG. 3A, in accordance with an example embodiment.

Referring now to FIGS. 4-9, shown therein are elevation views of an example boot-binding system 4000. As depicted in FIGS. 4, 5A, and 5B the boot-binding system 4000 is based upon the use of a boot 4100 that features a protrusion referred to as a toe lug 4120 at the toe of the boot 4100, and another protrusion referred to as a heel lug 4160 at the heel of the boot 4100. The boot 4100 rests upon a pair of AFD (anti-friction device) perches 4230, 4250 positioned near the toe and heel of the boot.

Figure 7A:
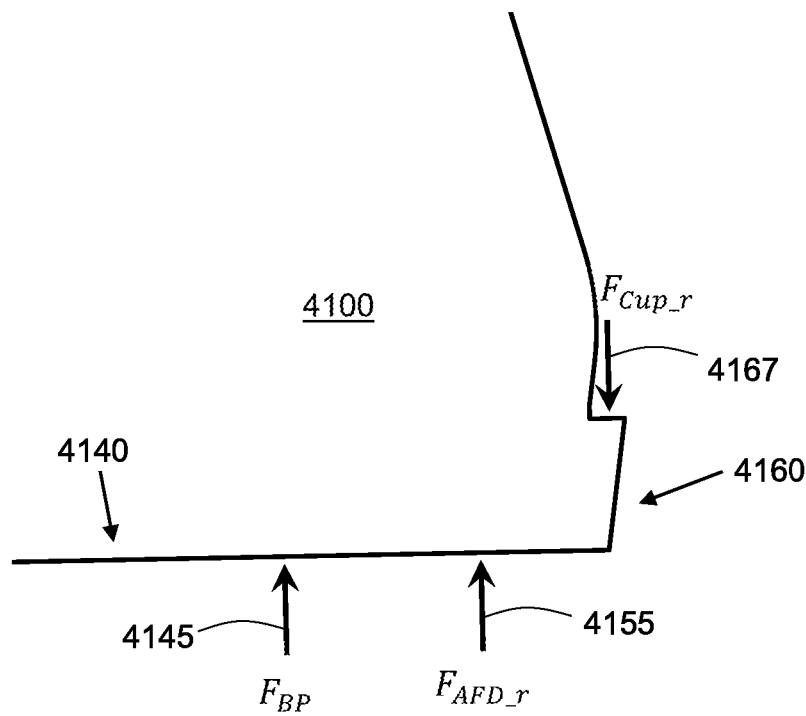
FIG. 7A shows an elevation view of a portion of the boot shown in FIG. 5A, illustrating a heel-cup clamping force, a rear AFD (anti-friction device) perch force, and a brake pedal force, in accordance with an example embodiment.
Figure 7B:
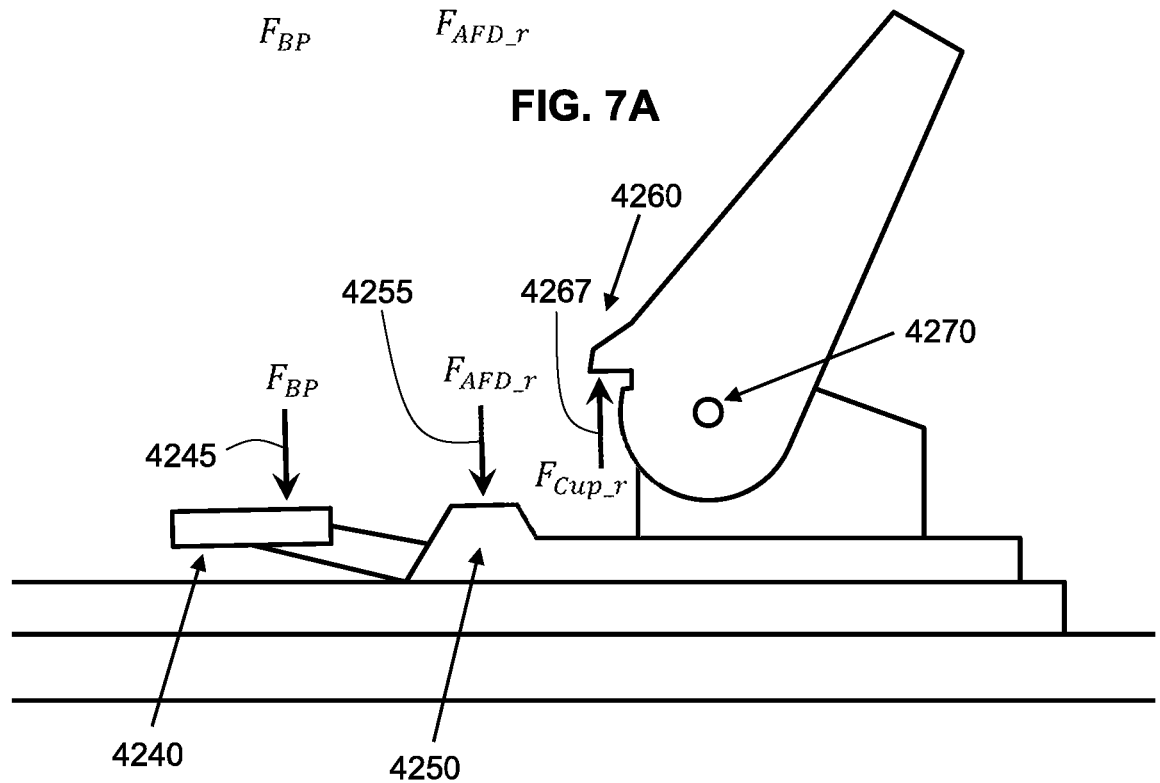
FIG. 7B shows an elevation view of a portion of the binding system shown in FIG. 5B, illustrating a heel-cup clamping force, a rear AFD perch force, and a brake pedal force, in accordance with an example embodiment.
Figure 8A:
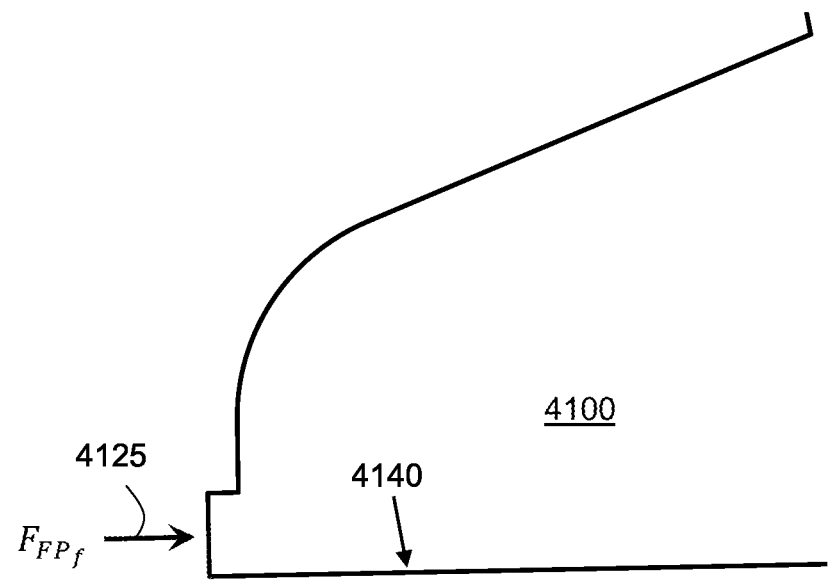
FIG. 8A shows an elevation view of a portion of the boot shown in FIG. 5A, illustrating a front forward pressure force, in accordance with an example embodiment.
Figure 8B:
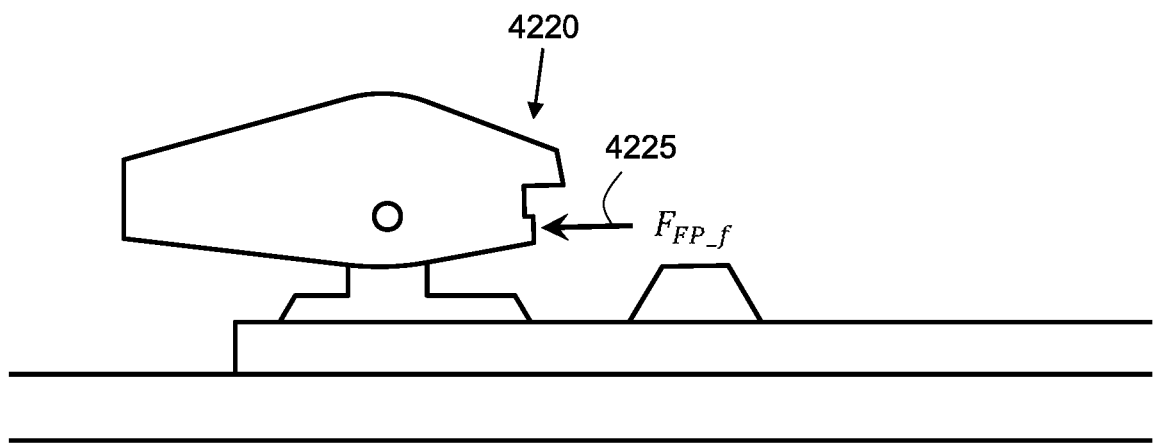
FIG. 8B shows an elevation view of a portion of the binding system shown in FIG. 5B, illustrating a front forward pressure force, in accordance with an example embodiment.

As depicted in FIGS. 7A and 7B, the heel lug 4160 of the boot is held firmly to the ski by a heel-cup 4260, which applies a clamping force 4267 ($F_{Cup\_r}$) to the heel-cup 4260. This clamping force is typically created by a spring-actuated articulation of the heel-cup about a heel-cup pivot axis 4270.

Figure 9A:
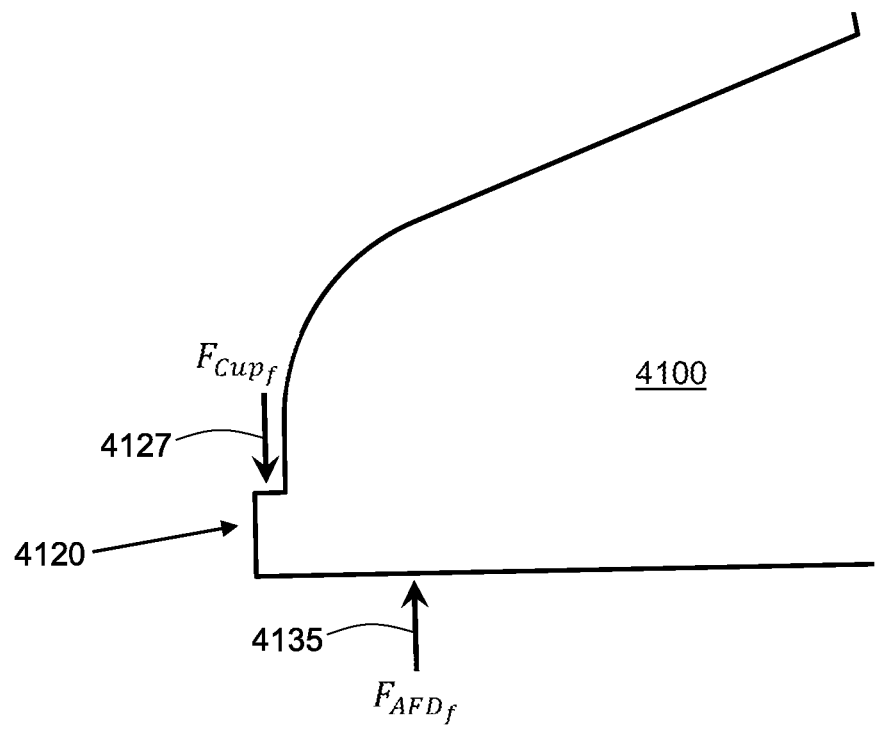
FIG. 9A shows an elevation view of a portion of the boot shown in FIG. 5A, illustrating a toe-cup clamping force and a front AFD perch force, in accordance with an example embodiment.
Figure 9B:
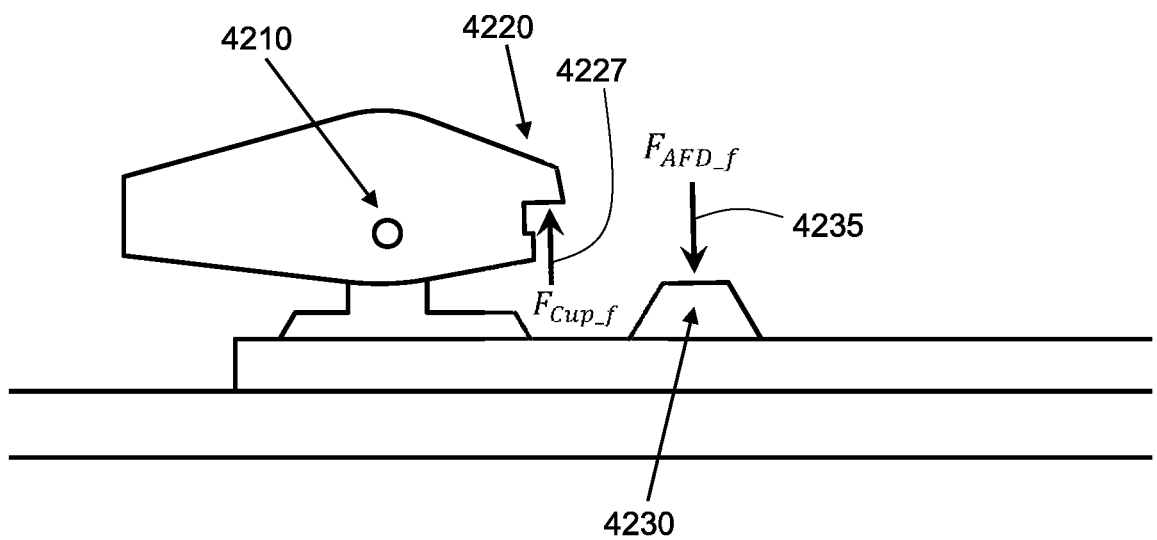
FIG. 9B shows an elevation view of a portion of the binding system shown in FIG. 5B, illustrating a toe-cup clamping force and a front AFD perch force, in accordance with an example embodiment.

As depicted in FIGS. 9A and 9B, the toe lug 4120 of the boot 4100 is held firmly to the ski by a toe-cup 4220, which in many cases applies a clamping force 4227 ($F_{Cup\_f}$) to the toe-cup 4220 (some alpine binding systems do not apply a clamping force at the toe-cup). This clamping force is typically created by a spring-actuated articulation of the toe-cup 4220 about a toe-cup pivot axis 4210; however, some binding systems employ different mechanisms to achieve the toe-cup clamping force.

As depicted in FIGS. 6A, 6B, 8A and 8B, the boot 4100 is compressed longitudinally (parallel to the sole 4140 of the boot) between the toe-cup 4220 and the heel-cup 4260; this longitudinal compression force is referred to as the forward pressure loading. The forward pressure loading is generated by a forward pressure force 4265 that is applied at the heel-cup ($F_{FP\_r}$), and is equilibrated by another forward pressure force 4225 at the toe-cup ($F_{FP\_f}$).

Figure 5A:
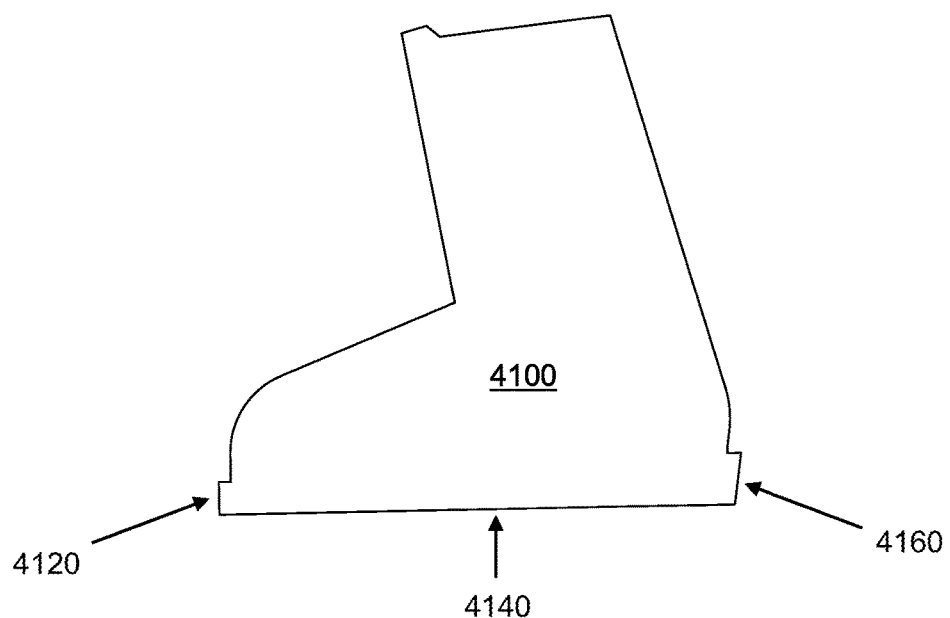
FIG. 5A shows an elevation view of an example boot for the boot-binding system shown in FIG. 4, in accordance with an example embodiment.
Figure 5B:
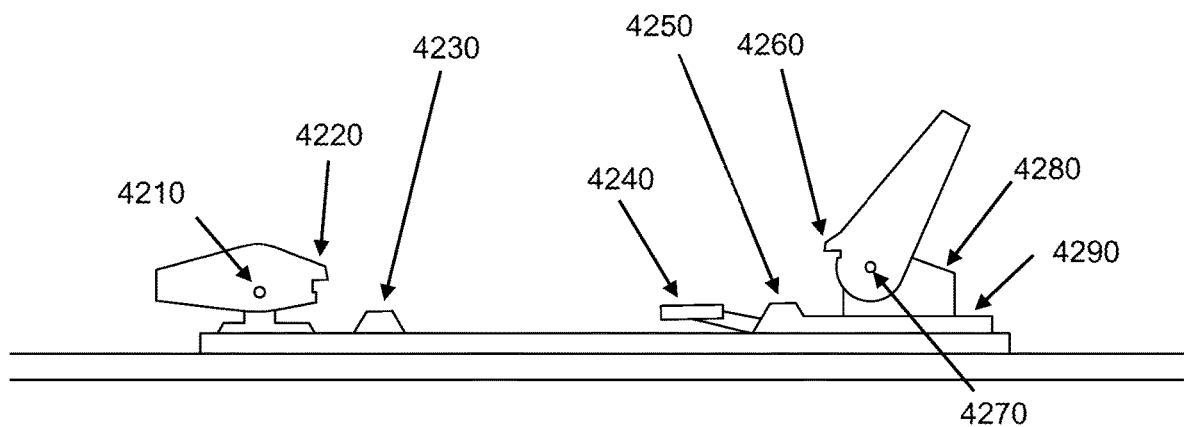
FIG. 5B shows an elevation view of various example components of an example binding for the boot-binding system shown in FIG. 4, in accordance with an example embodiment.
Figure 6A:
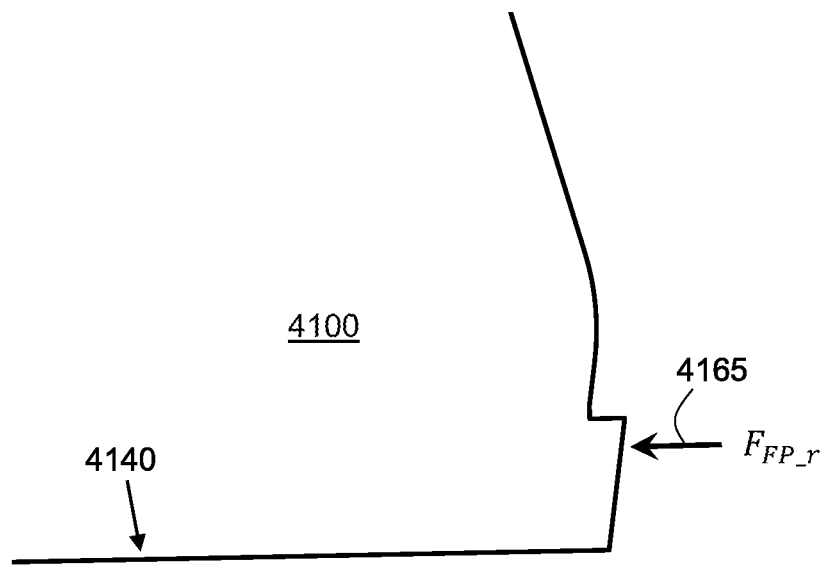
FIG. 6A shows an elevation view of a portion of the boot shown in FIG. 5A, illustrating a rear forward pressure force, in accordance with an example embodiment.
Figure 6B:
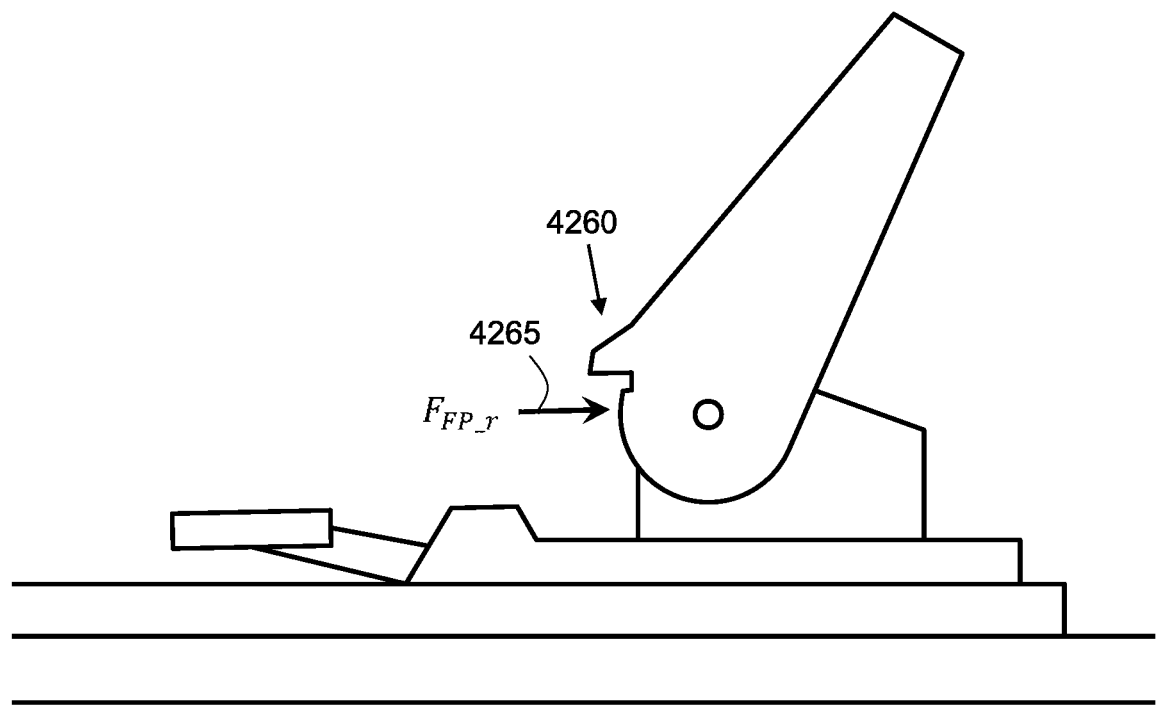
FIG. 6B shows an elevation view of a portion of the binding system shown in FIG. 5B, illustrating a rear forward pressure force, in accordance with an example embodiment.

As depicted in FIGS. 5A and 5B, the heel-cup 4260 of the binding is connected to a heel carriage 4280 that slides within a heel track 4290, wherein said heel track is substantially parallel to the longitudinal axis of the ski 3000. The heel carriage 4280 is acted on by an adjustable forward pressure spring, which is responsible for generating the necessary forward pressure force. In most cases, the forward pressure spring is linked to a point that is positioned in the vicinity of the heel of the boot; however, in some binding systems, the forward pressure spring is connected to a tether (toe-heel link) that is fastened to a point on the ski that is near the mounting point of the toe-cup 4220, which renders the forward pressure system somewhat less sensitive to flexural deformations of the ski.

Skis that comply with the aforementioned ISO specifications feature a braking device that will prevent the ski from sliding down the hill in the event that the boot is released from its binding. Continuing with reference to FIGS. 5A and 5B, these brake systems are typically actuated by spring-loaded pedals 4240 that are positioned beneath the boot, slightly forward of the rear AFD perch 4250. As depicted in FIGS. 7A and 7B, due to the spring-loaded nature of this brake pedal 4240, there exists a brake pedal force 4245 ($F_{BP}$) between the pedal 4240 and the bottom of the sole 4140 of the boot 4100.

Finally, as depicted in to FIGS. 7A, 7B, 9A and 9B, the front AFD perch 4230 and the rear AFD perch 4250 each apply reaction forces 4235 and 4255 ($F_{AFD\_f}$ and $F_{AFD\_r}$, respectively) in order to equilibrate the aforementioned binding loadings, as well as any other unbalanced snow loadings, gravity loadings, and/or inertial loadings that are imposed upon the ski 3000. In general, the aforementioned binding loads are typically generated by passive mechanical spring systems; as such, for a contemporary alpine binding system, it is possible to perform a series of mechanical tests that will provide load-versus-deflection responses of each component of the binding system, thus facilitating the calculation of each of the binding loads as a function of the displaced positions of each binding component.

A broad variety of gliding board construction architectures exist for the various types of gliding board sports. Within the context of downhill skiing, the most commonly used construction architectures include: sandwich-type (sidewall), cap, and semi-cap (half-cap). Sandwich-type construction is generally most conducive for the creation of skis that exhibit high torsional stiffness; as such, sandwich-type construction is often used for race skis and high-performance on-piste carving skis. Although the present description describes ski designs having a sandwich-type construction, it should be noted that some embodiments may include generating designs that include other gliding board construction architectures.

Figure 10:
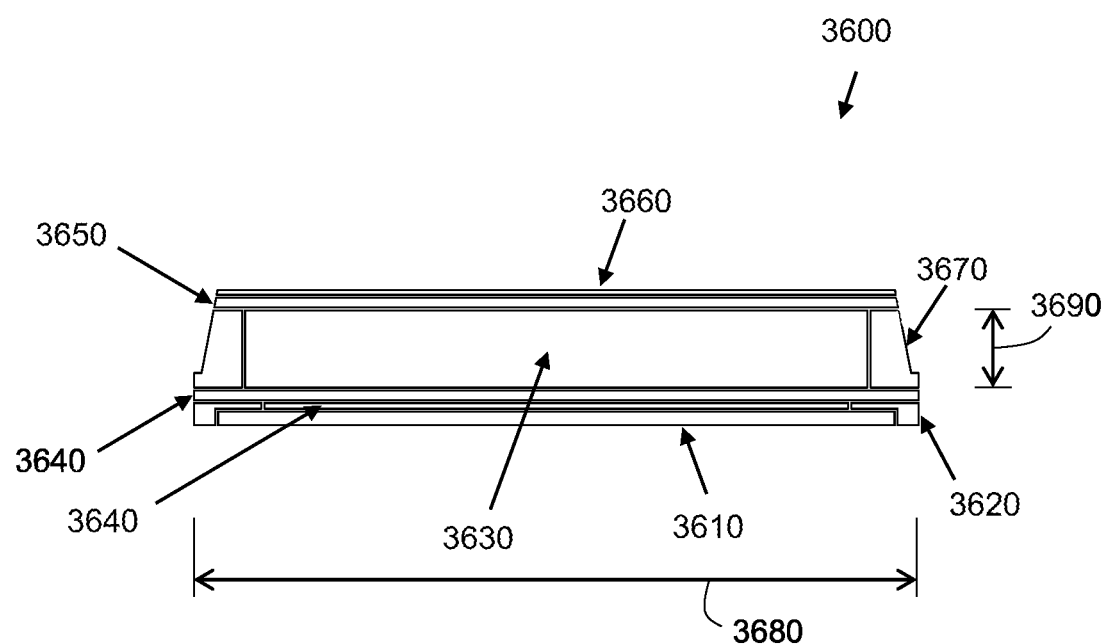
FIG. 10 shows a cross-sectional view of the ski shown in FIG. 3, illustrating a sandwich-type construction, in accordance with an example embodiment.

Referring now to FIG. 10, shown therein is a cross-sectional view of a ski that exhibits sandwich-type construction 3600; the cross-sectional view of the ski is drawn on a plane that is oriented perpendicular to the longitudinal axis of the ski, and therefore depicts the width and thickness dimensions of the ski's cross-sectional geometry. As depicted in FIG. 10, the base 3610 is the bottom surface of the ski that comes into direct contact with the snow; the base 3610 is typically formed of an ultra-high molecular weight polyethylene (UHMW-PE) material, which often contains additives to reduce friction. The edges 3620 flank the both sides of the bottom surface 3610 of the ski; the edges 3620 are typically composed of a hardened steel material. The core 3630 is enveloped within all of the other constituents of the ski construction. The core 3630 is most commonly formed of a laminate of one or more types of wood; however, some skis employ other core materials, such as: polymeric foams, honeycomb materials, and hybrid laminates of a few different types of materials. The lower reinforcing plies 3640 are positioned directly below the core 3630, whereas the upper reinforcing plies 3650 are positioned directly above the core 3630. These lower and upper reinforcing plies 3640, 3650 typically include fibre-reinforced polymer layers (such as fibreglass, carbon-fibre, and/or aramid fibre reinforced thermoset resins), and often also include layers of sheet metal (aluminium and/or steel alloys) as well. The topsheet 3660 is a non-structural layer that is responsible for protecting the upper reinforcing plies, and providing aesthetic adornment to the upper surface of the ski. The topsheet 3660 is typically formed of a thermoplastic material, such as a polyamide or a UHMW-PE material. The sidewalls 3670 are responsible for sealing the sides of the core 3630, which would otherwise be exposed between the lower and upper reinforcing plies 3640, 3650.

The assembly of the lower reinforcing plies 3640, the upper reinforcing plies 3650, and the sidewalls 3670 constitutes a closed box-section (closed thin-walled tube), which may offer considerable structural benefits; in the context of torsional loading, this type of structural member functions as a torsion-box, wherein each of the skins of the box section develops shear flow along its mid-plane, thus enabling the torsion-box to resist torsional deformations in a very efficient manner. The sidewalls 3670 are typically formed of either a thermoplastic material (such as acrylonitrile butadiene styrene or UHMW-PE) or a paper reinforced thermoset resin material (such as kraft paper reinforced phenol formaldehyde resin). Due to the relatively high shear modulus and low toughness of paper reinforced thermoset resins, the use of these materials as sidewalls typically yields highly efficient torsion-box behaviour, but results in relatively poor durability; as such, this type of sidewall material is typically only used in race skis and some high-performance on-piste carving skis.

FIG. 10 further shows the overall width of the ski 3680 (measured between the outer surfaces of the edges 3620), as well as the thickness of the core of the ski 3690.

The sidecut profile of the ski is dictated by variations in the width of the ski 3680 (the width profile) over the length of the ski. As the width of the ski 3680 varies, the widths of the base 3610, lower reinforcing plies 3640, core 3630, upper reinforcing plies 3650, and topsheet 3660 also vary. Conversely, the widths of the sidewalls 3670 and edges 3620 typically remain constant over the length of the ski.

In order to achieve a targeted flexural stiffness profile (bending stiffness profile) over the length of the ski, the thickness of the ski may be varied over its length. This variation in thickness is typically achieved by varying the thickness of the core 3690, and consequently, the height of each sidewall 3670 is also varied. As such, it should be understood that core thickness can be selected as the stiffness design variable for this particular example embodiment. Conversely, the base 3610, lower reinforcing plies 3640, upper reinforcing plies 3650, and topsheet 3660 typically maintain a constant thickness over the length of the ski. In some cases, some or all of the lower and/or upper reinforcing plies 3640, 3650 may exhibit varying thicknesses over the length of the ski as well, but this is relatively uncommon.

The "thickness profile" of the ski defines the total thickness of the ski at any position along the length of the ski; similarly, the "core thickness profile" defines the thickness of the core of the ski at any position along the length of the ski. Core thickness has been selected as the only stiffness design variable for most of the example embodiments that are discussed below; as such, the core thickness profile represents the only stiffness design variable profile that is employed by most of the example embodiments that are discussed below. However, it should be noted that other stiffness design variables are possible.

A curvilinear tangential coordinate system (XmidB) comprises a curvilinear tangential axis that is defined along the longitudinal axis of the base of the ski (centred on the width of the ski), and follows the base contours of the ski as the ski changes shape from its cambered state to its deformed shape under loaded conditions. The origin of the tangential coordinate system (XmidB) is positioned at the mid-base point (mid-point between the forward and aft extremities of the effective base region of the ski). The terms "tangential coordinate" and "tangential position" are used somewhat interchangeably herein; both of these terms are used in reference to positions along the longitudinal curvilinear tangential axis of the ski. A global three-dimensional Cartesian coordinate system is then defined, wherein the X-axis is parallel to the tangential coordinate system (XmidB) at the mid-base point of the ski and points rearward, the Y-axis is perpendicular to the X-axis and parallel to the surface of the snow, the Z-axis is perpendicular to the X-Y plane and points in the upward direction (away from the snow), and the origin is positioned at the mid-base point of the ski. At each tangential position along the length of the ski, the orientation of the base surface of the ski is represented by three local orthogonal direction vectors (orientation vectors) of unit length: the v vector is oriented tangential to the longitudinal curvilinear tangential axis of the ski (parallel to the local base contour of the ski), and points in the rearward direction; the n vector is perpendicular to the base surface of the ski, and points in the direction that is opposite the snow (generally upwards); and the b vector is perpendicular to both the v and n vectors.

The present descriptions herein often represent curvilinear geometries in terms of their curvature profiles, wherein a curvature profile defines the curvature of the relevant geometry at any tangential position along the length of the ski. In general, the term "curvature" is defined as the reciprocal of the local radius of a curvilinear form. The plane within which curvature is measured is dependent upon the nature of the particular curvilinear form of interest. For example, in the context of bending deformations, flexural curvatures (bending curvatures) are measured within the local v–n plane of the ski. Similarly, camber and/or rocker curvatures are also measured within the local v–n plane of the ski. Conversely, the local curvature of the sidecut profile of the ski would be measured within the local v-b plane of the ski.

Although the present descriptions herein do make extensive use of curvatures in order to represent curvilinear forms, this is not intended to be restrictive. For example, some embodiments could be formulated based upon direct three-dimensional representations of curvilinear forms in Cartesian coordinates. A reader who is skilled in the art will appreciate that a smooth and continuous curvilinear geometry can be represented at various levels of differentiation and/or integration without tarnishing the fidelity of the representation of said curvilinear geometry.

The present descriptions herein generally focus on two types of structural deformations: bending (also referred to as flexure) and torsion (also referred to as twisting). In general, bending moments imposed upon a ski (or other gliding board) will refer to moments that act about the local b orientation vector of the ski, thus causing flexural curvatures (bending curvatures) that exist within the local v–n plane of the ski. Conversely, torsion moments (otherwise referred to as twisting moments, or torques) imposed upon a ski (or other gliding board) will generally refer to moments that act about the local v orientation vector of the ski, thus causing torsional deformations (rotations) about the local v orientation vector of the ski.

The present descriptions herein also refer to total curvatures, which represent the curvature of the overall deformed shape of the ski. As such, total curvatures may represent the summation of at least camber curvatures, rocker curvatures, and flexural curvatures, wherein all of said curvatures exist within the local v–n plane of the ski. In some embodiments, total curvatures may also include the effects of other deformation components that can be represented by curvatures that exist within the local v–n plane of the ski, such as transverse shear deformations. The "total curvature profile" defines the total curvature at any position along the length of the ski.

A sign convention for curvatures is defined, wherein a positive curvature is one that embodies a concave upward (convex downward) geometry within the local v–n plane of the ski; as such, positive curvatures exhibit concavity that points in the same general direction as the local n orientation vector. A sign convention for bending moments is defined, wherein a positive bending moment is one that will induce a positive flexural curvature.

The "flexural neutral axis" of the ski is defined as the elevation within the thickness of the ski at which bending stresses and bending strains are equal to zero.

The present descriptions herein will generally use the terms "flexural" and "bending" interchangeably.

In addition, the present descriptions herein will generally use the term "stiffness" in reference to a quantitative measurement of a resistance to deformations and/or deflections; as such, the term "stiffness" is intended to have essentially the same meaning as "rigidity". Conversely, the term "compliance" is used herein to denote the reciprocal of stiffness; as such, a structure that exhibits relatively high stiffness is one that exhibits relatively low compliance.

The term "camber curvature" is generally used herein to denote a negative curvature that exists in the absence of any applied loads or otherwise induced deformations. Conversely, the terms "rocker" and/or "reverse-camber" are generally used to denote a positive curvature that exists in the absence of any applied loads or otherwise induced deformations.

The terms "camber elevation profile" and "camber curvature profile" are generally used herein to denote the overall geometry of the base contour of the ski in the absence of any applied loads or otherwise induced deformations; as such, although these terms do not explicitly include the term "rocker", the camber curvature profile of a ski may generally refer to an assembly (or summation) of both camber curvatures and rocker curvatures. In some cases, the present descriptions herein will more explicitly denote the overall geometry of the base contour of the ski as the "camber and rocker" elevation profile or the "CamRock" elevation profile; however, it will not always be necessary or practical to make this explicit distinction.

The present descriptions herein use the term "spring-back" in reference to deformations that the ski will exhibit upon removal from the manufacturing tooling (mould) as a result of residual internal strain energy that is stored within each constituent of the ski during fabrication. The term "elastic spring-back" is used herein in reference to spring-back that is caused by strain energy that is stored in the ski due to the mechanical deformations that are imposed upon each constituent of the ski during fabrication. Conversely, the term "thermo-mechanical spring-back" is used herein in reference to spring-back that is caused by thermal strain energy that is stored in the ski due to the change in temperature that is imposed upon each constituent of the ski during fabrication.

The "snow penetration depth" is defined herein as the distance between the surface of the snow and lowest point of the ski (the edge that is currently engaged with the snow), measured perpendicular to the surface of the snow. The "local snow penetration depth" denotes the penetration depth at a specific tangential coordinate along the length of the ski. The "snow penetration depth profile" defines the local snow penetration depth at any position along the length of the ski under design point conditions. The "global penetration depth" of the ski is defined herein as the distance between the mid-base point of the ski and the surface of the snow, measured perpendicular to the surface of the snow. The "pitch angle" of the ski is defined herein as the angle between the surface of the snow and the v orientation vector that is positioned at the mid-base point of the ski, wherein said pitch angle is measured about an axis that lies parallel to the surface of the snow and perpendicular to the longitudinal axis of the ski.

The terms "snow load" and "snow loading" are used herein (somewhat interchangeably) in reference to loadings that are applied to the ski by the snow. At any point along the length of the ski, the local snow pressure distribution can be integrated over some or all of the area of contact between the ski and the snow, resulting in a snow force. A snow load (or snow loading) may represent at least one force per unit length that the snow applies to the ski at a single tangential position along the length of the ski; as such, a snow load (or snow loading) may be calculated by integrating the snow pressure distribution over a local width of the area of contact between the ski and the snow, resulting in a local force per unit length of ski. In some example embodiments, each snow load (or snow loading) may comprise at least one force per unit length that acts on the base surface of the ski. In some example embodiments, each snow load (or snow loading) may comprise at least one force per unit length that acts on at least one of the edges of the ski. In some example embodiments, each snow load (or snow loading) may comprise at least one force per unit length that acts on at least one of the sidewalls of the ski. The "snow load profile" defines the local snow load at any tangential position along the length of the ski. Similarly, the "snow loading distribution" defines the local snow loading at any tangential position along the length of the ski.

The "athlete load profile" represents the total athlete load that can be assumed to be applied by the athlete to the ski during the carved turn. The "athlete loading centroid" is defined herein as the centroid of at least one component of the athlete load profile.

While a broad variety of skiing styles and corresponding ski types exist, racing and on-piste carving skiing techniques typically involve an athlete undertaking to execute carved turns. Carved turns are typically carried out on prepared skiing trails (pistes) that are covered with groomed snow, wherein said groomed snow has been packed (consolidated) and/or sintered, thus yielding a smooth and firm surface of snow. A carved turn can be characterized as a turn that is executed in a manner that minimizes the quantity of snow that is displaced from its resting position on the piste, thus minimizing the drag (snow resistance) that is imposed upon the ski during the turn.

It is convenient to define a "snow trace" as the instantaneous curvilinear geometry of the effective line of contact between the ski and the snow. In essence, the snow trace represents the effective line of contact between the ski and the snow when said ski is quasi-statically pressed into the snow under comparable loading conditions (comparable edging angle, loading, environmental conditions, etc.) to those which would be present during a carved turn, wherein said ski is not actually sliding along this effective line of contact. In some example embodiments, this instantaneous effective line of contact (the snow trace) represents the line along which snow loads are assumed to be acting at each tangential position along the length of the ski. The term "snow trace profile" herein denotes the curvilinear geometry of this snow trace. In a dynamic sense, the snow trace profile represents the instantaneous geometry of the groove or trench that is created by the ski during a carved turn, wherein said groove or trench is only observed within the vicinity of the instantaneous position of the ski.

A carved turn is initiated when a ski engages with the snow at some non-zero edging angle, the ski de-cambers onto the surface of the snow, and the edge of the ski cuts a curvilinear groove into the surface of the snow that approximately matches the curvilinear geometry of the snow trace. For convenience, the term "carved groove" herein denotes the groove that is cut by the ski during the carved turn. If the ski slides through the carved groove cleanly without significantly disturbing the snow on either side of the groove, and while minimizing the width of the carved groove, then the ski is said to have executed a carved turn. As such, in order for an ideal carved turn to be achieved, the instantaneous velocity vector of any point along the length of the ski should be approximately tangential to the snow trace profile near the longitudinal tangential position of said point; this is particularly true in the vicinity of the afterbody of the ski. Conversely, if the instantaneous velocity vector of some point along the length of the ski (particularly a point within the vicinity of the afterbody of the ski) is not approximately tangential to the snow trace profile near the longitudinal tangential position of said point, then the ski will tend to disturb a larger quantity of snow, thus resulting in the creation of a relatively wide carved groove, and resulting in a skidded (non-carved) turn.

For any snow trace profile, there may exist a corresponding global curvature profile. In some example embodiments, this global curvature profile embodies a curvilinear form that can be determined by projecting the curvilinear geometry of the snow trace profile onto a global curvature projection plane. In some example embodiments, this global curvature projection plane constitutes an oblique projection plane that is inclined with respect to the plane on which the snow trace profile exists (the snow surface). In some example embodiments, the global curvature projection plane constitutes a nominal plane of symmetry that is oriented approximately parallel to the longitudinal axis of the ski and approximately perpendicular to the base surface of the ski, when the ski is oriented at the edging angle that corresponds to the relevant snow trace profile.

Some embodiments described herein make use of various functions, subroutines, and other software algorithms that utilize numerical search operations that employ a bisection method (herein referred to as "bracketed bisection search algorithms"). While bracketed bisection search algorithms are described herein due to their robust convergence capabilities, some embodiments may use a broad variety of other search methods that may also be conducive for solving each of the numerical search problems that are discussed herein. Such alternative search methods might include, but are not limited to: the golden-section search method, the secant method, the false position method, and various other numerical search methods. Although the selected search method could have a significant effect upon the rate and robustness of convergence upon a solution, the specific search method that is employed may not be regarded as critical in at least some embodiments. As such, bracketed bisection search algorithms are employed in the descriptions herein for illustrative purposes only, and their use should not be regarded as restrictive.

An aspect of this description relates to the creation of alpine ski designs, such as designs for skis meant for racing and on-piste carving that are optimized for an individual athlete in the context of specifically defined conditions and performance-based parameters.

An aspect of this description relates to a method of identifying the ski equipment suitable for an athlete, as an alternative to or complementing a guess and check method. An aspect of this description takes into account sidecut profile, camber elevation profile, flexural stiffness profile, and torsional stiffness profile in creating ski equipment, such as to create a ski which will exhibit an ideal deformed shape and snow pressure distribution under the selected optimization parameters.

An aspect of this description relates to a more scientific and repeatable approach to identifying the ideal skis for an athlete, to get the most out of each athlete's potential without resorting to a guess-and-check approach. An aspect of this description relates to generating an ideal ski design based upon meaningful performance-based parameters, while retaining direct independent control over each parameter.

An aspect of this description relates to designing based upon performance-based parameters, so that varying any one parameter only substantially influences the relevant performance characteristic. An aspect of this description can be contrasted to designing based upon ski design characteristics (such as stiffness, camber, sidecut, etc.); designing based upon ski design characteristics means that varying one parameter will likely influence a multitude of performance characteristics. For example, an athlete may ask for a ski design to be revised such that one or more specific performance characteristics are changed. Embodiments of the present system and method may facilitate such a design change without substantially changing other performance characteristics, and without tarnishing the overall harmony of the ski design such as the relationship between sidecut, stiffness, and camber.

An aspect of this description relates to a system and method to build numerous versions of a single ski design (a "family" of ski designs) which are each optimized for a design-specific set of conditions (snow hardness, temperature, etc.).

An aspect of this description relates to a system and method to convert a ski design that works well for one athlete to another athlete by altering only the athlete-specific parameters while keeping all other parameters constant. For example, if athlete A is pleased with his/her skis, and athlete B is having difficulty finding a ski design that works for him/her, it is possible to take athlete A's ski design, and alter only the optimization parameters that are athlete specific (weight, boot size, binding release setting, etc.) in order to enable athlete B to have access to a nearly identical on-snow experience that athlete A has. In this example, the resulting ski design can then be further refined in order to home-in on athlete B's personal preferences. In this example, this approach may serve as a rapid method of establishing a ski design that is very close to one that would please athlete B.

In some embodiments, if an athlete prefers one particular binding and/or plate system, the system or method can generate a ski design that is optimized to work with the binding/plate system of choice.

In some embodiments, a system and method allow a user to test the effect of using new materials and/or laminate architectures in the ski without altering the stiffness of the ski. For example, it may be possible to compare two ski designs that are identical in nearly every way but comprise different core materials.

An aspect of this description relates to experimenting with geometric ski design parameters (such as shovel design, early-rise, taper, nominal radius, etc.), without damaging the harmonious relationship between all other ski characteristics.

Figure 2:
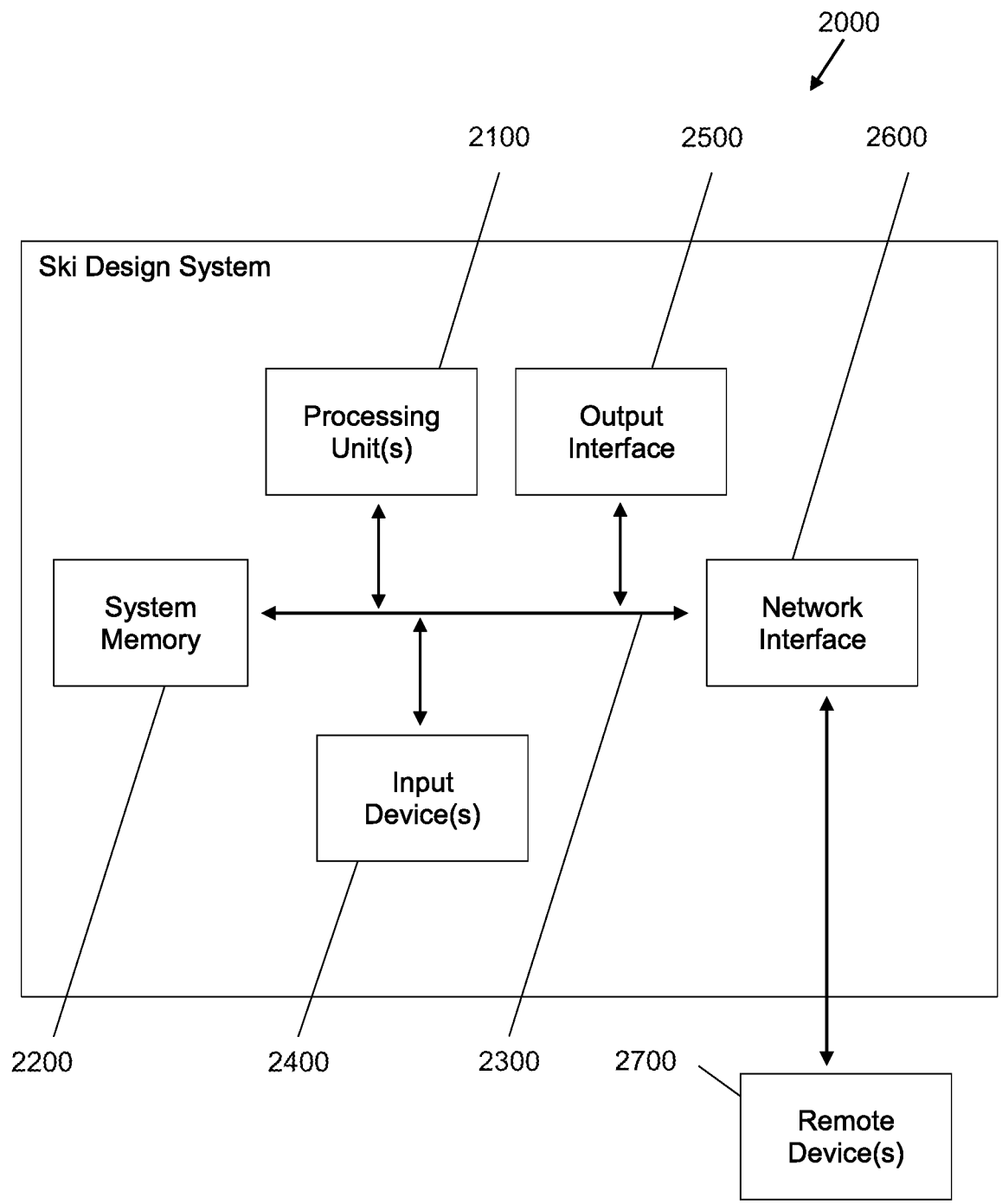
FIG. 2 shows a block diagram of a ski design system, in accordance with an example embodiment.

Referring now to FIG. 2, shown therein is a system 2000 for generating a design of a ski. Ski design system 2000 includes a processing unit 2100, a system memory 2200, an output interface 2500, an input device 2400, and a network interface 2600, which are interconnected across a system bus or network 2300.

Although ski design system 2000 is shown as one component in FIG. 2, in some embodiments, the ski design system 2000 can be provided with one or more servers distributed over a wide geographic area and connected via a network.

Each of the components of ski design system 2000 may be combined into a fewer number of components or may be separated into further components. Each of the components of ski design system 2000 may be implemented in software or hardware, or a combination of software and hardware.

The processing unit 2100 may be any suitable processor, controller, or digital signal processor that provides sufficient processing power depending on the configuration, purposes, and requirements of the ski design system 2000. In some embodiments, the processing unit 2100 can include more than one processor with each processor being configured to perform different dedicated tasks. The processing unit 2100 controls the operation of the ski design system 2000. For example, the processing unit 2100 can receive a plurality of inputs related to a particular athlete or condition and generate, in accordance with the methods disclosed herein, from the inputs, a design for a ski.

The system memory 2200 can include Random-Access Memory (RAM), Read-Only Memory (ROM), one or more hard drives, one or more flash drives, and/or some other suitable data storage elements such as disk drives, etc. For example, the system memory 2200 can include a memory on which one or more databases or file system(s) are stored. The database(s) can store information related to generating a ski design, such as, but not limited to, athlete parameters, technique and performance parameters, nominal geometric parameters, ski construction, environmental conditions, binding and plate characteristics, etc. In some embodiments system memory 2200 may include an operating system, application programs, and program data.

The ski design system 2000 is networked through the network interface 2600 and communicatively coupled to the remote device 2700. The network interface 2600 may be any interface that enables the ski design system 2000 to communicate with other devices and systems. In some embodiments, the network interface 2600 can include at least one of a serial port, a parallel port, or a Universal Serial Bus (USB) port. The network interface 2600 may also include at least one of an Internet, Local Area Network (LAN), Ethernet, Firewire, modem, or digital subscriber line connection. Various combinations of these elements may be incorporated within the network interface 2600.

The remote device 2700 may be any networked device operable to connect to the network interface 2600. A networked device is a device capable of communicating with other devices through a network. A networked device may couple to a network through a wired or wireless connection. Although only one remote device 2700 is shown in FIG. 2, there may be multiple remote devices in communication with the ski design system 2000 via the network interface 2600. The remote devices 2700 can be distributed over a wide geographic area. The remote devices 2700 may include at least a processor and memory, and may be an electronic tablet device, a personal computer, workstation, server, portable computer, mobile device, personal digital assistant, laptop, smart phone, Wireless Application Protocol (WAP) phone, an interactive television, video display terminals, gaming consoles, and/or portable electronic devices, or any combination of these. In some embodiments, the remote devices 2700 may be a laptop or a smartphone device equipped with a network adapter for connecting to the Internet.

A user may interface with the ski design system 2000 through input devices 2400 to provide information and instructions. For example, input devices 2400 may include a mouse, a keyboard, a touch screen, a thumbwheel, a track-pad, a track-ball, a card-reader, voice recognition software and the like depending on the requirements and implementation of the ski design system 2000.

A user may receive information from the ski design system 2000 through output interface 2500 or remote device 2700. For example, a user may receive presentations, media files, items, and/or other content related to a generated ski design. The output interface 2500 may be a monitor, a speaker, a network interface, or any other suitable interface depending on the requirements and implementation of the ski design system 2000.

System 2000 can request inputs, such as from one or more user-operated input devices 2400, a storage system such as system memory 2200, and/or a remote device such as remote device 2700. For example, system 2000 may request athlete parameters, technique and performance parameters, nominal geometric parameters, ski construction, environmental conditions, and/or binding and plate characteristics, etc. System 2000 can then generate a design for a ski based on the requested inputs. As will be explained below with reference to FIGS. 12-14 and 16-17, system 2000 can apply various methods to generate the ski design.

Using system 2000, any one or more optimization parameters can be altered independently, and the influence of those parametric changes will be realized in the resulting ski design that is generated by the process. System 2000 can generate ideal ski designs based upon meaningful performance parameters, while retaining direct independent control over each parameter.

Using system 2000, designing based upon performance-based parameters means that varying one parameter may only influence the relevant performance characteristic. Conversely, designing based upon ski design characteristics (such as stiffness, camber, sidecut, etc.) means that varying any one parameter would likely influence a multitude of performance characteristics. For example, suppose an athlete wants a ski to exhibit more "pop" or "energy". In this case, an engineer might decide to increase the ski's camber. However, this design change would not only increase "pop" or "energy", it would also increase the apparent stiffness of the ski, it would change the optimum edging angle of the ski, and as a result, it would alter the conditions under which the ski exhibits optimum carving performance. Conversely, system 2000 can allow the engineer to change a single performance characteristic (such as one that would increase "pop" or "energy") while minimizing any influence that this change has upon other unrelated performance characteristics. In the present case of an athlete asking for more "pop", the user can stipulate changes to the input parameters that would yield an increase in the ski's camber, and system 2000 would automatically make a series of additional corresponding design changes (likely including subtle changes to the camber elevation profile, the stiffness profiles, and the sidecut profile) in order to isolate the desired performance change while retaining all other performance characteristics as much as possible. The ski design system 2000 can also ensure that the conditions under which the ski exhibits optimum carving performance (the design point) are unchanged, and the harmonious relationship between the flexural stiffness profile, torsional stiffness profile, camber elevation profile, and sidecut profile (width profile) is preserved.

Another example that helps to illustrate the benefits of designing based on performance based parameters is a scenario where an athlete tends to adopt an athletic stance with his/her weight concentrated relatively far forward on the ski, said athlete perhaps concentrating his/her weight closer to his/her toes rather than near the mid-sole of his/her boots. In this case, it may be desirable to move the perceived "sweet spot" further forward on the ski, wherein said sweet spot represents the tangential position (measured along the length of the ski) of the athlete loading centroid that yields the best possible snow load profile. An engineer employing conventional design techniques may choose to achieve this change in sweet spot position by increasing the flexural stiffness of the ski's forebody and decreasing the flexural stiffness of the ski's afterbody. However, this design change would not only change the location of the sweet spot; it would also change the shape of the snow load profile and the snow trace geometry, wherein said changed snow load profile may stray further from a desired snow load profile, and wherein said changed snow trace geometry may stray further from a desired snow trace geometry. Conversely, system 2000 can allow the engineer to alter the desired position of the sweet spot of the ski while maintaining the harmonious relationship between the various design characteristics of the ski. Consequently, employing system 2000 to change the position of the sweet spot of the ski would likely result in a slightly skewed version of the snow load profile that existed prior to this change, and the slope (inclination) of this snow load profile would likely be altered slightly in order to align the centroid of the snow load profile with the targeted position of the sweet spot; however, the general characteristics of the snow load profile would be left substantially unchanged. In addition, employing system 2000 to change the position of the sweet spot of the ski would likely result in only a negligible (likely imperceptible) change to the resulting snow trace geometry that is generated by the altered ski design.

Referring now to FIG. 1, shown therein is an example method 1000 for operating the ski design system 2000 to generate a ski design. Method 1000 begins at 1100, where the ski design system 2000 receives a set of input athlete parameters. Input athlete parameters may include athlete weight, boot size, binding release settings, and binding mounting position.

At 1200, the ski design system 2000 receives technique and performance parameters. Technique and performance parameters may include the relationship between angulation and inclination of the athlete, weight distribution between left and right feet, optimum edging angle, and fore and aft center of gravity position.

At 1300, the ski design system 2000 receives nominal geometric parameters. Nominal geometric parameters may include length of effective base region, nominal sidecut radius, taper, and shovel and tail geometry.

At 1400, the ski design system 2000 receives ski construction parameters. Ski construction parameters may include material mechanical properties, material physical properties, and laminate architecture.

At 1500 the ski design system 2000 receives environmental condition parameters. Environmental condition parameters may include a constitutive snow model and one or more temperatures.

At 1600 the ski design system 2000 receives binding and plate characteristic parameters. Binding and plate characteristic parameters may include binding dimensions, plate dimensions, plate stiffness, toe and heel clamping system characteristics, brake pedal characteristics, and forward pressure system characteristics.

At 1700, the ski design system 2000 generates a ski design. In some embodiments, the ski design system 2000 may generate the geometric data necessary to construct the skis in accordance with a target design (for example: geometry of each layer, mould geometry, core thickness profile, etc.). In some embodiments, the ski design system 2000 may generate a summary of the expected mechanical properties of the as-built ski design such that the accuracy of the construction can be verified once the skis have been built. For example, the ski design system 2000 may generate output files, which can be written to a directory in which the input files were stored. The output data may include: overall geometry and dimensions of the ski design, geometry and dimensions of each of the constituents of the ski design (as necessary to construct the ski), the targeted camber elevation profile of the ski, geometry of the mould (tooling) that would be required in order to achieve the targeted camber elevation profile of the ski, and the expected mechanical performance (such as flexural and torsional stiffness profiles) of the ski. In addition, ski design system 2000 may generate a series of plots that would help a user to assess the general characteristics of the final ski design, including: the expected camber elevation profile of the ski at various temperatures that were provided by the user, the expected flexural stiffness profile of the ski, and the expected snow pressure distribution over the length of the ski under design point conditions.

The ski design system 2000 can generate the ski design based on the inputs received at steps 1100-1600. The ski design system 2000 can generate the ski design using various methods. For ease of exposition, reference will now be made to FIGS. 16-17 and 12-14, to illustrate example methods applied by the ski design system 2000 to generate a ski design.

Figure 16:
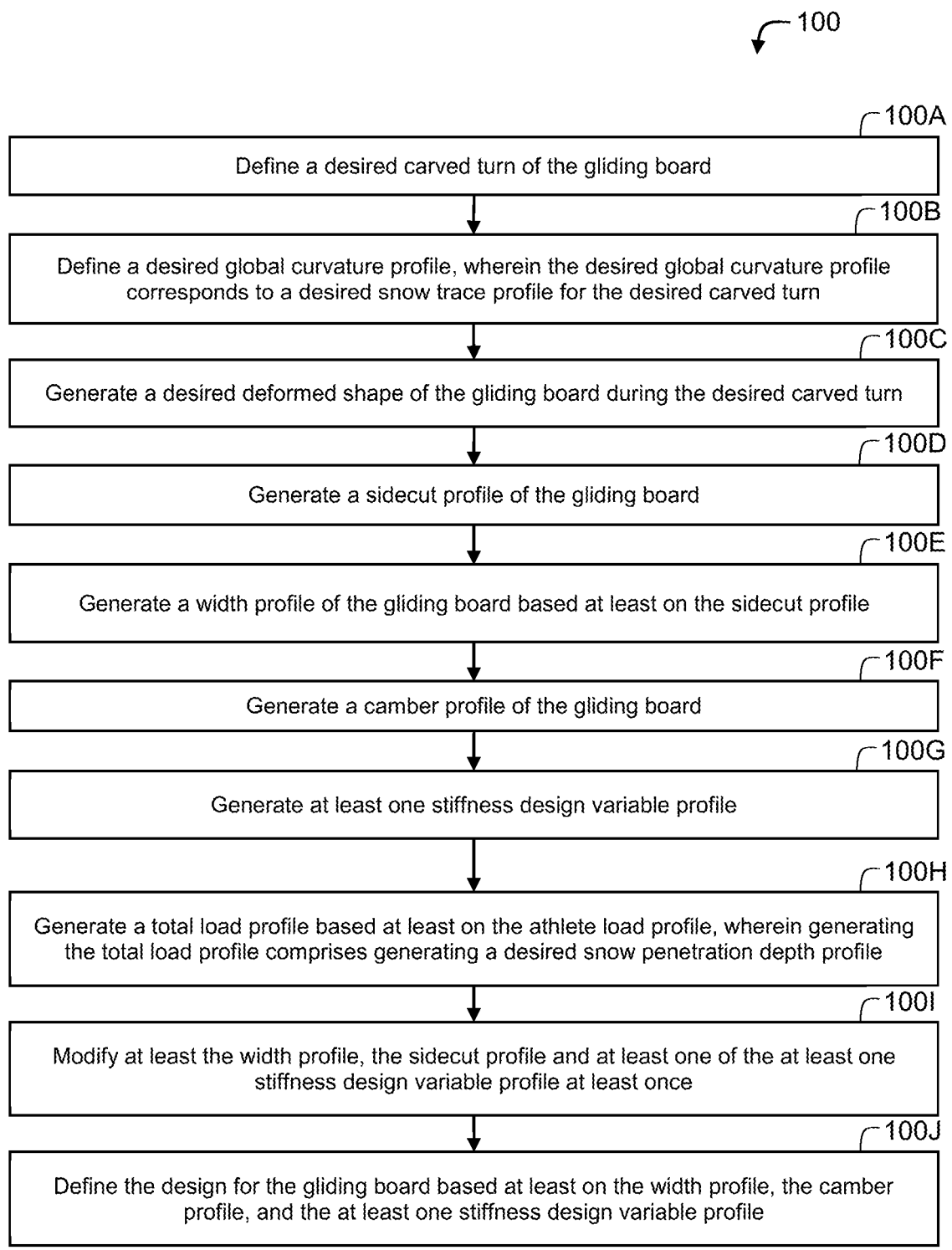
FIG. 16 shows a flowchart of a method for operating a ski design system, in accordance with an example embodiment.

Referring now to FIG. 16, shown therein is an example method 100 for operating the ski design system 2000 to generate a ski design. Method 100 begins at 100A, where the ski design system 2000 defines parameters that describe a desired carved turn of the ski. For example, the ski design system 2000 can determine a nominal edging angle of the ski, and can employ all available information to determine an athlete load profile, wherein said athlete load profile represents the total athlete load that can be assumed to be applied by the athlete to the ski during the carved turn. In some example embodiments, the athlete load profile may include the total magnitude of the total athlete load that can be assumed to be applied by the athlete to the ski during the carved turn. In some example embodiments, athlete load profile may include the direction of the total athlete load that can be assumed to be applied by the athlete to the ski during the carved turn. In some example embodiments, the athlete load profile may include the tangential position of the athlete loading centroid, which represents the tangential position (measured along the length of the ski) of the centroid of a relevant component of the total athlete load that can be assumed to be applied by the athlete to the ski during the carved turn. For example, the ski design system 2000 may determine the athlete load profile based at least on an edging angle of the ski, an inclination angle of the athlete, a mass of the athlete, and a weight distribution of the athlete. In some example embodiments, the ski design system 2000 may determine the athlete load profile based at least on an edging angle of the ski, an inclination angle of the athlete, an angle of inclination of the piste on which the carved turn is to be executed, a mass of the athlete, and a weight distribution of the athlete between his/her left and right feet. In some example embodiments, a user may directly provide some or all aspects of the athlete load profile as an input, thus alleviating the requirement for the ski design system 2000 to calculate said aspects of the athlete load profile.

At 100B, the ski design system 2000 defines a desired global curvature profile. The desired global curvature profile corresponds to a desired snow trace profile for the desired carved turn. For example, the ski design system 2000 can determine a desired groove or trench (herein referred to as a snow trace) that the ski would create in the snow if said ski were to be quasi-statically pressed into the snow under comparable loading conditions (comparable edging angle, loading, environmental conditions, etc.) to those which would be present during the carved turn. The term "snow trace profile" herein denotes the curvilinear geometry of this snow trace. In a dynamic sense, the snow trace profile represents the instantaneous geometry of the groove or trench that is created by the ski during a carved turn, wherein said groove or trench is only observed within the vicinity of the instantaneous position of the ski. In other words, the snow trace profile represents the geometry of the instantaneous effective line of contact between the ski and the snow. In some example embodiments, this instantaneous effective line of contact represents the line along which snow loads are assumed to be acting at each tangential position along the length of the ski. The ski design system 2000 may define the snow trace profile under circumstances wherein the ski is not actually sliding through the grove that is created within the snow. It is worth noting that the aforementioned snow trace profile may differ slightly from the geometry of the groove or trench that would be created by a ski under dynamic conditions during the carved turn (the carved groove); this is due, in part, to the fact that the forebody of the ski must cut the groove, whereas the afterbody of the ski may simply pass through the resulting grove. However, in other example embodiments, the ski design system 2000 may define the snow trace profile such that it is assumed to be identical the geometry of the grove or trench that the ski would cut under dynamic conditions as the carved turn is executed (the carved groove).

The desired snow trace profile can correspond to the desired global curvature profile. In some example embodiments, this desired global curvature profile can embody a curvilinear form that can be determined by projecting the curvilinear geometry of the desired snow trace profile onto a global curvature projection plane. In some example embodiments, this global curvature projection plane constitutes a nominal plane of symmetry that is oriented approximately parallel to the longitudinal axis of the ski and approximately perpendicular to the base surface of the ski, when the ski is oriented at an edging angle (the nominal edging angle) that corresponds to the carved turn.

In some embodiments, the geometry of the desired snow trace profile may be selected so as to minimize the quantity of snow that may be displaced by a ski and/or to maximize the engagement (or grip) of the ski with the snow, and therefore to maximize the carving performance of a ski. In some embodiments, the desired snow trace profile may correspond to an approximately constant turning radius. For example, in some example embodiments that define the global curvature projection plane as constituting a nominal plane of symmetry, a desired snow trace profile may be defined such that it corresponds to an approximately constant turning radius; in such example embodiments, the corresponding desired global curvature profile may be approximately representative of an elliptical arc (partial ellipse) geometry, because a constant radius circular arc (in this case, the snow trace profile) that is projected onto an inclined plane (in this case, the nominal plane of symmetry) takes the form of an elliptical arc (partial ellipse). In some embodiments, the desired snow trace profile and the corresponding desired global curvature profile can be determined based on nominal or initial inputs provided by a user, such as a nominal width profile, a nominal sidecut profile, and/or a ski edging angle.

At 100C, the ski design system 2000 generates a desired deformed shape of the ski during the desired carved turn. The desired deformed shape of the ski can be defined at least by a desired total curvature profile, wherein the desired total curvature profile is initially set to correspond to the desired global curvature profile. For example, the ski design system 2000 can assume a deformed shape (and corresponding total curvature profile) of the forebody of the ski that would generate a snow trace approximately having the desired global curvature profile, and a deformed shape (and corresponding total curvature profile) of the afterbody of the ski that can approximately smoothly pass through the resulting carved groove. In some embodiments, the desired total curvature profile of the deformed ski may initially be set equal to the desired global curvature profile. In some embodiments, the desired total curvature profile of the ski may be defined in a manner that initially ignores the effects of some or all deformation components that cannot be directly represented by flexural curvatures. In some embodiments, the desired total curvature profile of the ski may be defined in a manner that initially ignores the effects of some or all deformation components that cannot be directly represented by curvatures that exist within the local v–n plane of the ski. For example, in some embodiments, the desired total curvature profile of the ski may be defined in a manner that initially ignores the effects of torsional deformations.

In some embodiments, the desired total curvature profile may be subject to modification during operations that are subsequently carried out by the ski design system 2000.

In some embodiments, the ski design system 2000 can generate a desired total curvature profile based at least on an initial width profile and a ski edging angle. For example, the ski design system 2000 may determine a desired total curvature profile based on a nominal sidecut profile and a nominal edging angle received from a user.

The use of a total curvature profile here serves as a convenient means of representing the overall deformed shape of the ski, while excluding the effects of some or all deformation components that cannot be directly represented by curvatures that exist within the local v–n plane of the ski (such as torsional deformations); however, this curvature-based representation should not be considered restrictive. Some alternative embodiments may employ other representations of the overall deformed shape of the ski that exclude the effects of some or all deformation components that cannot be directly represented by curvatures that exist within the local v–n plane of the ski, such as a direct three-dimensional geometric representation of the bent but untwisted ski in Cartesian coordinates.

In some example embodiments, it may be convenient to define a "total deformed geometry profile" that represents the three-dimensional geometry of the deformed shape of the ski, wherein said total deformed geometry profile can be defined in terms of the total curvature profile of the ski and at least one auxiliary deformation profile (such as a torsional deformation profile) of the ski. By this definition, there may also exist a "desired total deformed geometry profile" of the ski, wherein said desired total deformed geometry profile may be defined in terms of the desired total curvature profile of the ski and at least one desired auxiliary deformation profile (such as a desired torsional deformation profile) of the ski.

At 100D, the ski design system 2000 generates a sidecut profile of the ski. This sidecut profile may be subject to modification during operations that are subsequently carried out by the ski design system 2000. For example, the ski design system 2000 can generate a sidecut profile based on nominal inputs provided by the user. For example, a user may provide a nominal sidecut radius, and the ski design system 2000 can generate a sidecut profile that corresponds to said sidecut radius. In an alternative embodiment, a user may provide input parameters that describe a sidecut profile that is not of a constant radius arc, and the ski design system 2000 can generate a sidecut profile that corresponds to said sidecut input parameters.

In some example embodiments, the ski design system 2000 can define a desired geometry of a snow penetration depth profile, wherein the snow penetration depth profile represents the local snow penetration depth value at each position along the length of the ski, and the ski design system 2000 can then generate a sidecut profile based at least on the desired global curvature profile, the desired geometry of the snow penetration depth profile, and a ski edging angle. In some example embodiments, the ski design system 2000 can generate a sidecut profile based at least on the desired total curvature profile of the deformed ski during the carved turn, the desired geometry of the snow penetration depth profile, and a ski edging angle. In some example embodiments, this desired geometry of the snow penetration depth profile may represent the general shape of the desired snow penetration depth profile, without explicitly defining the position or orientation of this shape relative to a datum. For example, the user may define a W-shaped desired geometry of a snow penetration depth profile, wherein said snow penetration depth profile exhibits local maxima values in the vicinities of the shovel, the tail, and the mid-base regions of the ski; however, this W-shaped geometry may be translated, rotated, or skewed when it comes time for the ski design system 2000 to determine a resulting snow penetration depth profile. In some embodiments, the desired geometry of the snow penetration depth profile may correspond to an approximately constant snow penetration depth or may result in an approximately constant snow pressure. In some embodiments, the desired geometry of the snow penetration depth profile may correspond to a snow penetration depth that approximately follows a linear function (a polynomial function of degree one or zero) over the length of the effective base region of the ski. For example, the ski design system 2000 can determine a sidecut profile that, during the carved turn, will generate a snow penetration depth profile having a geometry that is substantially similar and/or proportional to the desired geometry of the snow penetration depth profile that was stipulated by the user. For example, if the user stipulates that the desired geometry of the snow penetration depth profile is to follow a linear function, then the ski design system 2000 can determine a sidecut profile that, during the carved turn, will generate a snow penetration depth profile that approximately follows a linear function. In the aforementioned example of a linear snow penetration depth profile, if the athlete load profile has a centroid that is rearward of the mid-base point, then the resulting linear snow penetration depth profile will likely have a maximum local snow penetration depth value at a position that is near the rearward-most point of the effective base region of the ski.

In some embodiments, the ski design system 2000 can determine the sidecut profile based on an initial nominal sidecut profile of the ski and a ski edging angle. For example, the ski design system 2000 may determine a desired snow trace profile based at least on a nominal sidecut profile and a nominal edging angle received from a user, and then the ski design system 2000 may determine a corresponding sidecut profile such that the desired snow trace profile and the desired geometry of the snow penetration depth profile are simultaneously achieved at the stipulated nominal edging angle. In an alternative example, the user may directly stipulate the desired snow trace profile, and then the ski design system 2000 may determine a corresponding sidecut profile such that the desired snow trace profile and the desired geometry of the snow penetration depth profile are simultaneously achieved at the stipulated nominal edging angle.

At 100E, the ski design system 2000 generates a width profile of the ski. This width profile may be subject to modification during operations that are subsequently carried out by the ski design system 2000. In some example embodiments, the width profile may be determined as a function of the sidecut profile, as well as initial inputs provided by a user, such as: the waist width of the ski, and the taper of the ski. In the case of a ski that has left and right sidecut profiles that are not symmetric about the longitudinal axis of the ski, it may be necessary to independently determine both the left and right sidecut profiles of the ski, and then calculate the width profile once both sidecut profiles have been determined.

At 100F, the ski design system 2000 generates a camber profile of the ski. In some example embodiments, the camber profile is represented by a camber curvature profile, which defines the curvature of the camber profile at each position along the length of the ski. In some example embodiments, the ski design system 2000 can determine a camber profile that, during the carved turn, allows the ski to deform to the desired total curvature profile and accordingly approximately achieves the desired snow trace profile.

In some example embodiments, the ski design system 2000 may determine the camber profile based on a total curvature profile and a corresponding load profile. For example, the ski design system 2000 can determine the camber profile based on the desired deformed shape (wherein said desired deformed shape corresponds to the desired total curvature profile) of the ski during the carved turn and the corresponding loads that are applied to the ski during the carved turn, as well as the corresponding edging angle. In some embodiments, the ski design system 2000 may consider multiple total curvature profiles and corresponding load profiles that correspond to different edging angles.

For example, the ski design system 2000 can determine a first total curvature profile and a first load profile that correspond to a first edging angle. The ski design system 2000 can also determine a second total curvature profile and a second load profile that correspond to a second edging angle. The first and second total curvature profiles may each be determined in a manner similar to that employed in step 100C. In alternative example embodiments, the first and second total curvature profiles may each constitute a single nominal total curvature value (for example, a total curvature value that represents the total curvature at the position of the mid-base point) that is representative of a hypothetical total curvature profile. The ski design system 2000 may then determine a camber profile that facilitates a ski design that is capable of satisfying each of said first and second total curvature profiles with its corresponding load profile. That is, the ski design system 2000 determines a camber profile for a ski design that can achieve the first total curvature profile during a carved turn at the first edging angle with the first load profile, and can also achieve the second total curvature profile during a carved turn at the second edging angle with the second load profile. In some embodiments, the ski design system 2000 can determine the camber profile to also satisfy a zero load profile, resulting in a total curvature profile that is equal to the camber curvature profile. In some embodiments, the ski design system 2000 can determine the camber profile to also satisfy a zero edging angle, corresponding to a zero total curvature profile.

In some embodiments, the camber profile may be subject to modification during operations that are subsequently carried out by the ski design system 2000.

At 100G, the ski design system 2000 generates at least one stiffness design variable and at least one corresponding stiffness design variable profile. At any tangential position along the length of the ski, numerous local stiffness values of the ski (such as flexural stiffness, torsional stiffness, and/or transverse shear stiffness) may be dictated by the relationship between the local value of the at least one stiffness design variable, the local width of the ski, the construction architecture of the ski, and the mechanical properties of the materials that are present within the ski construction. As such, at least a resulting flexural stiffness profile and at least one resulting auxiliary stiffness profile may be dictated by at least the at least one stiffness design variable profile, the width profile, the construction architecture of the ski, and the mechanical properties of the materials that are present within the ski construction. In some embodiments, at least one of the at least one resulting auxiliary stiffness profile may be a resulting torsional stiffness profile. For example, skis that employ sandwich-type construction commonly employ core thickness as the primary stiffness design variable. In other words, the thickness of the core of the ski varies over the length of the ski in order to achieve a desired flexural stiffness value and/or a desired torsional stiffness value at each position along the length of the ski. In such embodiments, at least one of the at least one stiffness design variable profile is represented by a core thickness profile. In some example embodiments, the ski design system 2000 may initialize at least one of the at least one stiffness design variable profile as a zero vector, which may then be populated with non-zero values at subsequent steps of the process.

In some example embodiments, a ski may be designed with a construction that is of substantially constant thickness over its entire length, but features longitudinally oriented stiffening ribs on its upper surface; in this case, the stiffness design variable could take the form of at least one characteristic of these stiffening ribs (such as the height and/or width of each rib), such that the targeted flexural and/or torsional stiffness at any position along the length of the ski can be achieved by adjusting said at least one variable characteristic of the stiffening ribs.

In some example embodiments, a ski may be designed such that it exhibits two or more zones over its length, wherein two or more of these zones differ in their construction architecture and/or their dominant stiffness design variable.

At 100H, the ski design system 2000 generates the total load profile that is acting on the ski. For example, the total load profile may be defined to include a snow load profile and the athlete load profile. In some example embodiments, the total load profile may be defined as the vector sum of a snow load profile and the athlete load profile. Generating the total load profile may include generating a desired snow penetration depth profile.

In some example embodiments, the snow load profile may be calculated based at least on at least one snow property, wherein said snow load profile represents the loads that are applied to the ski by the snow. In some embodiments, the ski design system 2000 may determine the snow load profile based at least on the athlete load profile and at least one snow property. Various snow models (for example, constitutive material models), which will be discussed in further detail below, can be used as the at least one snow property. In some embodiments the ski design system 2000 may determine the snow load profile such that a total magnitude of the snow load profile is approximately equal to a total magnitude of a relevant component of the athlete load profile. That is, the ski design system 2000 may approximately balance the loads applied by the snow with the loads applied by the athlete. For example, the ski design system 2000 may determine a desired snow penetration depth profile such that a total magnitude of the resulting snow load profile is approximately equal to a total magnitude of a relevant component of the athlete load profile. In addition, in some embodiments, the ski design system 2000 may determine the snow load profile such that the centroid of the snow load profile is positioned approximately coincident with the centroid of a relevant component of the athlete load profile. For example, the ski design system 2000 may determine a desired snow penetration depth profile such that the centroid of the resulting snow load profile is positioned approximately coincident with a relevant component of the centroid of the athlete load profile. For example, the ski design system 2000 may determine the desired snow penetration depth profile by: determining an overall deformed shape of the ski based at least on the desired total curvature profile; determining a position and an orientation of the resulting deformed shape of the ski, wherein said position and orientation result in a resulting snow penetration depth profile; determining a resulting snow load profile that corresponds to the resulting snow penetration depth profile; and adjusting the position and orientation until the resulting snow load profile has a total magnitude that is approximately equal to a total magnitude of a relevant component of the athlete load profile, and the resulting snow load profile has a centroidal position that is approximately coincident with the centroid of a relevant component of the athlete load profile.

A reader who is skilled in the art will appreciate that a slight discrepancy may exist between the total magnitude of the athlete load profile and the total magnitude of the relevant component of the snow load profile, wherein said discrepancy may be caused, in part, by inertial loads that act upon the ski, the binding, the binding interface plate, and/or any other component that is not accounted for when determining the athlete load profile.

In some example embodiments, the ski design system 2000 may further determine a binding load profile as a part of determining the total load profile, wherein said binding load profile represents the various loads that the binding system imposes upon the ski. For example, the ski design system 2000 may consider the various loads applied by the binding system to the ski. These binding loads may include loads that account for the mechanical response of the various components of the binding system, and how these components interact with the boot that is to be restrained by said binding. In some embodiments, the binding loads may account for changes in the binding loads caused by articulations of the various mechanical components of the binding system, wherein said articulations may be caused, in part, by the deformation of the ski. In some example embodiments, the binding load profile may include the effects of a binding interface plate that is mounted between the ski and one or more components of the binding system; in such embodiments, the binding load profile may include loads that are imposed upon the ski as a result of deformations of said binding interface plate, and the resulting structural response of said deformed binding interface plate.

In some example embodiments, the calculated binding load profile may include the effects of the athlete load profile; in some such embodiments, the total load profile may include at least the snow load profile and the binding load profile. In some such example embodiments, the total load profile may be defined as the vector sum of the snow load profile and the binding load profile.

In some example embodiments, the calculated binding load profile may not include the effects of the athlete load profile; in some such embodiments, the total load profile may include at least the snow load profile, the athlete load profile, and the binding load profile. In some such example embodiments, the total load profile may be defined as the vector sum of the snow load profile, the athlete load profile, and the binding load profile.

In some embodiments, wherein generating the total load profile includes determining a desired snow penetration depth profile, the desired snow penetration depth profile is stored for subsequent use in calculations that require a desired snow penetration depth profile.

At 100I, the ski design system 2000 modifies at least the width profile, the sidecut profile, and at least one of the at least one stiffness design variable profile at least once. For example, the ski design system 2000 may perform iterative or recursive methods to modify the width profile, the sidecut profile, and at least one of the at least one stiffness design variable profile. For ease of exposition, an example iterative method will now be described with reference to FIG. 17.

Figure 17:
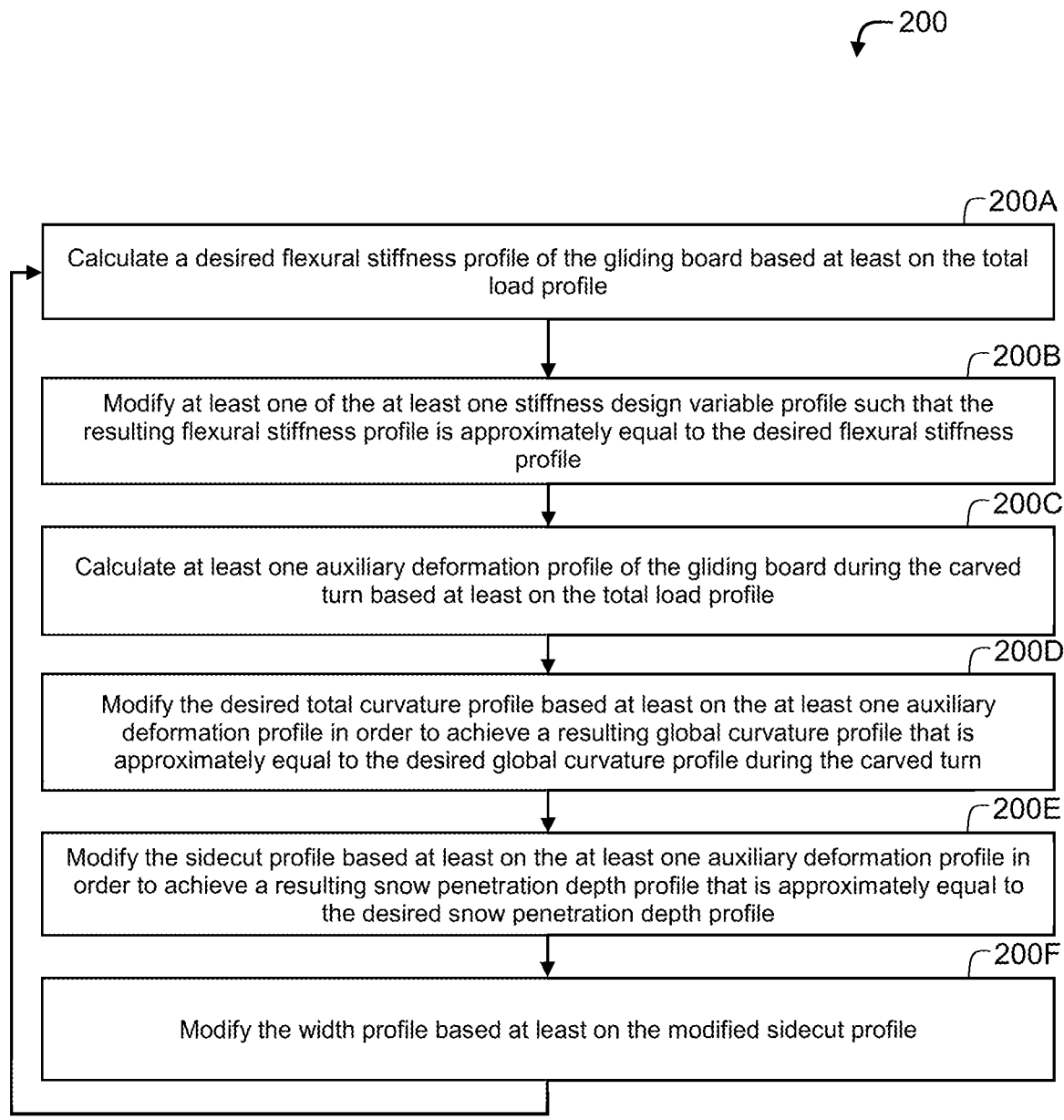
FIG. 17 shows a flowchart of a method for operating a ski design system, in accordance with an example embodiment.

Referring now to FIG. 17, shown therein is an example method 200 (corresponding to 100I of example method 100 shown in FIG. 16) of operating the ski design system 2000 to modify at least the width profile, the sidecut profile, and at least one of the at least one stiffness design variable profile. Method 200 begins at 200A, where the ski design system 2000 calculates the desired flexural stiffness profile that is necessary in order to achieve the desired total curvature profile of the deformed ski during the carved turn. For example, since system 2000 has already determined a camber curvature profile and a desired total curvature profile, it may determine the desired flexural curvature profile as the difference between these profiles. Some example embodiments may compensate for the presence of non-flexural deformations (such as transverse shear deformations) that contribute to the desired total curvature profile. For example, the system 2000 may compensate for transverse shear deformations by: calculating a resulting transverse shear curvature profile, and subtracting the resulting transverse shear curvature profile and the camber curvature profile from the desired total curvature profile in order to find the desired flexural curvature profile. In some embodiments, the ski design system 2000 may determine said transverse shear curvature profile using a formulation that accounts for the effects of non-uniform warping of the cross section of the ski, thus facilitating a more accurate representation of the transverse shear compliance of the ski. System 2000 may then calculate the desired flexural stiffness profile based on the desired flexural curvature profile and the total load profile. The ski design system may determine the desired stiffness profile based on the camber profile, the desired flexural deformation profile, and the total load profile of the ski. For example, the ski design system 2000 may determine a desired stiffness profile by considering the non-deformed shape of the ski, the deformed shape of the ski, and the loads applied to the ski to cause the ski to deform between the non-deformed and deformed shapes.

At 200B, the ski design system 2000 modifies at least one of the at least one stiffness design variable profile, as necessary, such that a resulting flexural stiffness profile is approximately equal to the desired flexural stiffness profile. In cases where the at least one stiffness design variable profile yields a resulting flexural stiffness profile that is equal to the desired flexural stiffness profile, the at least one stiffness design variable profile is said to have "achieved" the desired flexural stiffness profile. For example, if a core thickness profile is employed as the stiffness design variable, then the ski design system 2000 may determine a desired flexural stiffness profile and determine a core thickness profile that can approximately achieve the desired flexural stiffness profile.

In some embodiments, the values that populate at least one of the at least one stiffness design variable profile may be limited to an allowable range having upper and/or lower bounds that are dictated by practical considerations. For example, in some embodiments that employ core thickness as one of the at least one stiffness design variable, the core thickness profile may be limited to a predetermined thickness range. For example, there may be practical limitations to a ski design, which result in a maximum or minimum core thickness. Accordingly, the modified core thickness profile may, in some cases, fail to achieve the desired flexural stiffness profile. Thus, the ski design system 2000 may determine a core thickness profile that is as close as possible to approximately achieving the desired flexural stiffness profile, while remaining within the predetermined core thickness range. It will be understood that, in such embodiments, the ski design system 2000 can still be said to approximately achieve the desired total curvature profile.

In some embodiments, the ski design system 2000 may include an extra step (not shown) wherein the camber profile is modified based at least on the at least one stiffness design variable profile in order to approximately achieve the desired total curvature profile. For example, the ski design system 2000 may modify the camber profile locally in order to compensate the ski in regions where the at least one stiffness design variable profile (such as a core thickness profile) fails to achieve the desired flexural stiffness profile, and consequently the ski fails to achieve the desired total curvature profile. In some embodiments, the ski design system 2000 can determine a resulting total curvature profile of the ski and compare the resulting total curvature profile to the desired total curvature profile to determine the required adjustments to the camber profile. For example, the ski design system 2000 can determine the resulting flexural stiffness profile of the ski based at least on the at least one stiffness design variable profile, the width profile, the construction architecture of the ski, and at least one material property of the ski (e.g., an elastic modulus of the core). The ski design system 2000 can then determine the resulting flexural curvature profile of the ski based on the resulting flexural stiffness profile and the total load profile acting on the ski. The ski design system 2000 can then determine the resulting total curvature profile of the ski based on the resulting flexural deformation and the currently assumed camber profile. The ski design system 2000 can then modify the camber profile to compensate for regions where the resulting total curvature profile differs from the desired total curvature profile, and thus approximately achieve the desired total curvature profile. For example, the ski design system 2000 may add camber where the ski is insufficiently stiff, or add rocker where the ski is excessively stiff.

In some embodiments, the ski design system 2000 may employ regions of tailored transverse shear compliance in order to compensate for regions of excessive flexural stiffness. For example, the ski design system 2000 can determine a resulting total curvature profile of the ski and compare the resulting total curvature profile to the desired total curvature profile in order to determine the magnitudes and locations of deficiencies in the flexural compliance of the ski. In such regions of deficient flexural compliance, ski design system 2000 can add layers of materials having low shear stiffness (such as thin foils of elastomeric materials) in order to locally generate inclement transverse shear compliance (shear compliance within the local v–n plane of the ski) that could mimic the effects of flexural compliance, thus compensating for deficiencies in the actual flexural compliance of the ski.

At 200C, the ski design system 2000 calculates at least one auxiliary deformation profile of the ski during the carved turn. In some embodiments, at least one of the at least one auxiliary deformation profile may represent deformations that cannot be directly represented by flexural curvatures. In some embodiments, at least one of the at least one auxiliary deformation profile may represent deformations that cannot be directly represented by curvatures that exist within the local v–n plane of the ski. In some embodiments, at least one of the at least one auxiliary deformation profile may be a torsional deformation profile of the ski. For example, in some embodiments, the ski design system 2000 may determine a resulting torsional stiffness profile of the ski based on the at least one stiffness design variable profile, the width profile, the construction architecture of the ski, and at least one material property of the ski (e.g., an elastic modulus of the core). In some embodiments, the ski design system 2000 may then determine a torsional deformation profile based at least on the total load profile that is assumed to be acting on the ski and the resulting torsional stiffness profile of the ski. For example, the ski design system 2000 can determine the various loads applied to the ski during the carved turn and determine the deformation of the ski caused by the corresponding torsion moments. In some embodiments, the ski design system 2000 may determine a torsional deformation profile using a formulation that accounts for the effects of non-uniform warping of the cross section of the ski, thus facilitating a more accurate representation of the torsional compliance of the ski.

At 200D, the ski design system 2000 modifies the desired total curvature profile of the deformed ski based at least on the at least one auxiliary deformation profile in order to achieve a resulting global curvature profile that is approximately equal to the desired global curvature profile. For example, the ski design system 2000 may determine a resulting deformed shape of the ski based at least on the currently assumed desired total curvature profile and the at least one auxiliary deformation profile of the ski. As discussed above, the initial desired total curvature profile of the deformed ski determined at step 100C may not have taken into consideration the effects of some or all deformation components that cannot be directly represented by curvatures that exist within the local v–n plane of the ski (such as torsional deformations).

In some embodiments, the ski design system 2000 may determine a resulting global curvature profile of the ski during the carved turn and compare the resulting global curvature profile to the desired global curvature profile to modify the desired total curvature profile. For example, the ski design system 2000 may determine a resulting snow trace profile of the ski based at least on the resulting deformed shape of the ski, wherein said resulting deformed shape of the ski includes both flexural deformations and torsional deformations, and calculate the resulting global curvature profile that corresponds to said resulting snow trace profile. The ski design system 2000 may then modify the desired total curvature profile based at least on the comparison between the resulting global curvature profile and the desired global curvature profile. For example, the ski design system 2000 may then adjust the desired total curvature profile to compensate for regions where the resulting global curvature profile is different from the desired global curvature profile due, in part, to torsional deformations.

In some embodiments, the ski design system 2000 may establish a resulting deformed shape of the ski based at least on a total curvature profile and the at least one auxiliary deformation profile. In some embodiments, this resulting deformed shape of the ski may be based at least on the desired total curvature profile and the at least one auxiliary deformation profile. The ski design system 2000 can identify a desired snow penetration depth profile, which may have been calculated during a previous operation. In some example embodiments, this desired snow penetration depth profile may have been calculated at least prior to carrying out the most recent calculation of the at least one auxiliary deformation profile (200C) (for example, at step 100H). In some example embodiments, the desired snow penetration depth profile may have been calculated during a previous cycle through the various operations present within method 200. The ski design system 2000 may then establish a position and an orientation of the resulting deformed shape of the ski, wherein said position and orientation correspond to the identified desired snow penetration depth profile. For example, the ski design system 2000 may identify at least one anchor point along the length of the ski; at each of said at least one anchor point, the ski design system 2000 may then query the identified desired snow penetration depth profile in order to find a desired local snow penetration depth value that corresponds to the position of said anchor point. The ski design system 2000 may then establish a position and orientation of the resulting deformed shape of the ski such that the resulting local snow penetration depth value at each of the at least one anchor point is approximately equal to the corresponding desired local snow penetration depth value for said anchor point. The ski design system 2000 may then determine a resulting snow trace profile that corresponds to the resulting deformed shape of the ski and the established position and orientation of said resulting deformed shape of the ski. The ski design system 2000 may then determine a resulting global curvature profile that corresponds to the resulting snow trace profile. The ski design system 2000 may then compare the resulting global curvature profile to the desired global curvature profile. The ski design system 2000 may then modify the desired total curvature profile based at least on the comparison between the resulting global curvature profile and the desired global curvature profile.

In some example embodiments that employ at least one anchor point to establish a position and orientation of the resulting deformed shape of the ski for the purpose of modifying the desired total curvature profile of the deformed ski, said at least one anchor point may be defined at a position where the torsional deformation of the ski does not cause the local effective edging angle of the ski to differ from the user stipulated nominal edging angle of the carved turn. For example, the at least one anchor point may be defined at the position of a mounting point of a boot-binding component, wherein said mounting point of a boot-binding component represents a longitudinal tangential position at which the edging angle of the ski is explicitly defined and is not subject to the effects of torsional deformations.

At 200E, the ski design system 2000 modifies the sidecut profile based at least on the at least one auxiliary deformation profile in order to achieve a resulting snow penetration depth profile that is approximately equal to the desired snow penetration depth profile. For example, the ski design system 2000 can adjust the sidecut profile of the ski based on the torsional deformations and the influence that these torsional deformations have upon the resulting snow penetration depth profile.

In some embodiments, the ski design system 2000 can modify the sidecut profile such that the resulting snow penetration depth profile is substantially unchanged relative to that which was calculated during the previous cycle through the various operations present within method 200.

In some embodiments, the ski design system 2000 may establish a resulting deformed shape of the ski based at least on a total curvature profile and the at least one auxiliary deformation profile. In some embodiments, this resulting deformed shape of the ski may be based at least on the desired total curvature profile and the at least one auxiliary deformation profile. The ski design system 2000 can identify a desired snow penetration depth profile, which may have been calculated during a previous operation. In some example embodiments, this desired snow penetration depth profile may have been calculated at least prior to carrying out the most recent calculation of the at least one auxiliary deformation profile (200C) (for example, at step 100H). In some example embodiments, the desired snow penetration depth profile may have been calculated during a previous cycle through the various operations present within method 200. The ski design system 2000 may then establish a position and an orientation of the resulting deformed shape of the ski, wherein said position and orientation correspond to the identified desired snow penetration depth profile. For example, the ski design system 2000 may identify at least one anchor point along the length of the ski; at each of said at least one anchor point, the ski design system 2000 may then query the identified desired snow penetration depth profile in order to find a desired local snow penetration depth value that corresponds to the position of said anchor point. The ski design system 2000 may then establish a position and orientation of the resulting deformed shape of the ski such that the resulting local snow penetration depth value at each of the at least one anchor point is approximately equal to the corresponding desired local snow penetration depth value for said anchor point. The ski design system 2000 can then modify the sidecut profile of the ski such that, at each position along the length of the deformed ski, the resulting local snow penetration depth value is approximately equal to the corresponding local snow penetration depth value that is defined at that position by the identified desired snow penetration depth profile. In other words, the ski design system 2000 can modify the sidecut profile of the ski such that a resulting snow penetration depth profile is approximately equal to the identified desired snow penetration depth profile.

In some example embodiments that employ at least one anchor point to establish a position and orientation of the resulting deformed shape of the ski for the purpose of modifying the sidecut profile, said at least one anchor point may be defined at a position where the torsional deformation of the ski does not cause the local effective edging angle of the ski to differ from the user stipulated nominal edging angle of the carved turn. For example, the at least one anchor point may be defined at the position of a mounting point of a boot-binding component, wherein said mounting point of a boot-binding component represents a longitudinal tangential position at which the edging angle of the ski is explicitly defined and is not subject to the effects of torsional deformations.

At 200F, the ski design system 2000 modifies the width profile of the ski. In some example embodiments, the width profile may be determined as a function of the sidecut profile, as well as initial inputs provided by a user, such as: the waist width of the ski, and the taper of the ski. In the case of a ski that has left and right sidecut profiles that are not symmetric about the longitudinal axis of the ski, it may be necessary to independently modify both the left and right sidecut profiles of the ski, and then calculate the modified width profile once both sidecut profiles have been modified.

As shown in FIG. 17, method 200 can be repeated or iterated. That is, following step 200F, the ski design system 2000 may once again begin to perform step 200A. In some embodiments, the ski design system 2000 may iteratively repeat steps 200A to 200F until a predetermined threshold is reached. For example, the ski design system 2000 may compare the width profile, the sidecut profile, and/or at least one of the at least one stiffness design variable profile from the previous iteration with the width profile, the sidecut profile, and/or at least one of the at least one stiffness design variable profile from the current iteration. The ski design system 2000 may exit this loop when the comparison results in a difference that is less than the predetermined threshold.

In some example embodiments, modifying at least the width profile, the sidecut profile, and at least one of the at least one stiffness design variable profile (corresponding to example method 200 shown in FIG. 17, and method 100I of example method 100 shown in FIG. 16) further comprises modifying the total load profile and the corresponding desired snow penetration depth profile, wherein said modifications may be carried out in accordance with example method 100H (shown in FIG. 16). These modifications may improve the fidelity of the resulting ski design process because they will help to ensure that the total load profile acts in a manner that accounts for the deformed shape of the ski. Conversely, if the total load profile is only calculated once and then the deformed shape of the ski evolves during subsequent refinement of the design, then the assumed snow load profile (for example) will not act in a manner that corresponds to the most recent evolution of the deformed shape of the ski. In some embodiments, step 100H of method 100 can be executed within method 200, prior to step 200A (instead of, or in addition to, being executed within method 100). In some example embodiments, the modified desired snow penetration depth profile is stored for subsequent use in other calculations (for example, 200D and 200E of method 200 shown in FIG. 17). Conversely, in some other example embodiments, the modified desired snow penetration depth profile is only calculated for the purpose of determining the modified total load profile, and a previously calculated desired snow penetration depth profile is then employed for subsequent use in other calculations (for example, 200D and 200E of method 200 shown in FIG. 17).

Referring again to FIG. 16, at 100J, the ski design system 2000 defines the design for the ski based at least on the at least one stiffness design variable profile, the width profile, and the camber profile. As described above, the ski design system 2000 may, in some embodiments, output data relating to the geometry and dimensions of the ski, the geometry and dimensions of each component of the ski, the geometry of a mould for constructing the ski, and the expected performance parameters and mechanical characteristics of the ski.

In some embodiments, the ski design system 2000 can determine a mould profile for manufacturing the ski. For example, the ski design system 2000 can determine a spring-back of the ski following removal from a press mould and generate a mould profile based on the spring-back and the camber profile. The ski design system 2000 can determine the spring-back based on at least one material property of the ski. For example, the ski design system 2000 may determine a spring-back caused by residual thermal strain energy and/or residual elastic strain energy. The ski design system 2000 can then generate the mould profile based on the camber profile and the determined spring-back. For example, the design system 2000 can generate a mould profile which compensates for the spring-back and accordingly can be used to manufacture a ski that may accurately achieve the desired camber profile.

In some embodiments, the ski design system 2000 can generate a plurality of discretized elements for the ski. In these embodiments, the ski design system 2000 can perform steps 100A to 100J using the discretized elements. For example, a desired total curvature profile may be represented by a plurality of local desired total curvatures, wherein each total curvature corresponds to a discretized element. Similarly, a torsional deformation profile may be represented by a plurality of local torsional deformations, wherein each torsional deformation corresponds to a discretized element. The sidecut profile, width profile, camber profile, and the at least one stiffness design variable profile may also include local values that each correspond to a discretized element. In some embodiments, the discretized elements may be beam elements each having a deformed and/or non-deformed shape that can be represented by a helical geometric formulation.

It will be appreciated that method 100 is one example of a method for operating the ski design system 2000 to generate a ski design. Other methods for generating a ski design using the ski design system 2000 are possible. For example, reference will now be made to FIGS. 12-14, which illustrate further examples of methods for generating a ski design using the ski design system 2000.

Figure 12:
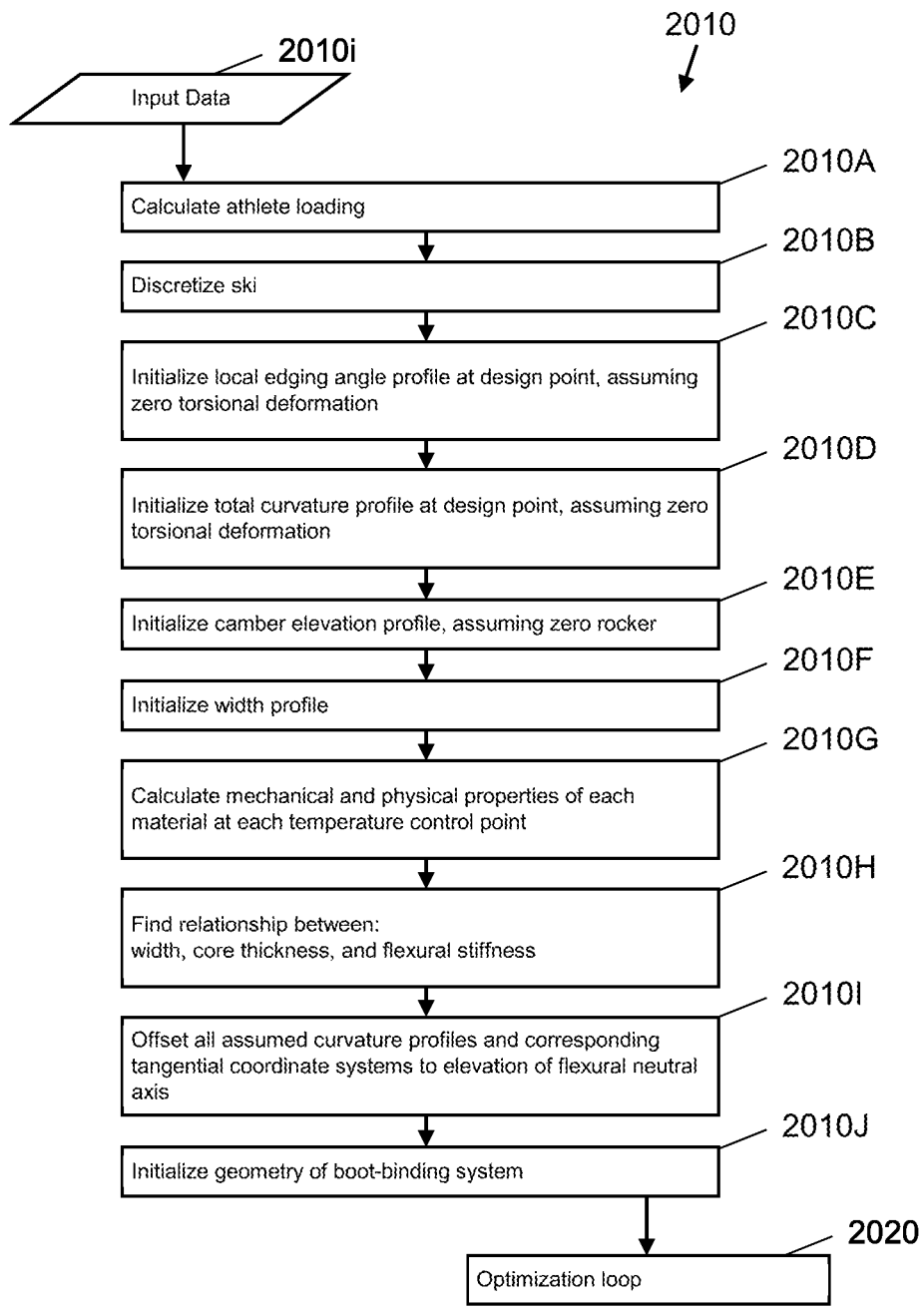
FIG. 12 shows a flowchart of a method for operating a ski design system, in accordance with an example embodiment.
Figure 13:
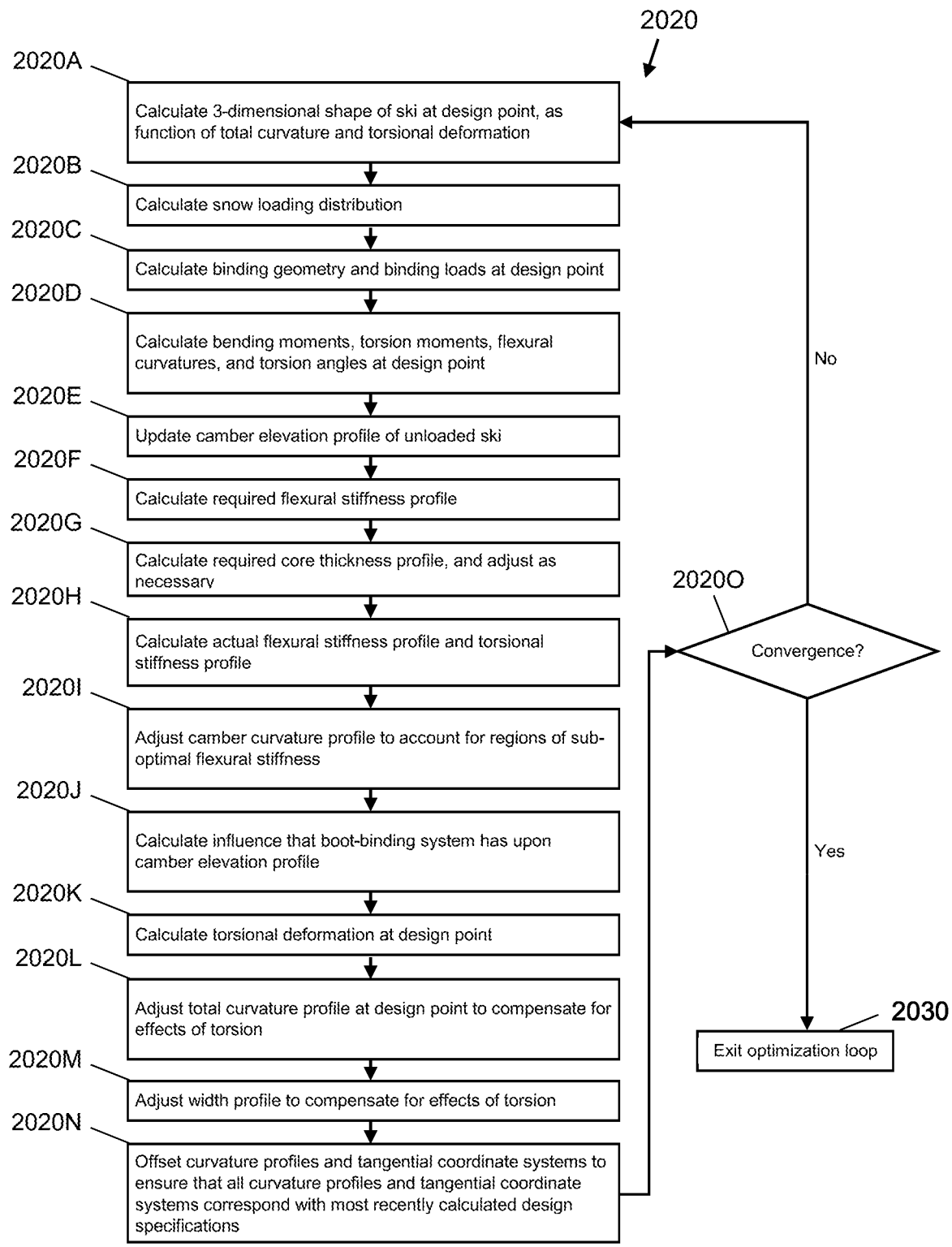
FIG. 13 shows a flowchart of a method for operating a ski design system, in accordance with an example embodiment.
Figure 14:
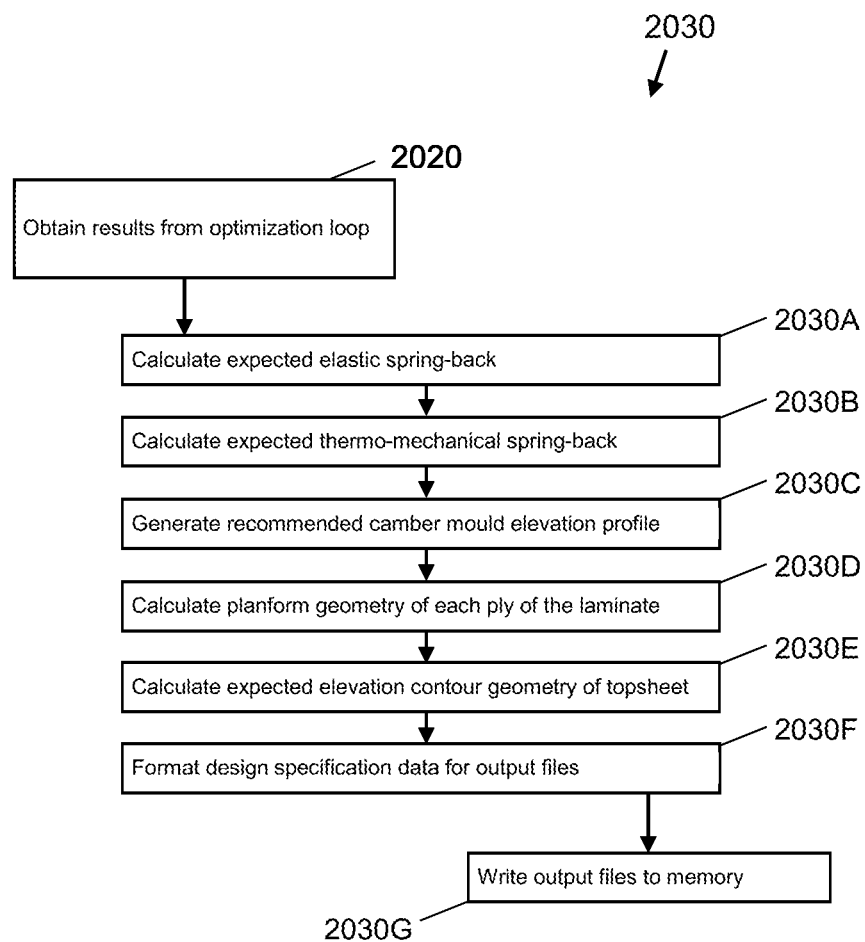
FIG. 14 shows a flowchart of a method for operating a ski design system, in accordance with an example embodiment.

Referring now to FIGS. 12-14, shown therein are further example methods 2010, 2020, and 2030 for operating the ski design system 2000 to generate a ski design. As will be explained in further detail below, method 2010 corresponds to an initialization process; method 2020 corresponds to an optimization loop that uses the results from the initialization method 2010; and method 2030 corresponds to a process for preparing design specifications based on the results from the optimization method 2020.

As depicted in FIG. 12, method 2010 serves to initialize an optimization problem, which can then be iteratively solved for using method 2020. Method 2010 can be summarized by the following general sequence of steps: 2010i receive input data; 2010A calculate the applied athlete loading; 2010B discretize the ski; 2010C initialize the local edging angle profile at the design point, assuming zero torsional deformation; 2010D initialize the total curvature profile at the design point, assuming zero torsional deformation; 2010E initialize the camber elevation profile, assuming zero rocker; 2010F initialize the width profile; 2010G calculate the mechanical and physical properties of each material at each temperature control point; 2010H calculate the relationship between the width, core thickness, and stiffness of the ski at the optimization temperature control point, in light of the user-stipulated laminate architecture of the ski; 2010I offset all assumed curvature profiles and corresponding tangential coordinate systems to the elevation of the flexural neutral axis; and 2010J initialize the geometry of the boot-binding system, in light of the assumed camber elevation profile.

As depicted in FIG. 12, method 2010 begins at 2010i, where the ski design system 2000 receives input data. For example, a user may provide input data through a variety of text files that contain information for the ski design system 2000 to carry out methods 2010, 2020, 2030. The user can point the ski design system 2000 to a directory in which the various input files reside, and the user can trigger the ski design system 2000 to commence method 2010.

Continuing with the above example, the ski design system 2000 can receive one or more of the following inputs files as input data: INPUTS_User_Params, INPUTS_User_Binding_Params, IN P UTS_Binding_Params, INPUTS_Engineering_Params, INPUTS_Snow_Model, INPUTS_Core_Materials, INPUTS_Core_Laminate, INPUTS_Laminate_Materials, INPUTS_Laminate_Architecture, INPUTS_Sublaminate_Plies, INPUTS_Solid_Component_Materials, INPUTS_Solid_Component_Geometry, INPUTS_Temperatures, CamRock_Offset, and Sidecut_Offset. It should be noted that the aforementioned collection of input files merely represents a configuration employed by one example. Some embodiments may amalgamate two or more of these input files into one larger input file. Some embodiments may organize the required input data differently amongst a different collection of input files. For example, some of the data that is contained within the INPUTS_User_Params input file could instead be contained within the INPUTS_Engineering_Params. The collection of input files that is discussed herein is presented as an example that illustrates the function of the ski design system 2000; however, the particular arrangement of the inputs should not be considered restrictive.

INPUTS_User_Params is a set of parameters pertaining to the athlete, his/her mass, his/her skiing technique, and a small collection of his/her preferred nominal ski characteristics. In order to optimize the design of a ski, it may be necessary to select a single scenario (design point) that embodies the conditions under which the optimization is to be carried out. At this design point, the ski is placed on the snow at a specific design point edging angle ($\theta_{e_{DP}}$), and the athlete adopts a design point inclination angle ($\theta_{i_{DP}}$). Consequently, the athlete also adopts a design point angulation angle that is defined as: $\theta_{a_{DP}} = \theta_{e_{DP}} - \theta_{i_{DP}}$. The skiing technique of the athlete is defined in INPUTS_User_Params as the instantaneous stance of the athlete at the design point, including: angulation angle, inclination angle, and the tangential position of the athlete loading centroid along the length of the ski. This targeted athlete loading centroid position represents the ideal position along the length of the ski at which the athlete should concentrate his/her weight in order to replicate the conditions under which the design of the ski was optimized. This targeted athlete loading centroid position may be thought of as the "sweet spot" of the ski, as it is the athlete loading centroid position that will yield the best possible carving performance from the ski.

In order to optimize the camber elevation profile of the ski, it may be necessary to define two design control points, each having target values of edging angle and inclination angle. The edging angle and inclination angle at control point 1 are denoted by $\theta_{e_{CP1}}$ and $\theta_{i_{CP1}}$, respectively. Similarly, the edging angle and inclination angle at control point 2 are denoted by $\theta_{e_{CP2}}$ and $\theta_{i_{CP2}}$, respectively. In general, the conditions at control point 2 should be representative of steeper edging and inclination angles than those present at control point 1. As such, the value of $\theta_{e_{CP2}}$ should be greater than the value of $\theta_{e_{CP1}}$, and the value of $\theta_{i_{CP2}}$ should be greater than the value of $\theta_{i_{CP1}}$.

INPUTS_User_Params also includes the weight distribution between the left and right feet of the athlete, which is defined as the fraction of the total athlete loading that is applied to the ski of interest. Under design point conditions, the fraction of the total athlete loading that is applied to the ski of interest is denoted by $w_{fDP}$. Similarly, the fractions of the total athlete loading that are applied to the ski of interest under the conditions of control points 1 and 2 are denoted by $w_{fCP1}$ and $w_{fCP2}$, respectively. The values of $w_{fDP}$, $w_{fCP1}$, and $w_{fCP2}$ are typically set between 0.5 and 1.0, depending upon the type of ski that is to be designed and the skiing technique that is employed by the athlete. For example, a $w_{fDP}$ value of 0.5 would indicate that the athlete is applying equal loads to the left hand and right hand skis; conversely, a $w_{fDP}$ value of 1.0 would indicate that the athlete is applying all loads to the ski of interest, and the other ski is completely unloaded.

Although the camber formulation that is described herein may use two control points, other aspects of the ski design system (such as the flexural stiffness profile) may only use a single design point at which optimization is to be carried out. For simplicity, the conditions present at control point 2 are set equal to those stipulated at the design point; hence, the value of $\theta_{e_{CP2}}$ is set equal to $\theta_{e_{DP}}$, the value of $\theta_{i_{CP2}}$ is set equal to $\theta_{i_{DP}}$, and the value of $w_{fCP2}$ is set equal to $w_{fDP}$. Conversely, the conditions present at control point 1 ($\theta_{e_{CP1}}$, $\theta_{i_{CP1}}$, and $w_{fCP1}$) are explicitly stipulated by the user in INPUTS_User_Params.

INPUTS_User_Params also includes the angle of inclination of the piste ($\theta_P$) upon which the athlete is skiing, wherein said angle is measured between a horizontal plane and the surface of the snow. All of the aforementioned input angles ($\theta_{e_{DP}}$, $\theta_{e_{CP1}}$, $\theta_{e_{CP2}}$, $\theta_{i_{DP}}$, $\theta_{i_{CP1}}$, $\theta_{i_{CP2}}$, and $\theta_P$) are provided as positive values.

INPUTS_User_Params also includes the effective base length, nominal sidecut radius, taper, and minimum width of the ski at the waist.

INPUTS_User_Binding_Params includes the mounting position of the binding system on the ski, the geometry of the ski, the stiffness of the binding interface plate system, and the binding release setting according to Deutsches Institut für Normung e.V. (DIN) standards.

INPUTS_Binding_Params includes user-stipulated parameters pertaining to the boot-binding system that is used to fasten the athlete's feet to the ski. These parameters include positions of the toe and heel anti-friction device (AFD) perches, binding geometry parameters, and parameters that pertain to the load-deflection responses of the various moving parts of the binding system (forward pressure system, toe-cup clamping force, heel-cup clamping force, brake pedal force, etc.). In addition, the user may provide values pertaining to the structural compliance (deflection per unit load) of the toe lug (C_Lug_f) and the heel lug (C_Lug_f) of the boot.

INPUTS_Engineering_Params includes the geometry of the shovel region, the geometry of the tail region, the minimum-permissible thickness of the core of the ski, the tip-rocker (slight reverse-camber within the vicinity of the tip of the ski, sometimes referred to as "early-rise") geometry, and related optimization solution control options and parameters to afford the user with control over the characteristics of the optimization.

INPUTS_Snow_Model includes the parameters and/or coefficients that pertain to a user-stipulated constitutive model of the snow, such as the model presented by Federolf P., Roos M., Lüthi A., Dual J. (2010), *Finite element simulation of the ski-snow interaction of an alpine ski in a carved turn*, Sports Engineering, 12, 123-133, DOI 10.1007/s12283-010-0038-z ("Federolf_et_al_2010"), which is hereby incorporated by reference. In some embodiments, the constitutive snow model includes plasticity during unloading, such as by employing an implementation similar to that presented by Federolf_et_al_2010.

INPUTS_Core_Materials includes the mechanical and physical properties of each material that is employed within the core of the ski. INPUTS_Core_Materials includes user-stipulated orthotropic material models. Each of these orthotropic material models include the following mechanical properties within the local 1-2-3 material coordinate system: elastic modulus parallel to the local 1-axis (E1); elastic modulus parallel to the local 2-axis (E2); elastic modulus parallel to the local 3-axis (E3); shear modulus within the 1-2 plane (G12); shear modulus within the 2-3 plane (G23); shear modulus within the 1-3 plane (G13); Poisson's ratio from the 1-axis to the 2-axis (v12); Poisson's ratio from the 2-axis to the 3-axis (v23); and Poisson's ratio from the 1-axis to the 3-axis (v13). Each of the aforementioned orthotropic mechanical properties may be provided at two temperature control points, thus facilitating linear interpolation of the orthotropic mechanical properties to the relevant conditions under which the ski is to be constructed and optimized. In addition, each material model may include the following physical properties: thermal strain along the local 1-axis, as a function of temperature; thermal strain along the local 2-axis, as a function of temperature; and thermal strain along the local 3-axis, as a function of temperature. The aforementioned physical properties can be used to determine the effective thermal response of each material between any two temperature control points.

INPUTS_Core_Laminate includes the laminate architecture and the stacking sequence of the core of the ski. It is assumed that the core comprises a vertical laminate, wherein the plane of each ply (1-2 plane of the local material coordinate system) is parallel to the longitudinal axis of the ski and is perpendicular to the base surface of the ski. The user defines the material composition, thickness, and orientation (angle between the local 1-axis of the material and the longitudinal axis of the ski) of each ply within the laminate of the core.

INPUTS_Laminate_Materials includes the mechanical and physical properties of each material that is employed in the ski laminate. INPUTS_Laminate_Materials includes user-stipulated orthotropic material models. Each of these orthotropic material models include the following mechanical properties within the local 1-2-3 material coordinate system: elastic modulus parallel to the local 1-axis (E1); elastic modulus parallel to the local 2-axis (E2); shear modulus within the 1-2 plane (G12); shear modulus within the 2-3 plane (G23); shear modulus within the 1-3 plane (G13); and Poisson's ratio from the 1-axis to the 2-axis (v12). Each of the aforementioned orthotropic mechanical properties may be provided at two temperature control points, thus facilitating linear interpolation of the orthotropic mechanical properties to the relevant conditions under which the ski is to be constructed and optimized. In addition, each material model may include the following physical properties: thermal strain along the local 1-axis, as a function of temperature; thermal strain along the local 2-axis, as a function of temperature; and thermal strain along the local 3-axis, as a function of temperature. The aforementioned physical properties can be used to determine the effective thermal response of each material between any two temperature control points.

INPUTS_Laminate_Architecture includes the laminate architecture and the stacking sequence of the ski. It is assumed that the ski comprises a horizontal laminate, wherein the plane of each ply (1-2 plane of the local material coordinate system) is approximately parallel to the base surface of the ski. INPUTS_Laminate_Architecture includes material composition, thickness, and orientation (angle between the local 1-axis of the material and the longitudinal axis of the ski) of each ply within the laminate of the ski, excluding the core material which is defined elsewhere.

INPUTS_Sublaminate_Plies is an optional set of inputs. INPUTS_Sublaminate_Plies enables users to define thin pre-cured laminates that can be included within the overall laminate architecture of the ski. In essence, this optional input file allows the user to pre-define small laminates that will then be amalgamated with the other plies of the global laminate to form the total laminate of the ski.

INPUTS_Solid_Component_Materials includes the mechanical and physical properties of each material that is employed in the ski, other than those materials that are considered to be part of the laminate. INPUTS_Solid_Component_Materials includes user-stipulated orthotropic material models. Each of these orthotropic material models include the following mechanical properties within the local 1-2-3 material coordinate system: elastic modulus parallel to the local 1-axis (E1); elastic modulus parallel to the local 2-axis (E2); shear modulus within the 1-2 plane (G12); shear modulus within the 2-3 plane (G23); shear modulus within the 1-3 plane (G13); and Poisson's ratio from the 1-axis to the 2-axis (v12). Each of the aforementioned orthotropic mechanical properties may be provided at two temperature control points, thus facilitating linear interpolation of the orthotropic mechanical properties to the relevant conditions under which the ski is to be constructed and optimized. In addition, each material model may include the following physical properties: thermal strain along the local 1-axis, as a function of temperature; thermal strain along the local 2-axis, as a function of temperature; and thermal strain along the local 3-axis, as a function of temperature. The aforementioned physical properties can be used to determine the effective thermal response of each material between any two temperature control points.

INPUTS_Solid_Component_Geometry includes the geometry and material composition of solid components that are employed within the construction of the ski, such as: edges, edge anchors (teeth), and sidewalls.

INPUTS_Temperatures includes the user-stipulated cure temperature (TCure) of the ski, as well as three temperature control points: room temperature where the ski is to be built (TBuild), optimization temperature at which the performance of the ski is to be optimized (TOpt), and control temperature (TCont). The cure temperature (TCure) is simply set as the temperature at which the resin within the laminate of the ski is to be cured. The optimization temperature (TOpt) should be set as the temperature at which the user intends the ski to exhibit optimum performance. The control temperature (TCont) should be set as an additional temperature at which the ski will likely see service, but at which optimum performance is not to be expected (typically colder than the optimization temperature); this control temperature should generally be set as the coldest temperature at which the ski is likely to be used.

Cam Rock_Offset is an optional set of inputs. The overall geometry of the camber tooling (mould), when viewed in elevation, is referred to as the "camber mould elevation profile", wherein said elevation profile exists on a plane that is parallel to the longitudinal axis of the ski and perpendicular to the base surface of the ski. The "camber mould curvature profile" defines the curvature of the camber mould elevation profile at any position along the length of the ski, wherein said curvature is measured within a plane that is parallel to the longitudinal axis of the ski and perpendicular to the base surface of the ski. CamRock_Offset is an additional offsetting curvature profile that is added to the analytically determined camber mould curvature profile. For example, CamRock_Offset may be employed if initial manufacturing runs empirically illustrate a need for a modification to the camber mould elevation profile in order to achieve the targeted overall camber and rocker elevation profile of the ski. The need for such an offsetting curvature profile may be caused by residual thermal stresses in some of the constituent materials in the ski, or by other complex sources of processing induced stresses that are not fully captured by the assumptions that are made by system 2000.

Sidecut_Offset is an optional set of inputs. By default, system 2000 will automatically generate a baseline sidecut profile that will theoretically yield a linear snow penetration depth profile. The Sidecut_Offset input file contains a user-stipulated array comprising ordered pairs of tangential positions (measured along the length of the ski) and sidecut offsetting distances; this array serves to modify the sidecut profile from the baseline sidecut profile that is initially assumed by system 2000.

At 2010A, ski design system 2000 calculates the athlete loading on the ski. That is, the ski design system 2000 calculates the component of the total loading that acts perpendicular to the base surface of the ski. For example, the ski design system 2000 may calculate the total loading as follows:

A total load factor is defined as the multiple of the athlete's static self-weight that is imposed upon the skis due to the vector sum of the athlete's weight and the centripetal acceleration, assuming that the athlete is balanced at his/her design point inclination angle ($\theta_{i_{DP}}$) under steady-state turning conditions. Under design point conditions, the total load factor is calculated as:

$$a_{LFtotDP} = \frac{\cos(\theta_P)}{\cos(\theta_{i_{DP}})},$$

where $\theta_P$ is the angle of inclination of the piste (measured between a horizontal plane and the surface of the snow), and $\theta_{i_{DP}}$ is the athlete's inclination angle at the design point. Under design point conditions, the component of the total load factor that acts perpendicular to the base surface of the skis is then calculated as: $a_{LFnDP} = a_{LFtotDP} \cos(\theta_{e_{DP}} - \theta_{i_{DP}})$, where $\theta_{e_{DP}}$ is the edging angle of the ski at the design point.

Combining the aforementioned equations, the component of the total load factor that acts perpendicular to the base surface of the skis is directly calculated as follows:

$$a_{LFnDP} = \frac{\cos(\theta_P)\cos(\theta_{e_{DP}} - \theta_{i_{DP}})}{\cos(\theta_{i_{DP}})}.$$

Similarly, under the conditions of control point 1, the component of the total load factor that acts perpendicular to the base surface of the skis can be calculated as follows:

$$a_{LFnCP1} = \frac{\cos(\theta_P)\cos(\theta_{e_{CP1}} - \theta_{i_{CP1}})}{\cos(\theta_{i_{CP1}})},$$

where $\theta_{e_{CP1}}$ is the edging angle of the ski at control point 1, and $\theta_{i_{CP1}}$ is the athlete's inclination angle at control point 1. Finally, under the conditions of control point 2, the component of the total load factor that acts perpendicular to the base surface of the ski can be calculated as follows:

$$a_{LFnCP2} = \frac{\cos(\theta_P)\cos(\theta_{e_{CP2}} - \theta_{i_{CP2}})}{\cos(\theta_{i_{CP2}})},$$

where $\theta_{e_{CP2}}$ is the edging angle of the ski at control point 2, and $\theta_{i_{CP2}}$ is the athlete's inclination angle at control point 2.

Then, under design point conditions, the component of the total force that acts perpendicular to the base surface of the ski is calculated as: $F_{nDP} = w_{fDP} * m * g * a_{LFnDP}$, where m is the mass of the athlete, g is acceleration due to gravity (approximately 9.807 newtons per kilogram), and $w_{fDP}$ is the fraction of the total athlete loading that is applied to the ski of interest under design point conditions. Similarly, under the conditions of control point 1, the component of the total force that acts perpendicular to the base surface of the ski is calculated as: $F_{nCP1} = w_{fCP1} * m * g * a_{LFnCP1}$, where $w_{fCP1}$ is the fraction of the total athlete loading that is applied to the ski of interest under the conditions of control point 1. Finally, under the conditions of control point 2, the component of the total force that acts perpendicular to the base surface of the ski is calculated as: $F_{nCP2} = w_{fCP2} * m * g * a_{LFnCP2}$, where $w_{fCP2}$ is the fraction of the total athlete loading that is applied to the ski of interest under the conditions of control point 2.

In some embodiments, the user may directly provide values of $F_{nDP}$, $F_{nCP1}$, and/or $F_{nCP2}$ within the INPUTS_User_Params input file; if the user chooses to do so, then these values can simply override any calculated values of $F_{nDP}$, $F_{nCP1}$, and/or $F_{nCP2}$.

At 2010B, the ski design system 2000 discretizes the ski. The ski can be discretized into a finite number of segments over the length of the ski. In some embodiments, at least 300 segments are used for this discretization.

For example, each segment can be represented by a unidimensional beam element that is bound by a pair of nodes (one node at the forward extremity of the element, and one node at the aft extremity of the element). Each beam element and/or node can be assigned a variety of characteristics including, but not limited to: vector position and orientation in space, evaluated and stored at the elevation of the base of the ski and at the elevation of the flexural neutral axis of the ski; tangential position (Xmid) along the length of the ski (having an origin at the mid-base of the ski), evaluated and stored at the elevation of the base of the ski (XmidB) and at the elevation of the flexural neutral axis of the ski (XmidNA); local width of the ski; flexural (bending) stiffness; torsional (twisting) stiffness; camber curvature, evaluated and stored at the elevation of the base of the ski and at the elevation of the flexural neutral axis of the ski; total curvature at the design point, evaluated and stored at the elevation of the base of the ski and at the elevation of the flexural neutral axis of the ski; local relative angle of twist at the design point, initially set to zero and then revised later; and local edging angle (thetaEloc_rel) of the ski.

The example discretization process creates a series of arrays that can be used to store the data pertaining to the various characteristics of each beam element and/or node along the length of the ski. As will be shown in the subsequent descriptions, some of these characteristic arrays can be assigned initial values during the initialization phase of the solution (such as tangential coordinate of each node, width profile, camber curvature profile, and total curvature profile at the design point), but these characteristics may be subject to change as the optimization loop converges upon a design solution. Conversely, some of the characteristic arrays may not be assigned any initial values (such as flexural stiffness, torsional stiffness, and angle of twist), and may simply be given values of zero until the first iteration of the optimization loop has generated enough data to begin populating these arrays.

At 2010C, the ski design system 2000 initializes the local edging angle profile over the length of the ski at the design point. The ski design system 2000 can assume that there is zero torsional deformation at the design point.

For example, an array (thetaEloc_rel_init) can be created in order to store the local edging angle at each node along the length of the ski, while ignoring the effects of any torsional deformations. In order to ensure that the local b orientation vectors point toward the surface of the snow (thus simplifying subsequent calculations), it can be assumed that the ski is optimized in the context of a right hand turn. In the interest of observing right hand rule conventions, each entry in the thetaEloc_rel_init array can be given a negative value having a magnitude that is equal to that of the global edging angle of the ski at the design point ($\theta_{e_{DP}}$).

Continuing with the above example, another array (thetaEloc_rel) can then be defined as that which will store the local edging angle at each node along the length of the ski, while accounting for the effects of torsional deformations. Initially, it is assumed that the ski exhibits zero torsional deformation under design point conditions; as such, the thetaEloc_rel array is initially set equal to the thetaEloc_rel_init array. As the optimization loop of method 2020 converges upon a design solution, the thetaEloc_rel array can be adjusted in order to reflect increasingly accurate assessments of the torsional deformation of the ski. Conversely, the thetaEloc_rel_init array may not be altered from its initial definition.

At 2010D, the ski design system 2000 generates an initial assumption of the total deformed shape of the ski at the design point. Initially, it can be assumed that the ski exhibits zero torsional deformation under design point conditions.

For example, an initial assumed total curvature profile of the ski at the design point can be defined at each X coordinate within the effective base region of the ski (with an assumed origin at the mid-base of the ski), as follows:

$$\emptyset_{TotDP_{init}} = \frac{R_{SC}^2 \cos^2(\theta_{e_{DP}})\sin(\theta_{e_{DP}})}{[R_{SC}^2 \cos^2(\theta_{e_{DP}}) - X^2]^{3/2}} \left[1 + \frac{X^2 \sin^2(\theta_{e_{DP}})}{R_{SC}^2 \cos^2(\theta_{e_{DP}}) - X^2}\right]^{-3/2},$$

where $\theta_{e_{DP}}$ is the edging angle of the ski at the design point (taken as a positive value), and $R_{SC}$ is the user-stipulated nominal sidecut radius of the ski. At the mid-base of the ski (where X=0), the curvature of the aforementioned assumed deformed shape simplifies to the following expression:

$$\emptyset_{TotDP_{init}\,x=0} = \frac{\tan(\theta_{e_{DP}})}{R_{SC}}.$$

The aforementioned equation for $\emptyset_{TotDP_{init}}$ is based upon the assumption that a ski having a constant sidecut radius of $R_{SC}$ would bend into a partial ellipse (elliptical arc) geometry when oriented at an edging angle of $\theta_{e_{DP}}$ and de-cambered onto a flat surface; the expression for $\emptyset_{TotDP_{init}}$ is then derived as the curvature profile of said partial ellipse. Since it has been assumed that the deformed shape of the ski is that of a partial ellipse geometry, it is possible to express this partial ellipse geometry with reference to a local two-dimensional Cartesian coordinate system that lies within a plane that is oriented perpendicular to the base surface of the ski, wherein a local x-axis is oriented parallel to the global X-axis of the ski, a local $z_{TotDP_{init}}$-axis is oriented perpendicular to the local x-axis, and the origin of the coordinate system is positioned on the base surface of the ski at the mid-base position. Recognizing that x and X are equivalent, the geometry of the assumed partial ellipse deformed shape can then be expressed within this local two-dimensional coordinate system, as follows: $z_{TotDP_{init}} = [R_{SC}\cos(\theta_{e_{DP}}) - (R_{SC}^2 \cos^2(\theta_{e_{DP}}) - X^2)^{1/2}]\sin(\theta_{e_{DP}})$.

While the aforementioned expressions for $\emptyset_{TotDP_{init}}$ and $z_{TotDP_{init}}$ are provided in terms of the X coordinate along the length of the ski, it may be more convenient to carry out subsequent calculations in terms of the tangential position (XmidB) along the curvilinear length of the base of the ski. As such, it may be necessary to find the segment length of each element within the assumed partial ellipse geometry, numerically integrate these segment lengths over the length of the partial ellipse geometry to find the tangential position that corresponds to each X coordinate, and then interpolate the tangential coordinates (XmidB) of the ski along the partial ellipse geometry such that values of $\emptyset_{TotDP_{init}}$ and $z_{TotDP_{init}}$ can be assigned to each corresponding tangential coordinate (XmidB) along the length of the base of the ski.

The aforementioned formulation for $\emptyset_{TotDP_{init}}$ is employed because it theoretically results in a snow trace (the geometry of the effective line of contact between the ski and the snow) that exhibits a constant radius (round) geometry. In general, a carved turn is achieved when the forebody of a ski (segment of the ski that is ahead of the mid-base point) cuts a groove (carved groove) in the snow, and the afterbody of the ski (segment of the ski that is behind the mid-base point) deforms to an arced shape such that it can smoothly pass through the carved groove that was created by the forebody of the ski. The radius of the resulting carved turn is approximately equal to the radius of the path that is traced by this carved groove, which is approximately dictated by the average radius of curvature of the snow trace within afterbody region of the ski. As such, in order to carve a smooth turn with minimum drag, the afterbody may adopt a deformed shape that yields a constant radius snow trace geometry. Conversely, the forebody of the ski may adopt a deformed shape having a somewhat smaller radius of curvature in order to keep the tip of the ski above the surface of the snow as the carved groove is being cut. For this reason, the snow trace geometry that is exhibited within the forebody of the ski may differ slightly from the geometry of the carved groove.

Tip-rocker (slight reverse-camber within the vicinity of the tip of the ski, sometimes referred to as "early-rise") may be necessary in order to cut the trench (carved groove) through which the aft regions of the ski will subsequently pass, while simultaneously allowing the aft regions of the ski to adopt a deformed shape that is conducive for achieving a smooth and efficient carved turn. As such, the height of this tip-rocker can be defined as a function of the depth of the carved groove that is to be cut by the ski. In soft snow conditions, a deep carved groove will be cut, thus necessitating a relatively large amount of tip-rocker in order to effectively cut the carved groove without generating undue drag on the shovel of the ski. Conversely, in firm or icy snow conditions, very little tip-rocker is needed because the carved groove will be relatively shallow.

With the aforementioned considerations in mind, professional downhill ski racers may be well advised to bring numerous skis to each race, each with different amounts of tip-rocker. Prior to the race, a series of simple snow-hardness measurements can be taken, and the results of these snow hardness measurements can be used to determine how much tip-rocker is needed, and in turn, which pair of skis should be used for that particular race. The consequences of selecting a non-optimal amount of tip-rocker could be significant. If a pair of race skis having excessive tip-rocker is selected (snow is too firm for the amount of tip-rocker exhibited by the skis), then the athlete will likely find that he/she has insufficient edge engagement in the firm or icy snow conditions, thus resulting in poor grip at steep edging angles. Conversely, if a pair of race skis having insufficient tip-rocker is selected (snow is too soft for the amount of tip-rocker exhibited by the skis), then the skis will not adopt a smooth deformed shape in the snow, and will tend to plow a lot of snow in their shovel regions, thus generating undue drag and lost speed during carved turns.

As described above, the ski design system 2000 may allow the user to stipulate a tip-rocker length ($L_{ER}$) and a maximum tip-rocker curvature ($\emptyset_{MaxER}$). These values can be used to generate a tip-rocker curvature profile ($\emptyset_{TipRock}$) that begins with the value of $\emptyset_{MaxER}$ at the forward-most point within the effective base region of the ski, and linearly reduces to a curvature of zero at a position that is positioned a distance of $L_{ER}$ aft of the forward-most point within the effective base region of the ski, thus yielding an Euler spiral (clothoid) tip-rocker geometry. The value of $\emptyset_{MaxER}$ can also be set to zero at all positions that are positioned a distance greater than $L_{ER}$ aft of the forward-most point within the effective base region of the ski. While some embodiments assume an Euler spiral tip-rocker geometry, other embodiments may utilize alternative tip-rocker geometries (such as a constant radius arc).

Once this tip-rocker geometry is defined, the initial assumed total curvature profile of the ski at the design point can be modified as follows: $\emptyset_{TotDP}=\emptyset_{TotDP_{init}}+\emptyset_{TipRock}$. It should be noted that the user-stipulated tip-rocker ($\emptyset_{TipRock}$) is not employed in a manner that directly modifies the camber elevation profile of the ski; on the contrary, the user-stipulated tip-rocker ($\emptyset_{TipRock}$) is employed to adjust the assumed total curvature profile of the ski at the design point, and then the ski design system 2000 is then tasked with determining how the ski must be designed in order to achieve said total curvature profile under design point conditions.

The aforementioned total curvature profile may be initially assumed to have been created in the absence of the ski exhibiting any torsional deformations. This initial assumed total curvature profile along the base of the ski ($\emptyset_{TotDP}$), which neglects torsional deformations, will herein be referred to as PhiTotalB_NoTwist, and can be stored without change. Conversely, the true total curvature profile along the length of the base of the ski (PhiTotalB) can initially be set equal to PhiTotalB_NoTwist, but may be subject to change as the ski design system 2000 refines the design of the ski and properly accounts for the effects of torsional deformation (thetaEloc_rel). In essence, the assumed PhiTotalB_NoTwist curvature profile, in conjunction with the initial assumption of zero torsional deformation, embodies one of the optimization conditions of ski design system 2000, wherein the optimized ski design is intended to yield a snow trace geometry that is of an approximately constant radius arc under design point conditions. Notwithstanding the foregoing, the introduction of tip-rocker would cause the snow trace geometry to deviate from that of a constant radius arc, and this may be beneficial for reasons discussed elsewhere herein.

It should be noted that the aforementioned formulation for the total curvature profile may only be created within the effective base length of the ski. As such, additional nodes and elements can then be added to represent the shovel and tail regions of the ski, and these regions can be assigned user-stipulated curvatures as necessary to create the upward curving geometries of these features. The nodes that are added to represent the shovel and tail regions of the ski will subsequently be referred to as "shovel nodes" and "tail nodes", respectively. Similarly, the elements that are added to represent the shovel and tail regions of the ski will subsequently be referred to as "shovel elements" and "tail elements", respectively.

At 2010E, the ski design system 2000 establishes an initial assumed camber elevation profile, which is represented by a camber curvature profile.

For example, the initial camber curvature profile (ignoring early-rise and/or rocker) can be determined by invoking a function called "CamProfile" that generates a camber elevation profile based upon the effective base length of the ski, the nominal sidecut radius of the ski, the edging angle at the design point (control point 2), the edging angle at control point 1, the component of the total force that acts normal to the base surface of the ski at the design point (control point 2), and the component of the total force that acts normal to the base surface of the ski at control point 1. The goal of the CamProfile function is to set the camber elevation profile such that a flexural stiffness profile that would yield an ideal deformed shape (perhaps corresponding to an approximately constant radius snow trace profile) at the design point (control point 2) would also yield a nearly ideal deformed shape (perhaps corresponding to an approximately constant radius snow trace profile) at control point 1. This can be achieved by means of the following procedure.

The total curvature at the mid-base of the ski can be evaluated at control point 1 by employing an equation of a similar form to that used for $\emptyset_{TotDP_{init}\ x=0}$, as follows:

$$\emptyset_{TotCP1_{x=0}} = \frac{\tan(\theta_{e_{CP1}})}{R_{SC}},$$

where $\emptyset_{e_{CP1}}$ is the edging angle at control point 1 (taken as a positive value), and $R_{SC}$ is the user-stipulated nominal sidecut radius of the ski. Similarly, the total curvature at the mid-base of the ski can be evaluated at control point 2, as follows:

$$\emptyset_{TotCP2_{x=0}} = \frac{\tan(\theta_{e_{CP2}})}{R_{SC}},$$

where $\emptyset_{e_{CP2}}$ is the edging angle at control point 2 (taken as a positive value).

If it is assumed that all snow loadings (w) are uniformly distributed along the effective base length of the ski at both control points, then it can be assumed that a linear relationship exists between the total curvature at the mid-base of the ski and the total force that acts normal to the base surface of the ski; the slope of this line can be expressed as follows:

$$m_{CP1-2} = \frac{\emptyset_{TotCP2_{x=0}} - \emptyset_{TotCP1_{x=0}}}{F_{nCP2} - F_{nCP1}},$$

where $F_{nCP1}$ is the component of the total force that acts normal to the base surface of the ski at control point 1, and $F_{nCP2}$ is the component of the total force that acts normal to the base surface of the ski at control point 2. Combining the aforementioned equations, the expression for $m_{CP1-2}$ can be rewritten as follows:

$$m_{CP1-2} = \frac{\tan(\theta_{e_{CP2}}) - \tan(\theta_{e_{CP1}})}{R_{SC}[F_{nCP2} - F_{nCP1}]}.$$

Recalling that $m_{CP1-2}$ represents the slope of a linear relationship between the total curvature at the mid-base of the ski and the total force that acts normal to the base surface of the ski, the mid-base curvature that is dictated by this function when the total force that acts normal to the base surface of the ski is equal to zero can be calculated as follows: $b_{CP1-2} = \emptyset_{TotCP1_{x=0}} - m_{CP1-2} * F_{nCP1}$. The goal is to find a camber elevation profile that will ensure that the linear load versus curvature response of the ski passes through the origin as well as both of the two selected control points. As such, the selected camber elevation profile should exhibit a mid-base curvature that is equal to $b_{CP1-2}$.

Substituting the relevant equations into the aforementioned formula for $b_{CP1-2}$, the camber curvature at the mid-base of the ski (where X=0) can be found as follows:

$$\emptyset_{Cam_{x=0}} = \frac{1}{R_{SC}}\left(\tan(\theta_{e_{CP1}}) - \frac{[\tan(\theta_{e_{CP2}}) - \tan(\theta_{e_{CP1}})]F_{nCP1}}{F_{nCP2} - F_{nCP1}}\right).$$

Recalling that control point 2 is equal to the design point, the value of $F_{nCP2}$ can be set equal to $F_{nDP}$. By assuming that the camber elevation profile is of the same form as that assumed in the expression for $\emptyset_{TotDP_{init}}$, the curvature profile of the camber elevation profile at any X coordinate along the length of the effective base region of the ski can then be calculated as:

$$\emptyset_{Cam} = S_{Cam0} \frac{R_{SC}^2 \cos^2(\theta_{Cam})\sin(\theta_{Cam})}{[R_{SC}^2 \cos^2(\theta_{Cam}) - X^2]^{3/2}} \left[1 + \frac{X^2 \sin^2(\theta_{Cam})}{R_{SC}^2 \cos^2(\theta_{Cam}) - X^2}\right]^{-3/2},$$

where $S_{Cam0}$ is taken as +1 if $\emptyset_{Cam_{x=0}}$ is positive and $S_{Cam0}$ is taken as −1 if $\emptyset_{Cam_{x=0}}$ is negative, and where $\theta_{Cam}$ is a non-physical phantom edging angle that is calculated using a rearrangement of a similar equation to that used for $\emptyset_{TotDP_{init_{x=0}}}$, as follows: $\theta_{Cam} = S_{Cam0} \tan^{-1}(R_{SC} \emptyset_{Cam_{x=0}})$.

In most cases, the values of $\emptyset_{Cam_{x=0}}$ and $S_{Cam0}$ will both be negative. While the aforementioned expression for $\theta_{Cam}$ is provided in terms of the X coordinate along the length of the ski, it may be more convenient to carry out subsequent calculations in terms of the tangential position (XmidBcam) along the curvilinear length of the base surface of the ski under camber conditions. As such, it may be necessary to find the segment length of each element within the assumed partial ellipse camber elevation profile, numerically integrate these segment lengths over the length of the partial ellipse geometry to find the tangential position that corresponds to each X coordinate, and then interpolate the tangential coordinates (XmidBcam) of the ski along the partial ellipse geometry such that a camber curvature value ($\emptyset_{Cam}$) can be assigned to each corresponding tangential coordinate (XmidBcam) along the length of the base of the ski.

It should be noted that the aforementioned camber curvature profile may only be created within the effective base region of the ski. As such, the shovel nodes and tail nodes can be assigned user-stipulated curvature values as necessary to create the upward curving geometries of these features. Ultimately, two camber geometries can be found: Cam0 represents the camber elevation profile of the unloaded ski without boots installed in the binding, whereas Cam1 represents the camber elevation profile of the unloaded ski with boots installed in the bindings and accounting for the loads that the boot-binding system imposes upon the ski. Initially, these camber geometries are assumed to be equal, but may be updated later as the ski design system 2000 converges upon an optimized design solution that accounts for the loading that the boot-binding system imposes upon the ski. The user may be given the option to stipulate whether the targeted camber elevation profile is to be achieved with or without boots installed in the bindings. Hence, the user may decide whether the targeted camber elevation profile is to be represented by Cam0 or Cam1.

At 2010F, the ski design system 2000 then initializes the width profile of the ski.

For example, the width profile can be initialized as a function of the assumed deformed shape of the ski at the design point, as well as the user stipulated values of effective base length, taper, and waist width. In this example embodiment, it is assumed that the ski is symmetric about its longitudinal axis; hence, the ski has the same sidecut profile along both of its edges. The ski design system 2000 can calculate a reversed nominal sidecut depth at each tangential coordinate (XmidB) along the length of the base of the ski, as follows:

$$d_{SC\_rev} = \frac{z_{TotDP_{init}}}{\tan(\theta_{e_{DP}})}.$$

An initial unmodified sidecut profile can then be calculated as follows: $d_{SC\_init} = d_{SC\_rev\_Max} - d_{SC\_rev}$, where $d_{SC\_rev\_Max}$ is the maximum value within the $d_{SC\_rev}$ array.

The $d_{SC\_init}$ array represents a sidecut profile that would theoretically result in a uniform (constant) snow penetration depth profile, provided that said ski is loaded at its mid-base point and exhibits the total deformed shape that has been assumed at the design point (said assumed deformed shape corresponding to $\emptyset_{TotDP_{init}}$), wherein said assumed deformed shape does not include any torsional deformation. If said ski were to be loaded at a point that is not aligned with the longitudinal tangential position of its mid-base point, then the snow penetration depth profile would remain quasi-linear, but would become inclined such that it adopts a quasi-constant slope over the length of the ski, thus ensuring that the centroid of the snow loading distribution (snow load profile) remains coincident with the tangential position (measured along the length of the ski) of the athlete loading centroid.

In some cases, it may be desirable to design a ski that exhibits a non-linear snow penetration depth profile at the design point, while still achieving a snow trace (the effective line of contact between the ski and the snow) that exhibits a desired geometry (perhaps an approximately constant radius arc). For example, the user may wish to design a ski that exhibits a W-shaped snow loading distribution (snow load profile) at the design point, wherein the snow loading distribution exhibits local maxima values in the vicinities of the shovel, the tail, and the mid-base regions of the ski. As such, the user may provide an optional input file (Sidecut_Offset) that contains ordered pairs of tangential positions (measured along the length of the ski) and corresponding sidecut offset distances. Upon reading the Sidecut_Offset input file, the ski design system 2000 can then employ a cubic interpolation function to find an array ($d_{SC\_offset}$) that contains the sidecut offset value that corresponds to each tangential coordinate (XmidB) along the length of the ski. A modified sidecut profile is then formulated as follows: $d_{SC\_mod} = d_{SC\_init} + d_{SC\_offset}$.

If the user does not provide a Sidecut_Offset input file, then it is assumed that $d_{SC\_offset}$ is a zero-vector, and the $d_{SC\_mod}$ array is simply set equal to the $d_{SC\_init}$ array. The sidecut profile can then be adjusted such that the minimum sidecut value is equal to zero, as follows: $d_{SC\_0} = d_{SC\_mod} - d_{SC\_mod\_Min}$, where $d_{SC\_mod\_Min}$ is the minimum value within the $d_{SC\_mod}$ array. A taper angle is defined as follows:

$$\theta_{taper} = \tan^{-1}\left(\frac{T}{2\,L_b}\right),$$

where T is the taper of the ski, and $L_b$ is the effective base length of the ski. The $d_{SC\_mod}$ sidecut profile is then rotated about the global Z-axis of the ski, by an angle of $\theta_{taper}$, and a cubic interpolation function is employed to find an array ($d_{SC\_T}$) that contains the rotated (tapered) sidecut profile values that correspond to each tangential coordinate (XmidB) along the length of the ski.

Finally, the overall width profile of the ski can be calculated as follows: $B_{xmidB} = B_W + 2\,(d_{SC\_T\_Max} - d_{SC\_T})$, where $B_{xmidB}$ is the width value at each tangential coordinate (XmidB) along the length of the effective base region of the ski, $B_W$ is the user-stipulated waist width of the ski, and $d_{SC\_T\_Max}$ is the maximum value within the $d_{SC\_T}$ array.

It should be noted that the aforementioned procedure may only generate a width profile within the effective base region of the ski. As such, a function called "ShovelTailWidths" can be invoked in order to assign local width profiles to the shovel nodes and tail nodes such that the planform geometries of these regions satisfy the geometric relationships that were stipulated by the user.

At 2010G, the ski design system 2000 calculates mechanical and physical properties of each constituent material in the ski at each of the temperature control points.

For example, at each temperature control point, the ski design system 2000 can employ a linear interpolation function to find the mechanical properties of each material at the relevant temperature control point. The ski design system 2000 can calculate the change in temperature from the cure temperature to the relevant temperature control point, and calculate a secant Coefficient of Linear Thermal Expansion ("CLTE") between the cure temperature and the relevant temperature control point. This calculation may use a detailed thermal strain versus temperature response that envelops the relevant temperature range.

For example, suppose the user provides the elastic modulus of a material in the 1 direction at a temperature of 295 kelvins ($E1_{295}$) and at a temperature 253 kelvins ($E1_{253}$), and provides the thermal strain versus temperature response of that same material between 333 kelvins and 250 kelvins. Suppose also that the user has stipulated that the ski is to be cured at a temperature of 320 kelvins, and is to be optimized for use at a temperature of 265 kelvins. The elastic modulus of the material in the 1 direction at the optimization temperature of 265 kelvins is then approximated as:

$$E1_{265} = E1_{253} + (E1_{295} - E1_{253})\frac{(265-253)}{(295-253)}.$$

The secant CLTE that is to be used between the cure temperature and the optimization temperature is calculated as:

$$\alpha_{265-320} = \frac{(\varepsilon_{320} - \varepsilon_{265})}{(320-265)},$$

where $\varepsilon_{320}$ is the thermal strain taken from the thermal strain versus temperature response at the cure temperature (320 kelvins), and $\varepsilon_{265}$ is the thermal strain taken from the thermal strain versus temperature response at the optimization temperature (265 kelvins).

Because of the nonlinear nature of most thermal strain versus temperature responses that cover a broad temperature range, the use of this secant CLTE value may be restricted to calculating thermal expansions between the two specific temperatures that were used for the calculation of the secant CLTE (in this case, between 320 kelvins and 265 kelvins). For example, use of the aforementioned $\alpha_{265-320}$ CLTE value to find the thermal expansion caused by a temperature change from 320 kelvins to 280 kelvins could yield erroneous results.

By implementing a collection of secant CLTE values for each material within the laminate of the ski, the ski design system 2000 is able to employ Classical Laminated Plate Theory (see Jones R. M., (1975), *Mechanics of composite materials*, Hemisphere Publishing Corporation, New York, N.Y., USA ("Jones_1975"), and/or Mallick P. K., (2008), *Fiber-Reinforced Composites: Materials, Manufacturing, and Design*, CRC Press—Taylor and Francis Group, Boca Raton, Fla., USA, 3rd edition, ISBN 978-0-8493-4205-9 ("Mallick_2008"), each of which is hereby incorporated by reference) for the calculation of thermal strains and thermal curvatures of the full ski laminate, irrespective of the possibility that one or more of the materials in the laminate may exhibit a nonlinear thermal strain versus temperature response.

At 2010H, the ski design system 2000 establishes a relationship between core thickness, ski width, and flexural stiffness at the optimization temperature control point.

Figure 11:
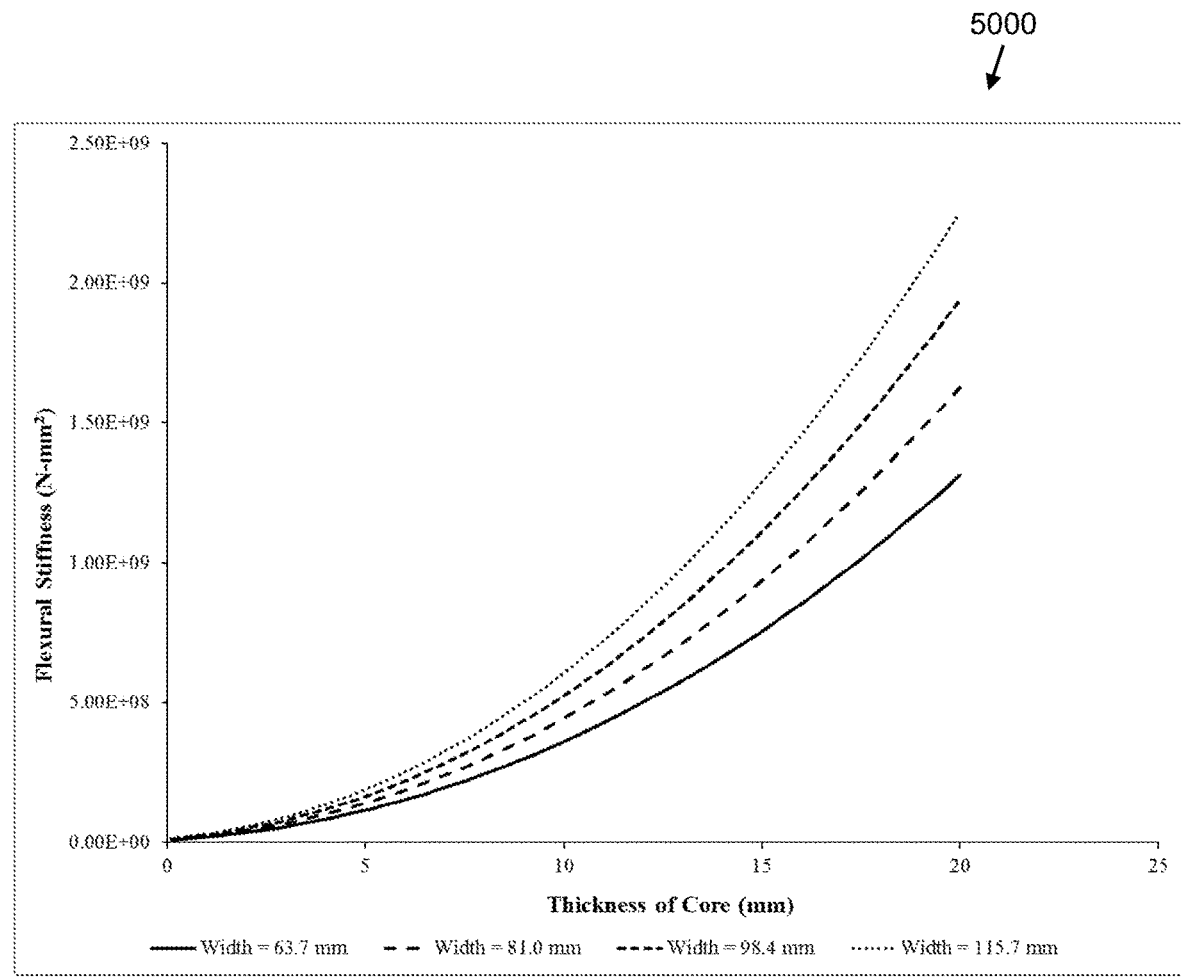
FIG. 11 shows a graph illustrating an example relationship between flexural stiffness, core thickness, and width, in accordance with an example embodiment.

For example, the ski design system 2000 can loop over a range of possible ski widths and core thicknesses; each combination of ski width and core thickness can be processed and evaluated by a function called "EI_JG" in order to determine the flexural and torsional stiffnesses that would result from the given combination of ski width and core thickness, in light of the stipulated material composition and laminate architecture of the ski. Once the EI_JG function has assessed the flexural and torsional stiffness values that correspond to each combination of ski width and core thickness, a series of response curves can be generated such that the ski design system 2000 can later interpolate between these curves in order to determine what core thickness would be required in order to achieve a targeted flexural stiffness for a given ski width. FIG. 11 shows an example plot 5000 illustrating examples of these response curves.

The EI_JG function can be invoked for the purpose of determining the local flexural stiffness and local torsional stiffness that would result from a given combination of ski width and core thickness, in light of the stipulated material composition and laminate architecture of the ski. The EI_JG function performs laminate stiffness calculations in accordance with Classical Laminated Plate Theory, which is described in many reference books, including Jones R. M., (1975), *Mechanics of composite materials*, Hemisphere Publishing Corporation, New York, N.Y., USA ("Jones_1975"), and Mallick P. K., (2008), *Fiber-Reinforced Composites: Materials, Manufacturing, and Design*, CRC Press—Taylor and Francis Group, Boca Raton, Fla., USA, 3rd edition, ISBN 978-0-8493-4205-9 ("Mallick_2008"), each of which is hereby incorporated by reference.

The EI_JG function adds the effects of solid components that are not part of the laminate (such as edges and sidewalls) by employing the method presented by Clifton P., (2011), *Investigation and customisation of snowboard performance characteristics for different riding styles*, Doctor of Philosophy (PhD), Aerospace, Mechanical and Manufacturing Engineering, RMIT University ("Clifton_2011") and Brennan S., (2003), *Modeling the mechanical characteristics and on-snow performance of snowboards*, Doctor of Philosophy (PhD), Department of Aeronautics and Astronautics, Stanford University. ("Brennan_2003"), each of which is hereby incorporated by reference.

The EI_JG function modifies torsional stiffness using the model presented by Honickman H., Johrendt J., and Frise P., (2014), *On the torsional stiffness of thick laminated plates*, Journal of Composite Materials, 48(21): 2639-2655, DOI: 10.1177/0021998313501919 ("Honickman_et_al_2014"), which is hereby incorporated by reference.

In addition, the EI_JG function also carries out a secondary calculation of torsional stiffness by treating the ski as a closed thin-walled tube (torsion-box) comprising a lower skin (base and lower reinforcing plies), an upper skin (topsheet and upper reinforcing plies), and two sidewalls, and assuming that torsional stiffness is achieved as a result of the generation of shear flow at the median-line (midplane) of each of these thin shell elements, as described in many reference books, including Budynas R. G., (1999), *Advanced Strength and Applied Stress Analysis*, McGraw-Hill, The McGraw-Hill Companies, New York, N.Y., USA, $2^{nd}$ Edition, ISBN 978-0-07-008985-3 ("Budynas_1999"), which is hereby incorporated by reference.

The EI_JG function then compares the two aforementioned torsional stiffness values (that which was calculated in accordance with Honickman_et_al_2014 and that which was calculated in accordance with closed thin-walled tube theory), and the greater of those two values is stored as that which will serve to represent the local torsional stiffness of the ski.

It is important to note that the aforementioned methodology that is employed by the EI_JG function is not intended to be restrictive. The purpose of the EI_JG function is to determine the local flexural stiffness and local torsional stiffness that would result from a given combination of ski width and core thickness, in light of the stipulated material composition and laminate architecture of the ski; however, some embodiments may employ a multitude of alternative analytical and/or computational methods in order to achieve that same purpose. In fact, some of such alternative analytical and/or computational methods may yield more accurate results than the aforementioned methods employed herein. For example, some alternative embodiments of the EI_JG function could employ the Variational Asymptotic Method (VAM) to calculate the local section constants (such as flexural stiffness and torsional stiffness), as described in numerous publications, such as: Cesnik C, Hodges D, and Sutyrin V, (1996) *Cross-sectional analysis of composite beams including large initial twist and curvature effects*, AIAA Journal, 34(9): 1913-1920, DOI: 10.2514/3.13325 ("Cesnik_et_al_1996"), Cesnik C and Hodges D, (1997) *VABS: A New Concept for Composite Rotor Blade Cross-Sectional Modeling*, Journal of the American Helicopter Society, 42(1): 27-38, DOI: 10.4050/JAHS.42.27 ("Cesnik_and_Hodges_1997"), and Yu W, Volovoi V, Hodges D, and Hong X, (2002) *Validation of the variational asymptotic beam sectional analysis (VABS)*, AIAA Journal, 40(10): 2105-2113, DOI: 10.2514/2.1545 ("Yu_et_al_2002"), each of which is hereby incorporated by reference.

At 2010I, the ski design system 2000 initializes the assumed total curvature profile at the flexural neutral axis (PhiTotalNA), and the various camber curvature profiles at the flexural neutral axis (PhiCamRock0NA, PhiCam0NA, PhiCamRock1NA, PhiCam1NA). For example, the ski design system 200 can invoke a function called "PhiZOffset".

At 2010I, the ski design system 2000 also initializes the assumed tangential coordinate system at the flexural neutral axis (XmidNA). For example, the ski design system can invoke a function called "XmidZOffset". The elevation offset between the base of the ski and the flexural neutral axis of the ski can be initially assumed to be zero, since the laminate thickness has not yet been defined.

The PhiZOffset function can be invoked for the purpose of offsetting a known curvature profile to another elevation within the thickness of the ski. For example, if a curvature profile is known along the base of the ski (PhiB), and the elevation of the flexural neutral axis relative to the base of the ski is known at every tangential position along the length of the ski (Z_NA), then the PhiZOffset function could be used to determine the corresponding curvature profile at the elevation of the flexural neutral axis of the ski (PhiNA).

At each tangential position along the length of the ski, the PhiZOffset function calculates the radius of curvature at the initial elevation ($R_{Phi1}$) as the reciprocal of the curvature at the initial elevation (Phi1). The radius of curvature at the new offset elevation ($R_{Phi2}$) is then calculated as: $R_{Phi2}=R_{Phi1}-Z_{21}$, where $Z_{21}$ is the difference between the new elevation and the initial elevation. The curvature at the new offset elevation (Phi2) is then taken as the reciprocal of $R_{Phi2}$. In cases where the absolute value of Phi1 is very small (close to zero), the value of Phi2 is simply taken as being equal to Phi1. The aforementioned procedure is carried out at every tangential position along the length of the ski in order to find the entire curvature profile at the new offset elevation.

The XmidZOffset function can be invoked for the purpose of offsetting a tangential coordinate system (Xmid) to another elevation within the thickness of the ski. For example, if a tangential coordinate system is defined along the base of the ski (XmidB), the curvature profile is known along the base of the ski (PhiB), and the elevation of the flexural neutral axis relative to the base of the ski is known at every tangential position along the length of the ski (Z_NA), then the XmidZOffset function could be used to determine the corresponding tangential coordinate system that exists at the elevation of the flexural neutral axis of the ski (XmidNA).

At each node along the length of the ski, the XmidZOffset function finds a second node that is adjacent node of interest, but is closer than the node of interest to the mid-base of the ski; the XmidZOffset function then calculates how the tangential distance between these two adjacent nodes will change at the new offset elevation. First, the tangential distance between these nodes (dXmid1) is calculated at the initial elevation. The average of the curvatures at the two nodes is then calculated at the initial elevation (PhiAvg1). The average of the radii of curvature at the two nodes ($R_{PhiAvg1}$) at the initial elevation is then calculated as the reciprocal of PhiAvg1. The average of the elevation offset values at the two nodes is also calculated ($Z_{21Avg}$). The distance between the two nodes at the new offset elevation (dXmid2) is then calculate as:

$$dXmid2 = \frac{dXmid1(R_{PhiAvg1} - Z_{21Avg})}{R_{PhiAvg1}}.$$

In cases where the absolute value of PhiAvg1 is very small (close to zero), the value of dXmid2 is simply taken as being equal to dXmid1. Starting at the mid-base of the ski and propagating outwards in both directions, the tangential coordinate system at the offset elevation is then calculated by summing the relevant values of dXmid2 over the length of the ski.

Some calculations that are carried out by the ski design system 2000 may require a geometric representation of the base surface of the ski. Conversely, some calculations that are carried out by the ski design system 2000 may require a geometric representation of the curvilinear surface that passes through the flexural neutral axis of the ski at each tangential position along its length. As such, the ski design system 2000 can utilize the PhiZOffset function and the XmidZOffset function in order to facilitate conversions between geometric representations of the ski at these two different elevations within its thickness.

Operations that are carried out at the elevation of the base surface of the ski generally include: formulation of the initially assumed total deformed shape of the ski at the design point (ignoring torsional deformation); formulation of the initially assumed camber elevation profile; and calculations pertaining to the snow penetration depth profile, snow pressures, and snow loadings. Conversely, operations that are carried out at the elevation of the flexural neutral axis of the ski generally include: any calculations that involve addition and/or subtraction of various curvature values (such as camber curvatures, flexural curvatures, rocker curvatures, and/or total curvatures); calculation of bending moment profiles and/or torsion moment profiles based upon applied loadings; calculations that involve the relationship between local flexural curvatures, local bending moments, and local flexural stiffnesses; and calculations that involve the relationship between local rates of twist, local torsion moments, and local torsional stiffnesses.

Strictly speaking, it may be more accurate to employ a third elevation corresponding to a torsion axis (shear centre) of the ski when carrying out calculations pertaining to torsion. For most ski construction architectures, the elevation of the torsion axis (shear centre) will likely be very close to the elevation of the flexural neutral axis; as such, the present example embodiment discussed herein assumes that the torsion axis of the ski is located at the elevation of the flexural neutral axis.

At 2010J, the ski design system 2000 initializes the geometry of the boot-binding system.

For example, the ski design system 2000 can first calculate the three-dimensional geometry of the Cam1 camber elevation profile of the ski. For example, the ski design system 2000 can invoke a function called "CurveTwist2Shape" with PhiB set equal to the camber curvature profile and with thetaT set equal to thetaEloc_re-1_init. The CurveTwist2Shape function then returns the global (X, Y, and Z) coordinates and the v, b, and n orientation vectors of each node along the length of the base surface of the discretized ski when it exhibits the Cam1 camber elevation profile. Similar corresponding sets of global (X, Y, and Z) coordinates and v, b, and n orientation vectors are calculated at the flexural neutral axis of the ski, as well as along the edge of the ski that is currently engaged with the snow.

The CurveTwist2Shape function can be invoked for the purpose of determining the three-dimensional geometry of the ski as a function of the curvature profile along the base of the ski (PhiB) and the torsion angle profile (thetaT) over the length of the ski. This geometry is calculated by assuming that each beam element adopts a helical shape that is defined as a function of the local curvature and the local rate of twist exhibited by that element. The overall geometry of the ski is then found by assuming a datum at the centre of the ski's effective base region (the mid-base point), and propagating outwards from this datum, one element at a time, following the helical geometry of each element.

Within each element, the helical geometry is defined as follows. Each element is bound by two nodes: one at its forward extremity and one at its rearward extremity. The bounding node that is closer to the mid-base of the ski will be referred to as the inside node, whereas the bounding node that is more distant from the mid-base of the ski will be referred to as the outside node. Each node corresponds to a tangential position (XmidB) along the length of the base of the ski, and the position of each node is expressed in terms of its global (X, Y, and Z) coordinates. The orientation of the base surface of the ski at each node is represented by three orthogonal direction vectors (orientation vectors) of unit length: the v vector is oriented tangential to the longitudinal curvilinear tangential axis of the ski (parallel to the local base contour of the ski), and points rearward; the n vector is perpendicular to the base surface of the ski, and points in the direction that is opposite the snow (generally upwards); and the b vector is perpendicular to both the v and n vectors, and points toward the right hand side of the ski.

The total arc length of each helical segment ($s_h$) is defined as the difference between the tangential coordinates (XmidB) of the nodes at each end of the element of interest. The curvature of the element of interest (kappa_loc) is taken as the mean of the local curvatures (PhiB) found at the nodes at each end of the element. The rate of twist of the element of interest (tau_loc) is taken as the difference between the local torsion angles (thetaT) found at the nodes at each end of the element divided by the arc length ($s_h$) of the element. The helical geometry is defined as having an $r_h$ coefficient that represents the radius of the cylindrical shell upon which the helical path exists. The helical geometry is also defined as having a $c_h$ coefficient, where $2\pi c_h$ represents the pitch of the helix ($\pi \approx 3.1416$), and where pitch is defined as the distance between two adjacent loops of the helix measured parallel to the helix axis (the central axis about which the helix path curves).

The coefficients $c_h$ and $r_h$ can be related to kappa_loc and tau_loc as follows:

$$\frac{c_h}{r_h} = \frac{\text{tau\_loc}}{\text{kappa\_loc}}.$$

The rate of twist of the helical segment (tau_loc) can be related to the $c_h$ and $r_h$ coefficients as follows:

$$\text{tau\_loc} = \frac{c_h}{r_h^2 + c_h^2}.$$

Combining the previous two expressions, the radius of the helical path ($r_h$) can be found as follows:

$$r_h = \frac{1}{\text{kappa\_loc}\left(1 + \left(\frac{\text{tau\_loc}}{\text{kappa\_loc}}\right)^2\right)},$$

where the value of $r_h$ is always taken as positive. Similarly, the $c_h$ coefficient of the helix can be found as follows:

$$c_h = \frac{1}{\text{tau\_loc}\left(1 + \left(\frac{\text{kappa\_loc}}{\text{tau\_loc}}\right)^2\right)},$$

where the value of $c_h$ is taken as zero when tau_loc is zero.

The inclination angle of the helical path can then be found as:

$$A_h = \tan^{-1}\left(S_{kappa}\frac{c_h}{r_h}\right),$$

where $S_{kappa}$ is taken as +1 if kappa_loc is positive and $S_{kappa}$ is taken as −1 if kappa_loc is negative. In the case of zero torsion, the value of $A_h$ would be zero and the helical path would simplify to a circular path. The angle of propagation through which the present element wraps around the helix axis can now be found as:

$$\theta_h = -S_{kappa}\frac{s_h}{(r_h^2 + c_h^2)^{1/2}}.$$

A vector ($j_h$) that represents the orientation of the helix axis is found by rotating the b vector at the inside node of the element about the n vector at the inside node of the element, where said rotation angle is equal to $A_h$. A vector ($i_h$) is defined as one that is perpendicular to $j_h$ and tangential to the surface of the cylindrical shell upon which the helical path exists, at the position of the inside node; this $i_h$ vector is found by rotating the v vector at the inside node of the element about the n vector at the inside node of the element, where said rotation angle is equal to $A_h$. A vector ($k_h$) that is perpendicular to the base surface of the ski (thus pointing toward the helix axis) at the position of the inside node of the element is simply taken as being equal to the n vector at the inside node of the element. Each of the $i_h$, $j_h$, and $k_h$ vectors are then converted into unit vectors.

The magnitude of the displacement from the inside node of the element to the outside node of the element along the directions of each of the $i_h$, $j_h$, and $k_h$ vectors can be calculated as follows. The magnitude of the displacement along the $i_h$ vector is calculated as $d_{ih}=S_{sh}(|r_h \sin(\theta_h)|)$, where $S_{sh}$ is taken as +1 if $s_h$ is positive and $S_{sh}$ is taken as −1 if $s_h$ is negative. The magnitude of the displacement along the $j_h$ vector is calculated as $d_{jh}=c_h\theta_h$. The magnitude of the displacement along the $k_h$ vector is calculated as: $d_{kh}=S_{kappa}(|r_h-r_h \cos(\theta_h)|)$. The vector distance from the inside node of the element to the outside node of the element is then calculated as follows: $dXYZ=d_{ih} i_h+d_{jh}j_h+d_{kh} k_h$.

The global (X, Y, and Z) coordinates of the outside node of the element are then found by adding dXYZ to the global (X, Y, and Z) coordinates of the inside node of the element. The v vector of the outside node of the element is found by rotating the v vector of the inside node of the element about $j_h$ by an angle of $\theta_h$. The b vector of the outside node of the element is found by rotating the b vector of the inside node of the element about $j_h$ by an angle of $\theta_h$. The n vector of the outside node of the element is found by rotating the n vector of the inside node of the element about $j_h$ by an angle of $\theta_h$.

The global (X, Y, and Z) coordinates of the outside node of the element are then adjusted slightly in order to account for the fact that torsional deformations act about the torsion axis (shear centre) of the ski's cross section, rather than at the elevation of the base of the ski. This adjustment is made by: finding an offset vector (denoted by "NA_arm") that is defined as the negative of the elevation of the torsion axis (measured relative to the base surface of the ski) multiplied by the local n vector at the position of the outside node; rotating said NA_arm vector about the local v vector at the outside node by the negative of the local angle of twist of the element, wherein said local angle of twist is calculated as the product of tau_loc and $s_h$; subtracting the resulting rotated vector from the original NA_arm vector in order to find a new vector (denoted by "dXYZ_NA_arm") that represents the negative of the displacement exhibited by the tip of the NA_arm vector during said rotation; and adding this dXYZ_NA_arm vector to the previously calculated global (X, Y, and Z) coordinates of the outside node of interest. Recall that the present example embodiment discussed herein assumes that the torsion axis of the ski is located at the elevation of the flexural neutral axis of the ski.

Ultimately, for each node along the length of the ski, the global (X, Y, and Z) coordinates and the v, b, and n orientation vectors are found by beginning at the mid-base of the ski and propagating outwards, element by element, in accordance with the aforementioned procedure. The CurveTwist2Shape function then returns the global (X, Y, and Z) coordinates and the v, b, and n orientation vectors of each node along the length of the base of the discretized ski.

Once the CurveTwist2Shape function has returned the aforementioned data, the ski design system 2000 can utilize the known geometry of the base of the ski to calculate an equivalent corresponding geometry at the elevation of the flexural neutral axis of the ski, as well as an equivalent corresponding geometry at the position of the edge of the ski that is currently engaged with the snow.

These geometries are determined by simply offsetting the global (X, Y, and Z) coordinates of the base nodes of the ski by known distances along the relevant local orientation vector (n vector for offsetting from the elevation of the base surface to the elevation of the flexural neutral axis, or b vector for offsetting laterally to the position of the edge). At each of these offset nodes, the revised b orientation vector ($b_{os}$) remains unchanged, and is simply set equal to b. The revised n orientation vector ($n_{os}$) is then found at each of the offset nodes by fitting a vector between the global (X, Y, and Z) coordinates of the adjacent nodes (forward and aft of the node of interest) such that the resulting vector points rearward, converting this vector to a unit vector, and calculating the cross product of this unit vector and the local $b_{os}$ orientation vector. The revised v orientation vector ($v_{os}$) is then calculated at each of the offset nodes as the cross product of the local $b_{os}$ and $n_{os}$ orientation vectors.

It is important to note that the aforementioned method that is employed by the CurveTwist2Shape function is not intended to be restrictive. The purpose of the CurveTwist2Shape function is to determine the three-dimensional geometry of the ski as a function of the curvature profile along the base of the ski and the torsion angle profile over the length of the ski; however, some embodiments may employ a multitude of alternative analytical and/or computational methods in order to achieve that same purpose. Notwithstanding the foregoing, the CurveTwist2Shape function includes analytical and/or computational methods that are conducive for analyses of large deformations that may embody geometric non-linearities.

The ski design system 2000 may then establish boot-binding loading pads. For example, the ski design system 2000 can invoke a function called "LoadingPads".

The LoadingPads function assumes that the ski features two boot-binding pad regions: one beneath the toe-cup of the binding, and one beneath the heel-cup of the binding. These pad regions do not necessarily have a physical manifestation on the actual ski, but will serve as loading regions where all of the binding loads will be analytically applied to the ski model. Most on-piste carving skis and race skis feature a binding interface plate between the upper surface of the ski and the binding system. Since all binding loads are applied to the ski through such a binding interface plate, it is reasonable to define the geometry of the pad regions in a manner that observes the probable loading environment between the binding interface plate and the ski.

For example, most modern binding interface plates for race skis are one-piece polymeric bars that are long enough to serve as mounting surfaces for both the toe-cup and heel-cup of the binding system; however, these plates typically feature provisions to ensure that there is adequate flexural (bending) compliance between the mounting points of the toe-cup and heel-cup (a flex element). As such, it is logical to define the front boot-binding pad region as being positioned within the footprint of the region of the binding interface plate that is ahead of the flex element, and to define the rear boot-binding pad region as being positioned within the footprint of the region of the binding interface plate that is aft of the flex element. Alternatively, some other types of binding interface systems are discretized into two separate plates: one plate is positioned beneath the toe-cup of the binding, and another plate is positioned beneath the heel-cup of the binding. In the case of such a two-piece binding interface system, it would be logical to define the front boot-binding pad region as being positioned within the footprint of the front binding interface plate, and to define the rear boot-binding pad region as being positioned within the footprint of the rear binding interface plate.

Each pad region is characterized by a straight line (pad line) that is drawn between the nodes that are nearest the forward-most and aft-most extremities of the relevant pad region on the ski. The coordinates of each node of the ski that resides within the pad region is then projected onto this pad line in order to establish surrogate nodes that reside on the pad line. Similarly, a new set of $v_{pad}$, $b_{pad}$, and $n_{pad}$ orientation vectors is created at each node along the length of the pad region, wherein the $v_{pad}$ vector is parallel to the pad line, the $b_{pad}$ vector is equal to the b vector, and the $n_{pad}$ vector is calculated as the cross product of the $v_{pad}$ and $b_{pad}$ vectors. Since the position of the nodes on each pad line is dependent upon the deformed or non-deformed geometry of the ski, it may be necessary to establish the boot-binding pad regions of the ski under both cambered and loaded (design point) conditions, and it may be necessary to update these boot-binding pad regions at each iteration of the optimization loop.

The ski design system 2000 can then initialize the positions of each component of the boot-binding system, measured with respect to a common datum. For the convenience of the user, the INPUTS_Binding_Params input file can provide the relative positions of the various binding components with respect to various reference points within the binding interface plate 4200, the ski 3000, and the boot-binding system 4000. In light of these relative positions, it may be possible to recalculate some of the initial binding component positions with respect to the elevation of the upper surface of the binding interface plate and the tangential coordinate system along the base of the ski (XmidB).

The ski design system 2000 can then initialize the geometry of the various components of the binding and plate system under initial camber conditions.

For example, the ski design system 2000 can begin by calculating the initial assumed length of the toe-heel link of the binding system, as it is assumed that the Cam1 condition represents the circumstances under which the forward pressure system is set to its targeted initial preload value. The length of the toe-heel link is calculated as the linear distance between the mounting points of the toe-cup and heel-cup systems with the ski geometry set to that of the Cam1 camber elevation profile. The ski design system 2000 can then proceed with invoking a function called "BindingGeometry" with the ski geometry set to that of the Cam1 camber elevation profile, and with the values of dZ_Cup_f and dZ_Cup_r initially set to zero. It is initially assumed that the ski adopts its targeted camber elevation profile regardless of whether or not a boot is installed in the binding; hence, Cam1 and Cam0 are initially identical.

The BindingGeometry function can be invoked for the purpose of determining the geometric configuration that is adopted by the various components of the binding and plate system as a function of the ski geometry under specifically stipulated conditions (cambered or deformed), as follows.

The INPUTS_Binding_Params input file provides the information necessary to calculate the tangential coordinate along the base of the ski (XmidB) at which each of the following binding components and/or loading points is positioned: the mounting point of the toe-cup, the mounting point of the heel track, the position at which the toe-cup clamping force 4227 ($F_{Cup\_f}$) is applied, the position at which the toe-cup forward pressure force 4225 ($F_{FP\_f}$) is applied, the position of the toe-cup pivot axis 4210, the position at which the front (toe) AFD perch force 4235 ($F_{AFD\_f}$) is applied, the position at which the rear (heel) AFD perch force 4255 ($F_{AFD\_r}$) is applied, and the position at which the brake pedal force 4245 ($F_{BP}$) is applied. The INPUTS_Binding_Params input file also provides the information necessary to calculate the relative elevation at which many of the binding components are mounted, measured with respect to the base of the ski, including: the position of the toe-cup pivot axis, the position of the heel-cup pivot axis, the position at which the front (toe) AFD perch force 4235 ($F_{AFD\_f}$) is applied, and the position at which the rear (heel) AFD perch force 4255 ($F_{AFD\_r}$) is applied. The global (X, Y, and Z) coordinates of each of the aforementioned points is then found by finding the global (X, Y, and Z) coordinates that correspond to the tangential position of each of these points along the length of the base of the ski, and then adding the product of the local n vector and the elevation of these points measured with respect to the base of the ski. The INPUTS_Binding_Params input file also provides the length of the boot sole, the thickness of the toe lug of the boot, and the thickness of the heel lug of the boot.

It is initially assumed that the ski boot is rigid. As such, a vector (vSole) is drawn between the front and rear AFD perches; this vector represents the flat surface of the sole 4140 of the boot 4100. Another vector that represents the normal to the sole of the boot (nSole) is created by taking the cross product of vSole and the mean of the b vectors at each of the front and rear AFD perches. Using the known boot sole orientation and the known boot lug thicknesses, the BindingGeometry function then calculates the remaining unknown global (X, Y, and Z) coordinates of each of the load application points of the binding ($F_{Cup\_f}$, $F_{Cup\_r}$, $F_{FP\_f}$, $F_{FP\_r}$, $F_{BP}$); however, this calculation is carried out under the assumption that the boot sole is rigid.

Since boot soles are typically made from polymers that are quite structurally compliant (soft), it is necessary to account for the deformation of the boot lugs under the toe-cup and heel-cup clamping forces. As such, lug deflection vectors are defined at the toe lug 4120 (dZ_Cup_f) and heel lug 4160 (dZ_Cup_r) of the boot, wherein both of these deflections are assumed to be parallel to the nSole vector, and act downward toward the snow. These lug deflection vectors are added to the corresponding application points of the $F_{Cup\_f}$, $F_{Cup\_r}$, $F_{FP\_f}$, and $F_{FP\_r}$ forces. The values of dZ_Cup_f and dZ_Cup_r are calculated outside of the BindingGeometry function; hence, the BindingGeometry function simply uses these values and assumes them to be accurate.

Once the positions of the $F_{Cup\_f}$, $F_{Cup\_r}$, $F_{FP\_f}$, and $F_{FP\_r}$ force application points have been found, the BindingGeometry function then calculates the global (X, Y, and Z) coordinates of the heel-cup pivot axis 4270 as a function of the known global (X, Y, and Z) coordinates of the heel lug 4160, the known elevation of the heel-cup pivot axis 4270 above the base of the ski 3000, and the known geometry of the heel-cup 4260 (as provided in the INPUTS_Binding_Params input file). With the position of the heel-cup pivot axis 4270 now known, the BindingGeometry function is able to calculate the position of the heel carriage 4280 within its heel track 4290.

The BindingGeometry function ultimately stores and returns all of the aforementioned geometric data pertaining to the boot-bindings system. The distance between the nominal mounting point of the heel track and the true mounting point of the forward pressure spring (dXYZ_Mount_r) is then calculated as a function of the present geometry (deformed or non-deformed) of the ski and the length of the toe-heel link. If the present binding system does not include a toe-heel link, but it is used in conjunction with a one-piece binding interface plate (wherein both the toe-cup and heel-cup of the binding system are mounted to a common plate), then said binding interface plate may itself be modeled to function as a toe-heel link for the binding system. Conversely, in the event that the present binding system does not include a toe-heel link and is not used in conjunction with a one-piece binding interface plate, then the value of dXYZ_Mount_r is set to zero. The effective position of the mounting point of the forward pressure spring (XYZ_CupMount_r) is then calculated as the sum of dXYZ_Mount_r and the global (X, Y, and Z) coordinates of the nominal mounting point of the heel track 4290.

At 2020, the ski design system 2000 then begins running an optimization loop, and iteratively repeats this loop until convergence is achieved. As depicted in FIG. 13, method 2020 can be summarized by the following iteratively repeated sequence of operations: 2020A calculate the three dimensional deformed shape of the ski at the design point, assuming the most recently calculated profiles of total curvature and torsional deformation; 2020B calculate the snow loading distribution (snow load profile); 2020C calculate the binding geometry and binding loads at the design point; 2020D calculate the bending moment profile, torsion moment profile, flexural curvature profile, and torsion angle profile at the design point; 2020E update the camber elevation profile of the unloaded ski, accounting for the influence of the boot-binding system; 2020F calculate the required flexural stiffness profile, as necessary to achieve the desired total curvature profile under the calculated loading environment; 2020G calculate the required core thickness profile, and make adjustments, as necessary, to address practical considerations; 2020H calculate the actual flexural stiffness and torsional stiffness profiles of the ski, in light of the core thickness profile and user-stipulated laminate architecture; 2020I adjust the camber curvature profile, as necessary, in order to compensate for regions that exhibit sub-optimal flexural stiffness, wherein said adjustments will typically constitute the addition of rocker curvatures to regions that exhibit excessive flexural stiffness; 2020J calculate the influence that the boot-binding system has upon the camber elevation profile of the ski; 2020K calculate the torsional deformation of the ski at the design point, accounting for the latest ski design and most recently calculated loadings; 2020L adjust the total curvature profile at the design point, in order to compensate for the effects of torsional deformation; 2020M adjust the width profile, in order to compensate for the effects of torsional deformation; 2020N offset various curvature profiles and tangential coordinate systems between the elevations of the base of the ski and the flexural neutral axis of the ski, as necessary, in order to ensure that all curvature profiles and tangential coordinate systems correspond to the most recently calculated design specifications; and 2020O check for convergence.

At 2020A, the ski design system 2000 begins by finding the deformed shape of the ski at the design point. For example, the deformed shape of the ski at the design point can be calculated by invoking the CurveTwist2Shape function with PhiB set equal to PhiTotalB and with thetaT set equal to thetaEloc_rel. The CurveTwist2Shape function then returns the global (X, Y, and Z) coordinates and the v, b, and n orientation vectors of each node along the length of the base surface of the discretized ski under design point conditions. Similar corresponding sets of global (X, Y, and Z) coordinates and v, b, and n orientation vectors are calculated at the flexural neutral axis of the ski, as well as along the edge of the ski that is currently engaged with the snow.

At 2020B, the ski design system 2000 calculates the penetration depth of the ski into the snow, as well as the resulting snow loading distribution (snow load profile) along the length of the ski. For example, the penetration depth and snow loading distribution can be calculated using a function called "SkiSnowInteraction". In some embodiments, the snow penetration depth profile (dSnow_geom) is updated each time the SkiSnowInteraction function is invoked, and this updated snow penetration depth profile is then used in subsequent calculations. In some alternative embodiments, not all calculated snow penetration depth profiles (dSnow_geom) are stored for use in subsequent calculations. For example, in some embodiments, only the first snow penetration depth profile (dSnow_geom) that is calculated is then stored for use in all subsequent calculations that require a snow penetration depth profile; in such embodiments, any subsequent invocation of the SkiSnowInteraction function may only be employed for the purpose of calculating an updated snow loading distribution (snow load profile), and the corresponding updated snow penetration depth profile may be discarded once said updated snow loading distribution has been calculated.

The SkiSnowInteraction function calculates the penetration depth and snow loading distribution (snow load profile) as follows. A ski of the calculated total deformed shape at the design point is modeled as being depressed into a flat surface of snow at the edging angle that has been stipulated at the design point, and the resulting local snow penetration depth is calculated at each node along the length of the base of the ski; the resulting array (dSnow_geom) of local snow penetration depths represents the overall snow penetration depth profile of the ski. The overall global penetration depth (distance between the mid-base point of the ski and the surface of the snow, measured perpendicular to the surface of the snow) and the pitch angle of the ski (angle between the surface of the snow and the v orientation vector that is positioned at the mid-base point of the ski, measured about an axis that lies parallel to the surface of the snow and perpendicular to the longitudinal axis of the ski) within the snow is adjusted using a pair of nested bracketed bisection search algorithms until the snow loading distribution yields a total snow force magnitude ($F_{w\_int}$) that is approximately equal to the normal force that the athlete imposes upon the ski under design point conditions ($F_{nDP}$), and the tangential position of the centroid of the snow loading distribution (XmidBsnow) is approximately equal to the user-stipulated tangential position (measured along the length of the ski) of the athlete loading centroid. The aforementioned bracketed bisection search algorithms are manifested as a pair of nested loops: the outer loop is responsible for finding the pitch angle of the ski, whereas the inner loop is responsible for finding the overall global penetration depth of the ski.

At each iteration of the inner loop, a function called "SnowLoading" is invoked in order to find the total snow force magnitude ($F_{w\_int}$) and the tangential position of the centroid of the snow loading distribution (XmidBsnow), and then the assumed global penetration depth of the ski is adjusted, as necessary, in order to find the global penetration depth that will yield a total snow force magnitude that is approximately equal to $F_{nDP}$. At each iteration of the outer loop, a pitch angle is assumed, an initial global penetration depth is assumed, the inner loop is executed and run until convergence is achieved ($F_{w\_int}$ is approximately equal to $F_{nDP}$, within an acceptable margin of error), and then the assumed pitch angle is adjusted, as necessary, in order to find the pitch angle that will cause the tangential position of the centroid of the snow loading distribution (XmidBsnow) to be approximately equal to the user-stipulated tangential position (measured along the length of the ski) of the athlete loading centroid, within an acceptable margin of error.

Once overall convergence is achieved for both the pitch angle and the global penetration depth, the outputs from the most recently executed instance of the SnowLoading function (w, $f_w$, $F_{w\_int}$, and XmidBsnow) are stored for use in subsequent calculations. While the aforementioned SkiSnowInteraction function is presently described in terms of the pitch angle of the ski and the global penetration depth of the ski, it is worth noting that in another embodiment, a similar function may be used wherein the ski remains stationary and the surface of the snow is translated and rotated with respect to the ski. This alternative function would, in fact, be less computationally expensive than the function described here (since the many nodes and orientation vectors of the ski do not have to be translated and rotated in space). Nevertheless, the presently described function (wherein the ski itself is translated and rotated) may be considered to be linked to the true interaction between a ski and snow in a more intuitive manner, and may therefore be a more communicative means of describing how the function works.

The SnowLoading function can be invoked for the purpose of calculating the snow loading distribution (snow load profile) that acts upon the base of the ski. A ski of a calculated total deformed shape at the design point is modeled as being depressed into a flat surface of snow at the edging angle that has been defined at the design point, and the resulting local snow penetration depth is then calculated at each node along the length of the base of the ski; the resulting array (dSnow_geom) of local snow penetration depths represents the overall snow penetration depth profile of the ski.

A snow pressure distribution is calculated as a function of the snow penetration depth profile (dSnow_geom) and the user-stipulated constitutive snow model. Some embodiments employ the constitutive snow model that is presented in Federolf_et_al_2010. This snow model is used to calculate the average of the width-wise snow pressure distribution ($p_{avg}$) at the longitudinal tangential position of each discretization point (node) along the length of the ski. Three coefficients are used to represent the mechanical properties of the snow: $A_{snow}$, $B_{snow}$, and $C_{snow}$, where the value of $A_{snow}$ is dependent upon the local edging angle of the ski.

The SnowLoading function begins at the tip (forward most point) of the ski and migrates rearward, assessing the value of $p_{avg}$ at each node along the length of the ski. A new variable (dSnow_max) is defined to store the maximum of the local snow penetration depth values that have been observed in all of the nodes that are positioned forward of the node at which $p_{avg}$ is being assessed; the value of dSnow_max is initially set to zero, and is adjusted as each node is assessed. Similarly, another new variable ($p_{avg\_max}$) is defined to store the maximum of the $p_{avg}$ values that have been calculated in all of the nodes that are positioned forward of the node at which $p_{avg}$ is being assessed; the value of $p_{avg\_max}$ is initially set to zero, and is adjusted as each node is assessed.

At the longitudinal tangential position of each node, the local value of dSnow_geom is compared with the current value of dSnow_max. If the local value of dSnow_geom exceeds the current value of dSnow_max, then the local value of $p_{avg}$ is calculated as: $p_{avg}=A_{snow}$ dSnow_geom+$B_{snow}$, the value of dSnow_max is set equal to the local value of dSnow_geom, and the value of $p_{avg\_max}$ is set equal to the local value of $p_{avg}$. Conversely, if dSnow_max exceeds the local value of dSnow_geom, then the local value of $p_{avg}$ is calculated as: $p_{avg}=p_{avg\_max}+C_{snow}$ (dSnow_geom−dSnow_max), and the values of dSnow_max and $p_{avg\_max}$ are left unchanged. In any case, if the local value of dSnow_geom is less than zero, then the local value of $p_{avg}$ is set to zero. Similarly, if the local value of $p_{avg}$ has been calculated to be less than zero, then the local value of $p_{avg}$ is reset to zero.

At each nodal position along the length of the ski, a snow loading (w) is calculated as a force per unit length acting at the longitudinal tangential position of the corresponding node of the ski, and at the width-wise position of the centroid of the local width-wise snow pressure distribution. The magnitude of this snow loading at each nodal position is calculated as: $w=p_{avg}W_{sub}$, where $W_{sub}$ is the distance between the edge of the ski and the position on the base surface of the ski that intersects the surface of the snow, measured width-wise (parallel to the local b orientation vector) along the base surface of the ski at the longitudinal tangential position of the node of interest. The value of $W_{sub}$ can be calculated as follows: $W_{sub}$=(dSnow_geom)/sin(thetaEloc_eff), where thetaEloc_eff is calculated as the absolute value of the inverse cosine of the dot product of the local n orientation vector and the surface normal of the surface of the snow.

The width-wise snow pressure distribution acting upon the base of the ski is determined at the longitudinal tangential position of each node as a function of the assumed constitutive snow model, the local edging angle, and the local snow penetration depth (dSnow_geom). The centroid of this width-wise snow pressure distribution represents the width-wise application point of the snow loading (w) at the longitudinal tangential position of the relevant node. This load application point is stored for each corresponding node along the length of the ski.

The SnowLoading function assumes that the width-wise snow pressure distribution adopts a triangular geometry, wherein the snow pressure at the width-wise position of the surface of the snow is zero, and increases linearly to a value of 2 $p_{avg}$ at the width-wise position of the edge of the ski (where the local snow penetration depth is achieved). In light of the aforementioned assumed triangular width-wise snow pressure distribution, it can be reasoned that the centroid of the width-wise snow pressure distribution is positioned at a width-wise position on the base of the ski that is a distance of $W_{sub}/3$ from the edge, measured parallel to the local b orientation vector.

It is worth mentioning that this assumed triangular width-wise snow pressure distribution differs slightly from the width-wise snow pressure distribution that is presented by Federolf_et_al_2010. While it would certainly be possible to implement the width-wise snow pressure distribution that is presented by Federolf_et_al_2010, the present inventor has used his engineering judgment to reason that the aforementioned triangular width-wise snow pressure distribution embodies a logical application of mechanical principals, and corroborates the empirical validation that was presented by Federolf_et_al_2010. It is also worth mentioning at this point that alternative embodiments may employ completely different constitutive snow models (other than that presented by Federolf_et_al_2010), and the SnowLoading function may be adapted to work with such alternative constitutive snow models.

In some embodiments, it is assumed that all snow pressure acts perpendicular to the contours of the base of the ski (parallel to the local n orientation vectors). The resulting snow loading distribution (w) is stored as a force per unit length acting at the longitudinal tangential position of each node of the ski, and the centroid of the width-wise snow pressure distribution is also stored at the longitudinal tangential position of each node of the ski. The snow loading distribution (w) is then converted into an array of equivalent element forces ($f_w$), wherein each of these element forces is applied to the mid-point of the relevant beam element of the ski, and has a magnitude that is equal to the length of the element multiplied by the average of the w values at each of the two nodes bounding the element.

Each row of the $f_w$ array represents the elemental snow force at the longitudinal tangential position of the centroid of one element, and contains six columns: the global (X, Y, and Z) Cartesian coordinates of the centroid of the local width-wise snow pressure distribution, which corresponds to the application point of the relevant local snow force at the longitudinal tangential position of the mid-point of the element; and the three orthogonal components of the local snow force vector, wherein said local snow force vector has a direction that is perpendicular to the base surface of the ski at the application point of the local snow force.

The vector sum of all snow forces ($f_w$) along the length of the ski is calculated in order to find the total snow force ($F_{w\_int}$) that is acting upon the base of the ski. In addition, the tangential position (measured along the length of the ski) of the centroid of the snow loading distribution (XmidBsnow) is calculated as follows. A new orientation vector is defined as follows: $v_{FW}=[1, 0, 0]$, where the aforementioned vector comprises X, Y, and Z ordered components.

The SnowLoading function then calculates the sum of the moments of each snow force value in the $f_w$ array about the origin (mid-base point), and the resulting moment vector is denoted by $M_{Fw\_int\_0}$. The magnitude of $M_{Fw\_int\_0}$ is then calculated as the square root of the sum of the squares of its three vector components, and the resulting value is denoted by $M_{Fw\_0\_Mag}$. A new unit vector ($u_{MFw\_0}$) is defined as having the same direction as $M_{Fw\_int\_0}$, as follows: $u_{MFw\_0}=M_{FW\_int\_0}/M_{FW\_0\_Mag}$. A new direction vector is defined as follows: $v_{Fw\_Arm}=F_{w\_int} \times M_{Fw\_int\_0}$, where × denotes a cross product operator. The magnitude of $v_{Fw\_Arm}$ is then calculated as the square root of the sum of the squares of its three vector components, and the resulting value is denoted by $v_{Fw\_Arm\_Mag}$.

A new unit vector is then defined as follows: $u_{Fw\_Arm}=v_{Fw\_Arm}/v_{Fw\_Arm\_Mag}$. The global (X, Y, and Z) coordinates of the centroid of the snow loading distribution are then calculated as follows:

$$XYZ_w = \frac{u_{Fw\_Arm} M_{Fw\_0\_Mag}}{u_{MFw\_0} \cdot (u_{Fw\_Arm} \times F_{w\_int})},$$

where · denotes a dot product operator. A line ($L_{Fw\_int}$) is defined has having a direction that is parallel to the direction of the $F_{w\_int}$ force vector, while passing through the $XYZ_w$ point. The SnowLoading function then finds the global (X, Y, and Z) coordinates of the point at which the $L_{Fw\_int}$ line intersects the base surface of the ski; this intersection point is denoted by $XYZ_{w\_base}$. Finally, the tangential coordinate of the centroid of the snow loading distribution (XmidBsnow) is approximated as follows: XmidBsnow=$v_{Fw} \cdot XYZ_{w\_base}$.

It would not be difficult to employ a slightly more accurate formulation for XmidBsnow (perhaps by interpolating the XmidB position that corresponds to the global X component of the $XYZ_{w\_base}$ point); however, doing so would add computational expense to the SnowLoading function, and the aforementioned approximation for XmidBsnow is quite accurate provided that the relative deflection of the ski is relatively small between the mid-base point and the XmidBsnow coordinate (which is almost always the case). The SnowLoading function ultimately outputs values of w, $f_w$, $F_{w\_int}$ and XmidBsnow.

At 2020C, the ski design system 2000 recalculates the orientation and position of the boot-binding pad regions in the context of the ski geometry having been set to that of the deformed geometry that is exhibited at the design point. For example, the ski design system can calculate the orientation and position of the boot-binding pad regions using the LoadingPads function. At 2020C, the ski design system 2000 also calculates the geometric positions and loadings that are present within the boot-binding system and the binding interface plate under design point loaded (deformed) conditions. For example, this can be achieved by employing a bracketed bisection search algorithm, as follows.

Initial values of dZ_Cup_f and dZ_Cup_r are assumed. The BindingGeometry function is invoked with the ski geometry set to that present under design point loaded (deformed) conditions. A function called "BindingLoading" is then invoked using the output from the BindingGeometry function. The resulting toe and heel boot lug forces are then calculated as a function of the user-stipulated toe and heel boot lug compliances (C_Lug_f and C_Lug_r) and the assumed toe and heel boot lug deflections (dZ_Cup_f and dZ_Cup_r), and these forces are compared with the corresponding toe-cup and heel-cup clamping forces that are found (by the BindingLoading function) to be acting upon said boot lugs. The assumed values of dZ_Cup_f and dZ_Cup_r are adjusted as necessary, and the aforementioned search algorithm is repeated until convergence between boot lug forces and the corresponding toe-cup and heel-cup clamping forces is achieved. The pad loadings that result from these binding and plate loadings are then calculated by invoking a function called "BindingPadLoading".

The BindingLoading function can be invoked for the purpose of determining the loadings that the binding and plate system imposes upon the ski as a function of the geometric configuration that is exhibited by the various components of the binding and plate system under specific conditions, as well as the snow loads that are being imposed upon the base of the ski. If non-zero snow loads are present, then the sum of all element snow forces ($F_{w\_int}$) is calculated, and the moment of all element snow forces ($M_{w\_int}$) is taken about the position of the front AFD perch. The position of each of the binding components is compared with its initial unloaded position in order to calculate the elastic response of the binding, and in turn, the loading that the boot-binding system imposes upon the ski under this condition.

Binding loads include: toe-cup clamping force ($F_{Cup\_f}$), heel-cup clamping force ($F_{Cup\_r}$), forward pressure force at toe ($F_{FP\_f}$), forward pressure force at heel ($F_{FP\_r}$), normal force acting upon the front AFD perch ($F_{AFD\_f}$), normal force acting upon rear AFD perch ($F_{AFD\_r}$), and brake pedal force ($F_{BP}$).

The forward pressure force at the heel ($F_{FP\_r}$) is calculated as a function of the difference between the position of the heel-cup pivot axis under present conditions and that under Cam1 camber conditions, since this relative displacement constitutes a change in the length of the forward pressure spring relative to the conditions (Cam1) under which the forward pressure spring was adjusted to its targeted setting. The $F_{FP\_r}$ vector is defined such that it points in the same direction as the local v orientation vector at the position of the mounting point of the heel-cup ($v_{CupMount\_r}$).

The heel-cup clamping force ($F_{Cup\_r}$) is calculated, in part, as a function of the user-defined load-deflection response of the heel-cup 4260, as well as the difference between the elevation of the heel-cup 4260 under current conditions and relaxed conditions with no boot installed. In addition, since the $F_{FP\_r}$ force does not necessarily act through the heel-cup pivot axis 4270, the presence of the $F_{FP\_r}$ force will generally cause a moment about the heel-cup pivot axis, which will manifest itself as an increase or decrease in the heel-cup clamping force ($F_{Cup\_r}$). As such, the total magnitude of $F_{Cup\_r}$ is calculated as: $F_{Cup\_r} = n_{CupMount\_r}(F_{Cup\_r\_s} + F_{FP\_r\_mag} C_{Cup\_r\_FP})$, where $F_{Fp\_r\_mag}$ is the magnitude of the forward pressure force at the heel, $F_{Cup\_r\_s}$ is the magnitude of the portion of the heel-cup clamping force that is generated by the load-deflection response of the heel-cup (excluding the effects of the moment that $F_{FP\_r}$ generates about the heel-cup pivot axis), $n_{CupMount\_r}$ is the local n orientation vector at the position of the mounting point of the heel-cup, and $C_{Cup\_r\_FP}$ is a coefficient that relates the forward pressure force at the heel to the change in heel-cup clamping force that is caused by the moment that $F_{FP\_r}$ generates about the heel-cup pivot axis.

The value of $C_{Cup\_r\_FP}$ is found as follows:

$$C_{Cup\_r\_FP} = -\frac{M_{Axis\_FP\_r} \cdot b_{CupMount\_r}}{(XYZ_{Axis\_r} - XYZ_{Cup\_r}) \cdot v_{CupMount\_r}},$$

where $b_{CupMount\_r}$ is the local b orientation vector at the position of the mounting point of the heel-cup, $v_{CupMount\_r}$ is the local v orientation vector at the position of the mounting point of the heel-cup, $XYZ_{Axis\_r}$ is the global (X, Y, and Z) Cartesian position of the heel-cup pivot axis, $XYZ_{Cup\_r}$ is the global (X, Y, and Z) Cartesian position of the heel-cup clamping force application point, $M_{Axis\_FP\_r}$ represents the relationship between $F_{FP\_r}$ and the moment that $F_{FP\_r}$ generates about the heel-cup pivot axis, and · denotes a dot product operator. The value of $M_{Axis\_FP\_r}$ is calculated as follows: $M_{Axis\_FP\_r} = (XYZ_{FP\_r} - XYZ_{Axis\_r}) \times (v_{CupMount\_r})$, where $XYZ_{FP\_r}$ is the global (X, Y, and Z) Cartesian position of the application point of the forward pressure force at the heel, and × denotes a cross product operator.

The toe-cup clamping force ($F_{Cup\_f}$) is calculated, in part, as a function of the user-defined load-deflection response of the toe-cup, as well as the difference between the elevation of the toe-cup 4220 under current conditions and relaxed conditions with no boot installed. Once again, since the forward pressure force does not necessarily act through the toe-cup pivot axis 4210, the presence of the forward pressure force will generally cause a moment about the toe-cup pivot axis 4210, which would manifest itself as an increase or decrease in the toe-cup clamping force ($F_{Cup\_f}$). As such, a new coefficient ($C_{Cup\_f\_FP}$) is introduced as that which relates the forward pressure force at the toe to the change in toe-cup clamping force that is caused by the moment that $F_{FP\_f}$ generates about the toe-cup pivot axis.

The value of $C_{Cup\_f\_FP}$ is found as follows:

$$C_{Cup\_f\_FP} = -\frac{M_{Axis\_FP\_f} \cdot b_{CupMount\_f}}{(XYZ_{Axis\_f} - XYZ_{Cup\_f}) \cdot v_{CupMount\_f}},$$

where $b_{CupMount\_f}$ is the local b orientation vector at the position of the mounting point of the toe-cup, $v_{CupMount\_f}$ is the local v orientation vector at the position of the mounting point of the toe-cup, $XYZ_{Axis\_f}$ is the global (X, Y, and Z) Cartesian position of the toe-cup pivot axis, $XYZ_{Cup\_f}$ is the global (X, Y, and Z) Cartesian position of the toe-cup clamping force application point, and $M_{Axis\_FP\_f}$ represents the relationship between $F_{FP\_f}$ and the moment that $F_{FP\_f}$ generates about the toe-cup pivot axis. The value of $M_{Axis\_FP\_f}$ is calculated as follows: $M_{Axis\_FP\_f}=(XYZ_{FP\_f}-XYZ_{Axis\_f}) \times (-v_{CupMount\_f})$, where $XYZ_{FP\_f}$ is the global (X, Y, and Z) Cartesian position of the application point of the forward pressure force at the toe.

The magnitude of the forward pressure force at the toe is then calculated as:

$$F_{FP\_f\_mag} = -\frac{F_{FP\_f\_UBvSole} + F_{Cup\_f\_s}(vSole \cdot n_{CupMount\_f})}{(vSole \cdot (-v_{CupMount\_f})) + C_{Cup\_f\_FP}(vSole \cdot n_{CupMount\_f})},$$

where $n_{CupMount\_f}$ is the local n orientation vector at the position of the mounting point of the toe-cup, $F_{Cup\_f\_s}$ is the magnitude of the portion of the toe-cup clamping force that is generated by the load-deflection response of the toe-cup (excluding the effects of the moment that $F_{FP\_f}$ generates about the toe-cup pivot axis), and $F_{FP\_f\_UBvSole}=vSole \cdot (F_{Cup\_r}+F_{FP\_r}+F_{w\_int})$.

Finally, the total toe-cup clamping force is calculated as: $F_{Cup\_f}=n_{CupMount\_f}(F_{Cup\_f\_s}+F_{FP\_f\_mag}C_{Cup\_f\_FP})$, and the total forward pressure force at the toe is calculated as: $F_{FP\_f}=-v_{CupMount\_f}F_{FP\_f\_mag}$.

In addition to the aforementioned binding loads, there also exists a load within the toe-heel link, which acts upon the toe-cup and heel-cup mounting structures at the elevation of the toe-heel link. The force that the toe-heel link imposes upon the heel-cup mount ($F_{THL\_r}$) is calculated as that which is necessary to prevent migration of the heel carriage along the heel track, accounting for the presence of $F_{Cup\_r}$ and $F_{FP\_r}$, and recognizing that the axis of the toe-heel link is not necessarily parallel to the heel track. The force that the toe-heel link imposes upon the toe-cup mount ($F_{THL\_f}$) is equal and opposite to $F_{THL\_r}$.

The brake pedal force ($F_{BP}$) is calculated as a function of the user-defined load-deflection response of the brake pedal system and the position of the brake pedal relative to relaxed (unloaded) conditions. It is assumed that $F_{BP}$ acts parallel to nSole.

A moment imbalance about the front AFD perch ($M_{UB\_AFDf}$) is then calculated as the dot product of the mean of the local b vectors at the front and rear AFD perches and the sum of the moments of $F_{Cup\_f}$, $F_{Cup\_r}$, $F_{FP\_f}$, $F_{FP\_r}$, $F_{THL\_f}$, $F_{THL\_r}$, $F_{BP}$, and $F_{w\_int}$ about the front AFD perch.

The normal force acting upon the rear AFD perch is then calculated as:

$$F_{AFD\_r} = \frac{nSole * M_{UB\_AFDf}}{vSole \cdot dXYZ_{AFDrf}},$$

where $dXYZ_{AFDrf}$ is the difference between the global (X, Y, and Z) coordinates of the rear and front AFD perches. It is worth noting that, as a scalar operation, the aforementioned calculation of $F_{AFD\_r}$ is simply equal to $M_{UB\_AFDf}$ divided by the distance between the rear and front AFD perches.

Finally, the normal force acting upon the front AFD perch ($F_{AFD\_f}$) is calculated as that which is required to equilibrate all of the previously calculated binding loadings and snow loadings. Upon completion of the aforementioned boot-binding force calculations, the toe and heel boot lug forces are also calculated as a function of the assumed boot lug deflections (dZ_Cup_f and dZ_Cup_r) and the user-stipulated boot lug compliances (C_Lug_f and C_Lug_r). The present geometry of the ski is also used to calculate the relative positions of the front and rear regions of the binding interface plate under the relevant conditions. If the user has provided data pertaining to the flexural stiffness of the binding interface plate, then these data are used to determine the bending moment that is imposed upon the binding interface plate 4200, and in turn, the loading that the binding interface plate 4200 imposes upon the toe and heel boot-binding pads of the ski 3000.

The BindingPadLoading function can be invoked for the purpose of converting the forces and moments produced by the binding and plate system into simplified distributed loads that are applied to the boot-binding pad regions. All of the toe binding loads (toe-cup clamping, toe forward pressure, front AFD perch, and front binding interface plate) are summed and converted into a force vector and moment vector positioned at the centroid of the front boot-binding pad region, and all of the heel binding loads (heel-cup clamping, heel forward pressure, rear AFD perch, brake pedal, and rear binding interface plate) are summed and converted into a force vector and a moment vector positioned at the centroid of the rear boot-binding pad region.

These force and moment vectors are then converted into equivalent linearly varying distributions of normal and shear forces over the surfaces of the front and rear boot-binding pad regions, wherein said distributed loadings are represented by a normal load per unit length and a shear load per unit length that is applied between each adjacent pair of nodes on the pad line of the relevant boot-binding pad region.

The gradient (linear rate of change) of the normal force component of this distributed load ($w_{BL_{grad}}$) is equal to 12 times the total concentrated moment imposed by the boot-binding system about the local b vector of the ski, divided by the cube of the length of the relevant pad region. The average value of the normal force component of this distributed load ($w_{BL_{avg}}$) is equal to the total normal force (component of binding forces that act perpendicular to the surface of the relevant boot-binding pad region) divided by the length of the relevant pad region.

The normal force component of the distributed load can then be calculated at any position along the length of each pad as: $w_{BL}=w_{BL_{avg}}+w_{BL_{grad}}x_{Pad_c}$, where $x_{Pad_c}$ is the tangential distance between the position of interest and the centroid of the relevant boot-binding pad region. The shear force component of this distributed load is assumed to be constant, and is therefore equal to the total shear force (component of binding forces that act parallel to the surface of the relevant boot-binding pad region) divided by the length of the relevant pad region.

The distributed pad loading is then converted into an array of equivalent element pad forces ($f_{wPad}$), wherein each of these equivalent element forces is applied to the mid-point between two adjacent nodes of the pad region, and has a magnitude that is equal to the product of the distance between said adjacent nodes and the average of the distributed binding load values that correspond to said adjacent nodes. Each row of the $f_{wPad}$ array contains six columns: the global (X, Y, and Z) Cartesian coordinates of the longitudinal tangential position of the mid-point between two adjacent nodes of the pad region (the application point of the relevant equivalent element pad force); and the three orthogonal components of the element pad force vector (along each of the global Cartesian axes).

At 2020D, the ski design system 2000 calculates the bending moment and torsion moment profiles. For example, the bending moment and torsion moment profiles can be carried out by a function called "BendingTorsion".

The BendingTorsion function performs all calculations at the elevation of the flexural neutral axis of the ski; hence, the XmidNA tangential coordinate system is employed, and the global (X, Y, and Z) coordinates and v, b, and n orientation vectors that are employed are those that have been calculated at the elevation of the flexural neutral axis.

At each node along the length of the ski, the BendingTorsion function calculates the internal moment caused by the combination of the element snow forces ($f_w$) and the equivalent element pad forces ($f_{wPad}$). Each of these internal moments is calculated by finding all of the element snow forces and equivalent element pad forces that act upon points that are positioned forward of the node of interest, and summing the moments (cross products of moment arms and corresponding forces) of all of these loads about the node of interest. The resulting internal moment is represented by three orthogonal components, and the overall internal moment profile due to $f_w$ and $f_{wPad}$ is stored as an array that is denoted by $M_0$.

In addition, the BendingTorsion function calculates the total moment imbalance ($M_{UB}$) by summing the moments (cross products of moment arms and corresponding forces) of each of the element snow forces ($f_w$) and each of the equivalent element pad forces ($f_{wPad}$) about the origin (mid-base point) of the ski. In order to achieve a state of equilibrium, it may be necessary to add local concentrated moments at each of the front and rear boot-binding pads. In addition, it is assumed that the boot exhibits infinite torsional stiffness; hence, since both of the front and rear AFD perches are held firmly against the sole of the boot, it is assumed that both of these AFD perches share the same torsion angle (local edging angle). The addition of concentrated moments at each boot-binding pad region serves two purposes: to equilibrate any global moment imbalances ($M_{UB}$), and to twist the ski (as necessary) such that the overall torsion angles exhibited at the longitudinal tangential positions of the front and rear AFD perches are approximately equal to each other.

In the event that this is the first iteration of the optimization loop and the ski's flexural and torsional stiffness profiles have not yet been established, then it is assumed that the angles of twist are all equal to zero, and the necessary equilibrating concentrated moments about the longitudinal (torsion) axis of the ski are evenly distributed between the front and rear boot-binding pads.

The sum of the concentrated moment applied to the front boot-binding pad ($M_{PF}$) and the concentrated moment applied to the rear boot-binding pad ($M_{PR}$) should be equal to $M_{UB}$. It is therefore assumed that $$M_{PR} = M_{osT} - \frac{M_{UB}}{2},$$

and $M_{PF}=-(M_{UB}+M_{PR})$, where $M_{osT}$ is the component of the concentrated moment that is responsible for ensuring that the front and rear AFD perches share the same torsion angle. In order to ensure that $M_{osT}$ only contributes to the torsional deformation of the ski, and does not significantly alter the bending moment profile that is acting upon the ski, it may be important to ensure that $M_{osT}$ acts about an axis that passes through the front and rear AFD perches.

A bracketed bisection search algorithm is employed to find the values of $M_{PF}$ and $M_{PR}$, as follows. A new direction vector ($v_{osT}$) is defined as one that points from the front AFD perch to the rear AFD perch. Initial upper and lower bound values of $M_{osT}$ are assumed as equal and opposite moment vectors, wherein both of these moment vectors are parallel to $v_{osT}$, and wherein the upper bound $M_{osT}$ vector points in the same direction as $v_{osT}$. The current assumed value of $M_{osT}$ is the set equal to the mean of the currently assumed upper and lower bound values of $M_{osT}$. The values of $M_{PF}$ and $M_{PR}$ are then calculated as a function of $M_{osT}$ and $M_{UB}$, as described above. These moments are then applied to their respective boot-binding pads as uniformly distributed moments, wherein each moment is divided into nodal moments that are applied to each of the nodes within the relevant pad region.

At each node, the internal moment that is caused by the concentrated pad moments ($M_{PF}$ and $M_{PR}$) is calculated as the sum of all of the nodal pad moments that act at positions that are forward of the node of interest; the resulting internal moment profile due to the concentrated pad moments is denoted by $M_{ConcPad}$. The total internal moment profile ($M_{tot}$) is then calculated as: $M_{tot}=-(M_0+M_{ConcPad})$, wherein said total internal moment profile represents the total internal moment present at each node along the length of the ski.

The internal torsion moment at each node along the length of the ski is calculated as the dot product of the total internal moment ($M_{tot}$) and the local v vector. The rate of twist of each element is then calculated as the local torsion moment divided by the local torsional stiffness. These rates of twist are then integrated over the length of the ski in order to find the profile of relative torsion angles over the length of the ski. If the torsion angle at the front AFD perch is greater than that at the rear AFD perch, then the assumed lower bound value of $M_{osT}$ is set to the current value of $M_{osT}$. Conversely, if the torsion angle at the front AFD perch is less than that at the rear AFD perch, then the assumed upper bound value of $M_{osT}$ is set to the current value of $M_{osT}$.

The aforementioned bracketed bisection search algorithm iteratively repeats the above-mentioned procedure until it converges upon a solution wherein the torsion angles at the front and rear AFD perches are approximately equal to each other within an acceptable margin of error.

The internal bending moment at each node along the length of the ski is calculated as the negative of the dot product of the total internal moment ($M_{tot}$) and the local b vector. The flexural curvature at each node is calculated as the local bending moment divided by the local flexural stiffness. The profile of local relative torsion angles is then rotated about the v vector at the front AFD perch, wherein said rotation angle is equal to the negative of the calculated torsion angle at the front AFD perch, thus setting the relative torsion angle to zero at the front AFD perch. The resulting relative torsion angle profile (thetaTrel) is stored as an array; however, it should be noted that thetaTrel does not account for the edging angle of the ski in its current form.

At 2020E, the ski design system 2000 updates the initial camber elevation profile of the unloaded ski. For example, if the user has indicated that the camber elevation profile is to be optimized without ski boots installed, then Cam0 can be determined by invoking the CamProfile function; Cam1 can then be found by adding the flexural curvatures (bending curvatures) that are induced by the boot-binding system 4000 under camber conditions to the Cam0 camber curvature profile. If the user has indicated that the camber elevation profile is to be optimized with ski boots installed, then Cam1 can be determined by invoking the CamProfile function; Cam0 can then be found by subtracting the flexural curvatures that are induced by the boot-binding system 4000 under camber conditions from the Cam1 camber curvature profile.

In either case, it should be noted that curvatures may only be added or subtracted at the elevation of the flexural neutral axis of the ski. As such, before flexural curvatures can be added or subtracted to camber curvatures, it may first be necessary to offset the camber curvature profile to the elevation of the flexural neutral axis (by invoking the PhiZOffset function); once this addition or subtraction of curvatures has been completed, the resulting curvature may then be offset back to the base of the ski (by invoking the PhiZOffset function once again). It should also be noted that the aforementioned camber curvature profile may initially only be created within the effective base length 3200 of the ski 3000. As such, the shovel nodes and tail nodes may be assigned user-stipulated curvature values as necessary to create the upward curving geometries of these features.

At 2020F, the ski design system 2000 calculates the flexural curvature profile and the targeted flexural stiffness profile. For example, flexural curvatures can be calculated as the difference between the total curvature profile at the design point (at the elevation of the flexural neutral axis of the ski) and the Cam0 camber curvature profile (at the elevation of the flexural neutral axis of the ski). The targeted flexural stiffness profile can then be calculated as the bending moment at each node divided by the flexural curvature at each node (at the elevation of the flexural neutral axis of the ski).

At 2020G, the ski design system 2000 calculates of the core thickness profile. For example, by interpolating between the ski width versus core thickness versus stiffness response curves that were calculated prior to entering the optimization loop (see plot 5000 of FIG. 11 for a sample of such response curves), the core thickness profile can be determined such that the targeted flexural stiffness profile is achieved. If any region of the ski is assigned a core thickness that is less than the user-stipulated minimum allowable core thickness, then these regions can be assigned a core thickness that is equal to the user-stipulated minimum allowable core thickness. This minimum allowable core thickness is important as it may not be practicable to build a ski core that exhibits a thickness profile that tapers to zero at any point along its length.

A filleting routine can be employed such that any transitions between regions of constant core thickness and regions of variable core thickness are made smoothly, using a radial arc fillet. In some embodiments, other adjustments to the core thickness profile may be applied, as necessary, in order to accommodate additional practical considerations. The adjustments made to the core thickness profile executed at this stage of the optimization loop may ensure that all subsequent operations that are carried out by the optimization loop are able to account for said adjustments.

At 2020H, the ski design system 2000 re-assesses the actual flexural and torsional stiffness profiles of the ski at the optimization temperature control point. For example, the core thickness profile can be used in conjunction with the width profile and the user-stipulated ski construction (laminate architecture and material composition) to calculate the flexural and torsional stiffness profiles that the ski would exhibit with the most recently updated core thickness profile; this calculation can be carried out at each tangential coordinate along the length of the ski by invoking the EI_JG function.

At 2020I, the ski design system 2000 calculates of an overall camber and rocker (CamRock) elevation profile.

For example, the camber and rocker profiles can be calculated as follows. The elevation profile exists on a plane that is parallel to the longitudinal axis of the ski and perpendicular to the base surface of the ski. Since the ski may now exhibit regions of sub-optimal flexural stiffness (due to the need to maintain core thicknesses that are greater than or equal to the user-stipulated minimum, as well as other possible adjustments that may have been made to the core thickness profile), the ski may no longer achieve the targeted total curvature profile under design point conditions. As such, in regions of excessive flexural stiffness, some rocker curvatures (reverse-camber curvatures) may need to be added to the existing camber curvature profile in order alleviate the need for the ski to bend as much in said regions. Similarly, in regions of deficient flexural stiffness, some camber curvatures may need to be added to the existing camber curvature profile in order to increase the amount by which the ski must bend in said regions.

The expected flexural curvature within each element of the ski (at the elevation of the flexural neutral axis) can be calculated as the bending moment within that element divided by the flexural stiffness of that element. A camber curvature adjustment profile (PhiCamAdj) can then be calculated as the total curvature at the design point minus the sum of the Cam0 camber curvature profile and the expected flexural curvature profile, where all of said curvature profiles are evaluated at the elevation of the flexural neutral axis of the ski. The aforementioned PhiCamAdj profile will typically comprise predominantly positive curvature (rocker curvature) values in order to compensate for deficient flexural curvatures that are caused in regions of excessive flexural stiffness; however, it should be noted that it is also possible for the PhiCamAdj profile to include some negative curvature (camber curvature) values, which could arise in the event that the ski exhibits some regions of deficient flexural stiffness.

Finally, the overall camber and rocker elevation profile (CamRock elevation profile) is represented by a CamRock curvature profile, which can be calculated as the sum of the camber curvature profile and the PhiCamAdj profile. Cam Rock0NA is defined as the sum of the Cam0 camber curvature profile and the PhiCamAdj profile at the elevation of the flexural neutral axis of the ski. Cam Rock0B is then defined by offsetting the Cam Rock0NA curvature profile to the elevation of the base of the ski by invoking the PhiZOffset function. Cam Rock1NA is defined as the sum of the Cam Rock0NA curvature profile and the flexural curvature profile that is induced by the boot-binding pad loads (PhiB_Binding_1) under unloaded (cambered) conditions. Cam Rock1B is then defined by offsetting the Cam Rock1NA curvature profile to the elevation of the base of the ski by invoking the PhiZOffset function. If this is the first iteration of the optimization loop, then PhiB_Binding_1 is initially assumed to be a zero array, which will be populated later as the optimization converges upon a design solution.

In light of the foregoing, it is important to recognize the significance of the edging angle $\theta_{e_{DP}}$ that is stipulated at the design point by the user. If the design point is defined using too shallow of an edging angle, then the ski design system 2000 may not provide a sufficient amount of rocker at the tip and tail of the ski to facilitate a smooth snow loading distribution when edging angle values exceed that which was stipulated at the design point. As a result, sharp peaks in the snow loading distribution may be generated at the tip and tail when edging angle values exceed that which was stipulated at the design point. Conversely, if the design point is defined using too steep of an edging angle, then the ski design system 2000 may provide an excessive amount of rocker at the tip and tail of the ski, which may result in diminished edge engagement at the tip and tail when edging angles are shallower than that which was stipulated at the design point.

At 2020J, the ski design system 2000 calculates the influence that the boot-binding system has upon the camber elevation profile. For example, the ski design system 2000 can re-calculate the three-dimensional geometry of the most recently calculated CamRock1B elevation profile of the ski by invoking the CurveTwist2Shape function with PhiB set equal to the CamRock1B curvature profile and with thetaT set equal to thetaEloc_rel_init. The CurveTwist2Shape function then returns the global (X, Y, and Z) coordinates and the v, b, and n orientation vectors of each node along the length of the base surface of the discretized ski when it exhibits the CamRock1B elevation profile. Similar corresponding sets of global (X, Y, and Z) coordinates and v, b, and n orientation vectors are calculated at the flexural neutral axis of the ski, as well as along the edge of the ski that is currently engaged with the snow.

The ski design system 2000 can then invoke the LoadingPads function in order to recalculate the orientation and position of the boot-binding pad regions in the context of the ski geometry having been set to that of the most recently calculated CamRock1B elevation profile.

The ski design system 2000 can then update the effect that binding forces have upon the CamRock1B elevation profile. The ski design system 2000 begins by updating the length of the toe-heel link of the binding system, as it is assumed that the Cam1 condition represents the circumstances under which the forward pressure system is set to its targeted initial preload value. The length of the toe-heel link is calculated as the linear distance between the mounting points of the toe-cup and heel-cup systems with the ski geometry set to that of the most recently calculated CamRock1B elevation profile.

The ski design system 2000 can then proceed with carrying out a bracketed bisection search algorithm, as follows. Initial values of dZ_Cup_f and dZ_Cup_r are assumed. The BindingGeometry function is invoked with the ski geometry set to that of the most recently calculated Cam Rock1B elevation profile. The BindingLoading function is then invoked using the output from the BindingGeometry function. The resulting toe and heel boot lug forces are then calculated as a function of the user-stipulated toe and heel boot lug compliances (C_Lug_f and C_Lug_r) and the assumed toe and heel boot lug deflections (dZ_Cup_f and dZ_Cup_r), and these forces are compared with the corresponding toe-cup and heel-cup clamping forces that are found (by the BindingLoading function) to be acting upon said boot lugs. The assumed values of dZ_Cup_f and dZ_Cup_r are adjusted as necessary, and the aforementioned search algorithm is repeated until convergence between boot lug forces and the corresponding toe-cup and heel-cup clamping forces is achieved.

The pad loadings that result from these binding and plate loadings can then be calculated by invoking the Binding-PadLoading function. Finally, the structural influence that the binding forces have upon the ski under unloaded (camber) conditions can be calculated by invoking the BendingTorsion function (with element snow forces set to zero), which calculates the flexural curvature profile that is induced by the boot-binding pad loads (PhiB_Binding_1), evaluated at the elevation of the flexural neutral axis of the ski.

At 2020K, the ski design system 2000 calculates the torsional deformation of the ski at the design point. For example, using all of the latest information pertaining to the ski design, as well as the snow loadings, binding loading, and binding interface plate loading that have most recently been calculated under design point conditions, the ski design system 2000 can calculate the relative twist angle profile (thetaTrel) by invoking the BendingTorsion function. The local edging angle (thetaEloc_rel) at each discretization point (node) along the length of the ski can then be re-calculated as the sum of thetaTrel and thetaEloc_rel_init. It should be noted that the value of thetaTrel is assumed to be zero at the positions of the front and rear AFD perches; as such, the values of thetaEloc_rel at the positions of the front and rear AFD perches will both be equal in magnitude to $\theta_{e_{DP}}$.

At 2020L, the ski design system 2000 adjusts the total curvature profile at the design point (PhiTotalB) in order to partially compensate for the effects of the torsional deformation of the ski. For example, a new array (PhiTotalB_T) can be introduced to represent the assumed total curvature profile at the design point, which will be used for comparative purposes when determining what is needed to compensate for the effects of the torsional deformation of the ski. In some embodiments, PhiTotalB_T is set equal to the most recently calculated PhiTotalB array. In other embodiments, PhiTotalB_T may be set equal to PhiTotalB_NoTwist in order to facilitate faster convergence of the optimization solution; however, setting PhiTotalB_T equal to the most recently calculated PhiTotalB array will typically yield a more precisely optimized design solution that better accounts for the inherent geometric non-linearities of the present design problem.

The currently assumed deformed shape of the ski at the design point can then be calculated by invoking the CurveTwist2Shape function with PhiB set equal to PhiTotalB_T and with thetaT set equal to thetaEloc_rel. With reference to a previously calculated dSnow_geom array, the values of the previously calculated local snow penetration depths can be queried at each tangential coordinate (XmidB) along the length of the base of the ski. The values of dSnow_geom at the positions of the the front and rear AFD perches are denoted by dSnow_Bf and dSnow_Br, respectively.

At each tangential coordinate (XmidB) along the length of the base of the ski, it can be determined that the intersection of the base contour of the ski and the surface of the snow is positioned a scalar distance of bDepth=$W_{sub}$=(dSnow_geom)/sin(thetaEloc_eff) from the edge, measured parallel to the local b orientation vector, where thetaEloc_eff is calculated as the absolute value of the inverse cosine of the dot product of the local n orientation vector and the surface normal of the surface of the snow. The values of bDepth at the longitudinal tangential coordinates of the front and rear AFD perches are denoted by bDepth_Bf and bDepth_Br, respectively.

The global position of the intersection of the base surface of the ski and the surface of the snow at the longitudinal tangential coordinate of the front AFD perch is denoted by XYZ_surface_Bf, and is calculated as follows:

XYZ_surface_Bf=XYZ_e_Bf−bDepth_Bf b_f, where XYZ_e_Bf is the global position of the edge of the ski at the tangential coordinate of the front AFD perch, and b_f is the local b orientation vector at the tangential coordinate of the front AFD perch. Similarly, the global position of the intersection of the base surface of the ski and the surface of the snow at the longitudinal tangential coordinate of the rear AFD perch is denoted by XYZ_surface_Br, and is calculated as follows: XYZ_surface_Br=XYZ_e_Br−bDepth_Br b_r, where XYZ_e_Br is the global position of the edge of the ski at the tangential coordinate of the rear AFD perch, and b_r is the local b orientation vector at the tangential coordinate of the rear AFD perch. An imaginary vector (v_surface) is fitted between XYZ_surface_Bf and XYZ_surface_Br (pointing in the generally rearward direction); this v_surface vector is then converted into a unit vector. Another imaginary vector (b_horizontal) is defined as one that is horizontal and is perpendicular to the longitudinal axis of the ski at the centre of its effective base region (mid-base point), as follows: b_horizontal=[0, 1, 0], where the aforementioned vector includes X, Y, and Z ordered components. Finally, a third imaginary vector (n_surface) is defined as the cross product of v_surface and b_horizontal. An imaginary plane (P_surface) is then defined as one that passes through XYZ_surface_Bf while having the surface normal n_surface. This P_surface plane represents the assumed surface of the snow.

At each tangential coordinate (XmidB) along the length of the base of the ski, a line (b_local) is defined as one that is parallel to the local b orientation vector and passes through a point on the base surface of the ski at the tangential coordinate of interest. At each tangential coordinate (XmidB) along the length of the base of the ski, the global position of the intersection of the base contour of the ski and the P_surface plane is denoted by XYZ_surface, and may be determined by finding the intersection of b_local with the P_surface plane.

The global position of the centroid of the width-wise snow pressure distribution at the longitudinal tangential coordinate of the front AFD perch is denoted by XYZ_load_Bf, and may be calculated as follows: XYZ_load_Bf=XYZ_e_Bf−(⅓) bDepth_Bf b_f. Similarly, the global position of the centroid of the width-wise snow pressure distribution at the longitudinal tangential coordinate of the rear AFD perch is denoted by XYZ_load_Br, and may be calculated as follows: XYZ_load_Br=XYZ_e_Br−(⅓) bDepth_Br b_r. An imaginary vector (v_load) is fitted between XYZ_load_Bf and XYZ_load_Br (pointing in the generally rearward direction); this v_load vector is then converted into a unit vector. Another imaginary vector (n_load) is defined as the cross product of v_load and b_horizontal. An imaginary plane (P_load) is then defined as one that passes through XYZ_load_Bf while having the surface normal n_load.

At each tangential coordinate (XmidB) along the length of the base of the ski, the local position of the snow trace (the effective line of contact between the ski and the snow) is denoted by XYZ_load. In some embodiments, the XYZ_load position that corresponds to each tangential coordinate (XmidB) may be calculated as follows: XYZ_load=XYZ_surface+(⅔) bDepth b. In some alternative embodiments, the XYZ_load position that corresponds to each tangential coordinate (XmidB) may be defined as the intersection of the base contour of the ski and the imaginary P_load plane. A nominal plane of symmetry of the ski (P_sym) may be defined as a plane that is perpendicular to the base surface of the ski (assuming zero torsional deformations), parallel to the longitudinal axis of the ski, and passes through the longitudinal centre-line of the ski at the position of its front AFD perch. As such, the P_sym nominal plane of symmetry may be assumed to have a surface normal vector that is found as follows: $n_{sym}=[0, \cos(-\theta_{e_{DP}}), \sin(-\theta_{e_{DP}})]$, where $\theta_{e_{DP}}$ is the edging angle of the ski at the design point. XYZ_load is then projected onto this P_sym nominal plane of symmetry of the ski, and the resulting projected curve is denoted by XYZ_surf_proj_b.

At each node along the length of the ski, the local curvature of the XYZ_surf_proj_b curve is determined by identifying an odd numbered series of sequential nodes (no fewer than 3 nodes, and usually no more than 7 nodes) that is centred about the node of interest, fitting a circular arc through this series of nodes, finding the radius of this circular arc, and then calculating the curvature as the reciprocal of this radius; the resulting curvature profile of the XYZ_surf_proj_b curve is then stored as PhiTotB. The ski design system 2000 then introduces a flexural curvature offset array (PhiTorsionB) that will be employed to partially compensate for the presence of torsional deformations; PhiTorsionB is calculated as the difference between PhiTotB and PhiTotalB_NoTwist.

A series of smoothing operations can then be applied to PhiTorsionB; failure to include these smoothing operations may result in divergent oscillations of the results generated at each iteration of the optimization loop, which would ultimately prevent the ski design system 2000 from finding a solution to the optimization problem. This series of smoothing operations may begin by removing parcels of the PhiTorsionB data that correspond to regions of the ski that exhibit discontinuities in the mathematical functions that describe its curvature profile, its torsional deformation profile, and/or its core thickness profile (for example: the upward curves within the shovel and tail regions; and the vicinity of the ski where the core thickness profile transitions from a variable thickness to a constant thickness). A cubic interpolation function is then employed to re-populate the PhiTorsionB data that has been removed, thus ensuring that PhiTorsionB data exists at each discretization point (node) along the length of the ski. Finally, a Gaussian-weighted moving average smoothing function is applied to the PhiTorsionB data; the window size for this smoothing function is defined as a small percentage (usually between 3 percent and 5 percent) of the total number of discretization points (nodes) within the effective base length of the ski.

The total curvature profile at the design point (PhiTotalB) can then be re-calculated as the difference between PhiTotalB_T and PhiTorsionB. Ultimately, the aforementioned re-calculation of PhiTotalB serves to ensure that the targeted snow trace geometry (that which is embodied by the PhiTotalB_NoTwist total curvature profile in the absence of torsional deformations) is achieved despite of the presence of non-zero torsional deformations.

At 2020M, the ski design system 2000 adjusts the width profile in order to partially compensate for the effects of the torsional deformation of the ski. In order to retain the longitudinal distribution of snow loadings (w) that had previously been calculated, it may be necessary to ensure that the snow penetration depth profile is unaffected by the introduction and/or modification of torsional deformations.

For example, the deformed shape of the ski at the design point can be re-calculated by invoking the CurveTwist2Shape function with PhiB set equal to PhiTotalB and with thetaT set equal to thetaEloc_rel. With reference to a previously calculated dSnow_geom array, the values of the previously calculated local snow penetration depths can be queried at each tangential coordinate (XmidB)

along the length of the base of the ski. The values of dSnow_geom at the positions of the the front and rear AFD perches are denoted by dSnow_Bf and dSnow_Br, respectively.

At each tangential coordinate (XmidB) along the length of the base of the ski, it can be determined that the intersection of the base contour of the ski and the surface of the snow is positioned a scalar distance of bDepth=$W_{sub}$=(dSnow_geom)/sin(thetaEloc_eff) from the edge, measured parallel to the local b orientation vector, where thetaEloc_eff is calculated as the absolute value of the inverse cosine of the dot product of the local n orientation vector and the surface normal of the surface of the snow. The values of bDepth at the longitudinal tangential coordinates of the front and rear AFD perches are denoted by bDepth_Bf and bDepth_Br, respectively.

The global position of the intersection of the base surface of the ski and the surface of the snow at the longitudinal tangential coordinate of the front AFD perch is denoted by XYZ_surface_Bf, and is calculated as follows: XYZ_surface_Bf=XYZ_e_Bf−bDepth_Bf $b_f$, where XYZ_e_Bf is the global position of the edge of the ski at the tangential coordinate of the front AFD perch, and $b_f$ is the local b orientation vector at the tangential coordinate of the front AFD perch. Similarly, the global position of the intersection of the base surface of the ski and the surface of the snow at the longitudinal tangential coordinate of the rear AFD perch is denoted by XYZ_surface_Br, and is calculated as follows: XYZ_surface_Br=XYZ_e_Br−bDepth_Br $b_r$, where XYZ_e_Br is the global position of the edge of the ski at the tangential coordinate of the rear AFD perch, and $b_r$ is the local b orientation vector at the tangential coordinate of the rear AFD perch. An imaginary vector (v_surface) is fitted between XYZ_surface_Bf and XYZ_surface_Br (pointing in the generally rearward direction); this v_surface vector is then converted into a unit vector. Another imaginary vector (b_horizontal) is defined as one that is horizontal and is perpendicular to the longitudinal axis of the ski at the centre of its effective base region (mid-base point), as follows: b_horizontal=[0, 1, 0], where the aforementioned vector includes X, Y, and Z ordered components. Finally, a third imaginary vector (n_surface) is defined as the cross product of v_surface and b_horizontal. An imaginary plane (P_surface) is defined as one that passes through XYZ_surface_Bf while having the surface normal n_surface. This P_surface plane represents the assumed surface of the snow.

At each discretization point (node), the ski design system 2000 calculates the amount by which the width of the ski must be increased such that the normal distance between the aforementioned imaginary P_surface plane and the edge of the ski (measured perpendicular to the P_surface plane) is approximately equal to the corresponding local value from the previously calculated dSnow_geom array; a new array (B_TorsionOffset) is created in order to store the required increase in width at each tangential coordinate (XmidB) along the length of the base of the ski (negative values of B_TorsionOffset correspond to required decreases in width). The width profile of the ski is then updated by adding B_TorsionOffset to the previously assumed width profile of the ski. The ShovelTailWidths function is then invoked in order to re-assign local width profiles to the shovel nodes and tail nodes such that the planform geometries of these regions satisfy the geometric relationships that were stipulated by the user.

At 2020N, the ski design system 2000 updates of the total curvature profile at the elevation of the flexural neutral axis of the ski (PhiTotalNA). For example, the ski design system can employ the PhiZOffset function to offset the PhiTotalB curvature profile by the relevant through-thickness distance. In addition, the ski design system 2000 also updates the tangential coordinate system at the elevation of the flexural neutral axis (XmidNA). For example, the ski design system 2000 can employ the XmidZOffset function to offset the XmidB coordinate system by the relevant through-thickness distance. At 2020N, the ski design system 2000 also updates the tangential coordinate system at the elevation of the base of the ski under camber conditions (XmidBcam). For example, the ski design system 2000 can employ the XmidZOffset function to offset the XmidNA coordinate system by the relevant through-thickness distance; this offsetting operation is carried out under both Cam0 conditions (XmidBcam0) and Cam1 conditions (XmidBcam1).

At 2020O, the ski design system 2000 checks for convergence. For example, convergence can be held to have been achieved when the current iteration of the optimization loop structure does not change significantly from the previous iteration of the optimization loop structure. The following ski design characteristics can be checked for convergence at the end of each iteration of the loop: snow penetration depth profile (dSnow_geom), core thickness profile, profile of elevations of the flexural neutral axis, CamRock0NA curvature profile, Cam Rock1NA curvature profile, total curvature profile under design point loaded conditions, and deflected binding geometry under design point loaded conditions. If the change in any of these parameters exceeds acceptable limitations, then the ski design system 2000 can return to the beginning of the optimization loop structure at 2020A for an additional iteration.

Once convergence has been achieved, system 2000 exits the optimization loop at 2030. As depicted in FIG. 14, the ski design system 2000 then carries out method 2030 to prepare final design specifications of the optimized ski. The method 2030 can be summarized by the following general sequence of steps: 2030A calculate the expected elastic spring-back; 2030B calculate the expected thermo-mechanical spring-back; 2030C generate the recommended camber mould elevation profile; 2030D calculate the planform geometry of each ply of the laminate; 2030E calculate the expected elevation contour geometry of the topsheet of the ski; 2030F format the design specification data for the output files; and 2030G write the output data files to memory.

At 2030A, the ski design system 2000 calculates the expected elastic spring-back that the ski will exhibit upon removal from the manufacturing tooling (mould) as a result of elastic strain energy that is stored within each constituent of the ski construction (plies of the laminate and solid components of the ski construction, such as edges, sidewalls, etc.).

For example, ski design system 2000 can begin by invoking the EI_JG function to recalculate the flexural stiffness of the complete ski at the optimization temperature control point (EI_TOpt_tot). Ski design system 2000 can then calculate the local flexural stiffness of each constituent of the ski construction (plies of the laminate and solid components of the ski construction, such as edges, sidewalls, etc.), wherein each of these calculations is carried out at the optimization temperature control point; these resulting local flexural stiffnesses are stored in an array (EI_TOpt_loc) containing data for each constituent of the ski at each tangential position along the length of the ski. The sum of the local constituent flexural stiffnesses (EI_TOpt_loc) can then be calculated and denoted by EI_TOpt_loc_sum.

For each constituent of the ski construction, the ski design system 2000 can then calculate the local curvature that is imposed upon said constituent under CamRock0B conditions, wherein said curvature is evaluated at the elevation of the local flexural neutral axis of the relevant constituent; the resulting local curvatures are stored in an array (PhiCamRock_loc) containing data for each constituent of the ski at each tangential position along the length of the ski. Ski design system 2000 can then calculate the elastic spring-back moments within each constituent of the ski (momB_CamRock_loc) as the product of El_Topt_loc and PhiCamRock_loc. The total spring-back moment at each tangential position (momB_CamRock_loc_sum) can then be calculated as the sum of the elastic spring-back moments within each constituent (momB_CamRock_loc). The expected elastic spring-back curvature of the ski (PhiSpringBackNA) can then be calculated as the negative of the sum of elastic spring-back moments (momB_CamRock_loc_sum) divided by the difference between the flexural stiffness of the complete ski (El_TOpt_tot) and the sum of the flexural stiffnesses of each constituent of the ski (El_TOpt_loc_sum).

At 2030B, the ski design system 2000 calculates the expected thermally-induced spring-back (thermo-mechanical spring-back) that the ski will exhibit upon removal from the manufacturing tooling (mould) as a result of processing-induced residual thermal strain energy that is generated within each constituent of the ski construction (plies of the laminate and solid components of the ski construction, such as edges, sidewalls, etc.).

For example, at each of the temperature control points (TBuild, TOpt, and TCont), ski design system 2000 can calculate the longitudinal stiffness and flexural stiffness of the ski (using a method similar to that employed by the EI_JG function).

In addition, at each of the temperature control points, system 2000 can also calculate the thermal strains and curvatures of the full laminate in accordance with Classical Laminate Plate Theory (CLPT) using the secant CLTE values that were calculated for each material as well as the total change in temperature between the cure temperature and the relevant temperature control point. The thermally-induced flexural curvature profile (thermo-mechanical flexural curvature profile) that is expected to be exhibited at the optimization temperature control point is stored in array that is denoted by PhiTherm_TOpt.

System 2000 can then calculate the camber curvature profiles that are expected to be exhibited by the ski (at the elevation of its flexural neutral axis) at each of the temperature control points (PhiCamRockNA_TBuild at the TBuild temperature, PhiCamRockNA_TOpt at the TOpt temperature, and PhiCamRockNA_TCont at the TCont temperature) as the sum of the targeted CamRockONA curvature profile and the difference between the thermo-mechanical flexural curvature profile that was calculated at the relevant temperature control point and the thermo-mechanical curvature profile that was calculated at the optimization temperature control point. Using the camber curvature profiles that were calculated at each temperature control point, system 2000 can then calculate the corresponding expected camber elevation profile at each temperature control point in Cartesian coordinates.

At step 2030C, the ski design system 2000 generates the recommended camber tooling (mould) elevation profile (the camber mould elevation profile) that would ensure that the targeted camber elevation profile is achieved in light of the expected elastic spring-back and thermo-mechanical spring-back. The overall geometry of the camber tooling (mould), when viewed in elevation, is referred to as the "camber mould elevation profile", wherein said elevation profile exists on a plane that is parallel to the longitudinal axis of the ski and perpendicular to the base surface of the ski. The "camber mould curvature profile" defines the curvature of the camber mould elevation profile at any position along the length of the ski, wherein said curvature is measured within a plane that is parallel to the longitudinal axis of the ski and perpendicular to the base surface of the ski.

For example, the camber mould curvature profile can be evaluated at the elevation of the flexural neutral axis of the ski (PhiCamRockNA_Mould) by calculating the difference between the CamRockONA curvature profile and the sum of PhiSpringBackNA and PhiTherm_TOpt. The ski design system 2000 may also enable a user to further modify the camber mould curvature profile by providing an optional empirical curvature offsetting array (CamRockB_Offset), which is stipulated at the elevation of the base of the ski. The PhiZOffset function can then be invoked in order to offset the CamRockB_Offset array to the elevation of the flexural neutral axis of the ski, resulting in a new empirical curvature offsetting array denoted by Cam RockNA_Offset. The Cam RockNA_Offset curvature offsetting array is then added to the previously calculated PhiCamRockNA_Mould array. Finally, the camber mould curvature profile (PhiCamRock_Mould) is evaluated along the surface contour of the camber mould by invoking the PhiZOffset function to offset the PhiCamRockNA_Mould to the elevation of the base of the ski. In addition, a tangential coordinate system along the surface of the mould (XmidBcam_Mould) is created by employing the XmidZOffset function to offset XmidNA to the elevation of the base surface of the ski, while observing the PhiCamRockNA_Mould curvature profile. Using the camber mould curvature profile (PhiCamRock_Mould) and the corresponding tangential coordinates along the surface of the mould (XmidBcam_Mould), system 2000 calculates the recommended camber mould elevation profile in Cartesian coordinates ($XYZ_{Mould}$).

At 2030D, the ski design system 2000 calculates the planform geometry of each ply of the laminate, assuming that it has been flattened, such that it is representative of the geometry that said ply would exhibit before it has been laminated in a ski press.

For example, at each tangential coordinate along the length of the ski, the width of each ply can be calculated as a function of the total width of the ski, the thickness of the core, and the user-stipulated construction and cross sectional geometry of the ski. For each tangential coordinate along the length of the base of the ski, there exists a corresponding array of tangential coordinates at the mid-plane of each ply within the laminate; these tangential coordinates can be calculated for each ply of the laminate, as follows.

At each position (node point) along the surface of the camber mould elevation profile ($XYZ_{Mould}$), system 2000 calculates the orientation of the local normal vector to the surface of the mould, and stores this collection of normal vectors in an array ($n_{Mould}$), wherein each vector within the $n_{Mould}$ array is of unit length. In addition, system 2000 calculates the angles of inclination of the $n_{Mould}$ vectors relative to the global Z-axis, measured about the global Y-axis, and stores the resulting angles in an array ($\theta_{nMould}$). It is assumed that each ply comprises a series of ply nodes and ply elements along the mid-plane of said ply, wherein these ply nodes and ply elements correspond to the nodes and elements of the ski, respectively.

Each ply element is bound by ply two nodes: one at its forward extremity and one at its rearward extremity. The bounding ply node that is closer to the mid-base of the ski will be referred to as the inside ply node, whereas the bounding ply node that is more distant from the mid-base of the ski will be referred to as the outside ply node. Each ply node corresponds to a tangential position (XmidBcam_Mould) along the length of the camber mould elevation profile, and the position of each ply node is expressed in terms of its global ($XYZ_{Ply}$) coordinates. The local elevation of the mid-plane of the ply of interest ($z_{Ply}$), measured perpendicular to the base surface of the ski, is calculated at each tangential position as the sum of the thicknesses of all of the plies beneath the ply of interest, plus half of the thickness of the ply of interest. For the ply of interest, the global Cartesian coordinates at each ply node are calculated as follows: $XYZ_{Ply} = XYZ_{Mould} + n_{Mould} z_{Ply}$.

Although each ply element is generally curved, the chord length of each ply element ($C_{Ply\_E}$) can be calculated by finding the difference between the $XYZ_{Ply}$ coordinates that correspond to the outer ply node and the $XYZ_{Ply}$ coordinates that correspond to the inter ply node, and then calculating the scalar magnitude of the resultant vector. The arc length of each ply element can then be calculated, as follows:

$$S_{Ply\_E} = \left| \frac{C_{Ply\_E} d\theta_{nMould}}{2 \sin\left(\frac{d\theta_{nMould}}{2}\right)} \right|,$$

where $d\theta_{nMould}$ is the difference between the $\theta_{nMould}$ value that corresponds to the outer ply node and the $\theta_{nMould}$ value that corresponds to the inner ply node. A local tangential coordinate system along the length of the mid-plane of the ply of interest (XmidPly) is then created by assuming a datum at the centre of the ski's effective base region (mid-base point), and propagating outwards from this datum, one ply element at a time. As such, the local tangential coordinate (XmidPly) that corresponds to each ply node is calculated as the sum of the lengths of all of the ply elements between the ply node of interest and the mid-base point of the ski, where the length of each ply element is taken as $S_{Ply\_E}$.

Step 2030E of system 2000 calculates the expected elevation contour geometry of the topsheet of the completed ski 3000, assuming that the ski has been de-cambered onto a flat surface with an edging angle of zero. These data may be valuable when designing a binding interface plate 4200 such that it closely conforms to the topsheet geometry of the ski 3000.

At 2030F, the ski design system 2000 formats design specification data for output files. It will be appreciated that the ski design system 2000 can format a wide variety of different data.

For example, the design specification data may include the planform geometry and thickness profile of each ply of the laminate, provided in terms of the longitudinal tangential coordinate system of the corresponding ply (XmidPly). The data may also include Engineering_Data, which summarizes engineering data pertaining to the profiles of the following properties along the longitudinal tangential coordinates (XmidB) along the base of the ski: width, camber curvature, flexural stiffness, torsional stiffness, and elevation of flexural neutral axis. In some embodiments, four versions of Engineering_Data can be created, representing the geometry and mechanical characteristics of the ski at each of the three temperature control points (TBuild, TOpt, and TCont), as well as the target response (which, in theory, should be identical to the response at the TOpt temperature control point). These engineering data may be used to carry out analytical and/or computational simulations to predict the expected performance of the ski design under various conditions, as well as to verify the accuracy of construction of the as-built skis.

In some embodiments, the design specification data may also include Countours_of_Binding_Interface_Plates, which provides the elevation contours of the topsheet of the ski (when fully de-cambered onto a flat surface with an edging angle of zero), as well as the targeted elevation of the upper surface of the as-installed binding interface plate. In some embodiments, the data may include Extrapolated_Countours_of_Binding_Interface_Plates, which is similar to "Countours_of_Binding_Interface_Plates", but includes the data covering the entire length of the ski.

In some embodiments, the design specification data may also include Mould_Surface_for_Camber_Profile, which provides detailed elevation geometry data (global Cartesian coordinates and curvature values at corresponding tangential positions) necessary to create the recommended camber mould elevation profile.

In some embodiments, the design specification data may also include Target_Camber_Profile, which provides detailed elevation geometry data (global Cartesian coordinates and curvature values at corresponding tangential positions) that describe the targeted Cam Rock0B elevation profile. These camber elevation profile data can be used to verify accuracy of construction of the as-built ski.

At 2030G, the ski design system 2000 writes the output files formatted at 2030F to memory. The ski design system 2000 may be stored in a variety of formats, such as, but not limited to, text files (e.g., .txt, .csv, etc.), graphical files (e.g., .jpg, .tiff, etc.), and/or computer-aided design (CAD) or computer-aided manufacturing (CAM) files.

It will be appreciated that the ski design system 2000 can simultaneously account for flexural deformations and torsional deformations, while still achieving the precise snow trace geometry and snow pressure distribution that are targeted during the initialization phase of the solution. This is made possible by the unique processing operations and sequencing of the processing operations that are employed by the ski design system 2000. As described above, the ski design system 2000 assumes zero torsional deformation for the purpose of initially defining the approximate deformed shape (only flexural deformations) and width profile that would be necessary to achieve a targeted snow trace geometry and snow loading distribution (snow load profile); the ski design system 2000 then proceeds with designing a ski that would achieve said flexural deformation; the ski design system 2000 then finds the total deformation that the resulting ski design would exhibit, while accounting for both bending and torsion; the ski design system 2000 then makes adjustments to compensate for the calculated torsional deformation, while ensuring that the resulting snow loading distribution remains essentially unchanged; the ski design system 2000 then repeats the aforementioned processes until it has converged upon a stable design solution. Adjustments that are made to compensate for the effects of non-zero torsional deformation are carried out in a manner that ensures that the resulting snow loading distribution remains essentially unchanged between successive iterations of the optimization loop; resulting in successful convergence of the optimization solution.

By initially neglecting the effects of torsional deformation and then later making adjustments to account for the presence of non-zero torsional deformation, the optimization problem is dramatically simplified, and it becomes possible to reliably achieve convergence even under highly non-linear conditions (such as: use of non-linear constitutive snow models and/or inclusion of geometric non-linearities due to large deformations of the ski). This simplified solution to the optimization problem also facilitates the inclusion of numerous fidelity-improving details (such as a non-linear constitutive snow model, complex boot-binding loadings, etc.), which might otherwise be precluded from inclusion in the optimization solution due to logistical challenges.

With the ski design system 2000, it may be possible for a user to stipulate an exact snow trace geometry and snow pressure distribution. The ski design system 2000 can then rapidly find a design solution that will precisely satisfy these optimization criteria.

It should be noted that the ski design system 2000 is most applicable to designs that are dominated by flexural deformation. A ski that exhibits total deformations that comprise substantial torsional compliance may present a challenging optimization problem for the ski design system 2000; hence, extremely wide skis and/or snowboards may constitute more challenging optimization problems. Nevertheless, the ski design system 2000 may be able to generate designs for skis having waist widths that are near the upper limit (90 mm) of what is generally considered acceptable for on-piste carving skis. Also, for wider skis and snowboards, the ski design system 2000 may be able to achieve convergence at an acceptable rate provided that slightly more generous convergence tolerances are employed.

It should be appreciated that the ski design system 2000 can employ an adjustment to the camber curvature profile in order to compensate for regions that exhibit sub-optimal flexural stiffness. This need to adjust the camber curvature profile may arise, for example, as a result of the fact that it is not practicable to build a ski that exhibits a flexural stiffness profile that tapers to zero at the tip and tail of the ski, thus leading to the existence of regions of the ski that exhibit excessive flexural stiffness; in this case, it may be necessary to add strategically placed rocker to some regions of the camber curvature profile.

It will also be appreciated that ski design system 2000 can strategically define a camber elevation profile for the purpose of achieving a nearly optimal snow trace geometry and snow loading distribution at two distinct design points; in effect, the ski design system 2000 can design the camber elevation profile of a ski such that the ski will achieve a desired relationship between ski-snow interaction and edging angle.

It is generally understood that most alpine race skis and on-piste carving skis exhibit camber geometries that are defined for two primary purposes: to ensure that snow loads are distributed over the length of the ski in a desired manner, and to prescribe the amount of strain energy that is to be stored in the ski during each carved turn. While the aforementioned characteristics are, in fact, directly linked to the camber elevation profile of a ski, the present inventor does not believe that they, alone, should drive the design process for the camber elevation profile. The manner in which the ski-snow interaction varies as a function of edging angle is also directly linked to the design of the camber elevation profile, and the present inventor believes that this characteristic should be treated with importance when designing the camber elevation profile of alpine race skis and on-piste carving skis. As such, the ski design system 2000 can define the camber elevation profile primarily as a function of this ski-snow interaction verses edging angle relationship. It should be noted, however, that in some embodiments, the inputs of the ski design system 2000 can be adjusted in order to arrive upon a compromise between a desired camber height (for example, for the purpose of achieving a desired amount of strain energy in a given turn) and a desired ski-snow interaction verses edging angle relationship.

In some embodiments, a mathematical optimization software application may be configured to perform one or more of the steps of methods 100, 200, 2010, 2020, and 2030.

In some embodiments, the finite element method can be used to perform one or more of the steps of methods 100, 200, 2010, 2020, and 2030. That is, the finite element method may be used by the ski design system 2000 to provide structural analysis and/or snow modeling. For example, the finite element method may be used to calculate the three-dimensional shape of the ski at 2020A, calculate the snow loading distribution at 2020B, calculate the binding geometry and binding loads at 2020C, calculate the bending and torsion moments at 2020D, etc. The finite element method may consider the effects of three-dimensional strains, including, but not limited to: transverse shear, longitudinal bending about the n-axis, and local lateral bending about the v-axis. As such, use of the finite element method may facilitate more accurate analyses of ski construction architectures that include extremely compliant (soft) materials, such as viscoelastic and/or elastomeric damping layers that may be included within the laminate. In some embodiments, it may be necessary to create a rigid representation of the ski in its assumed deformed shape in order to facilitate an initial calculation of the snow loads that are imposed upon the ski.

In some embodiments, multibody simulation (such as multibody dynamics software) can be used to perform one or more of the steps of methods 100, 200, 2010, 2020, and 2030. That is, multibody simulation may be used by the ski design system 2000 to provide structural analyses of the ski and/or boot-binding system. For example, the ski can be represented by a series of rigid bodies that are connected by springs having calibrated stiffnesses, such that the overall flexural and torsional response of this chain of rigid bodies and springs approximates the intended flexural and torsional response of the ski.

In some embodiments, a hybrid of various analytical and/or computational methods can be used to perform one or more of the steps of methods 100, 200, 2010, 2020, and 2030. In some of such cases, it may be beneficial to employ a combination of both the finite element method and multibody simulation techniques in order to assess the behaviour of the ski and boot-binding systems. For example, in some embodiments that employ the finite element method to model the behaviour of the ski, the boot-binding system can be modeled using multibody simulation, and the resulting forces and moments that are calculated by said multibody simulation can then be applied to the finite element model of the ski.

In some embodiments, the boot-binding system can be represented by a more simplistic system of forces and moments. In these embodiments, it may be unnecessary to collect information (geometry, load-deflection response, etc.) pertaining to each individual component of the boot-binding system; instead, experiments can be carried out in order to directly ascertain how the boot-binding system affects the flexural response of the ski, and this effect is imposed upon the ski as a function of the curvature of the ski and/or the relative angle between the mounting points of the toe-cup and heel-cup of the binding system.

For example, a surrogate ski of known flexural stiffness can be instrumented with a series of load transducers fitted between the upper surface of the ski and the lower surface of the binding system; as this surrogate ski is deformed, the loads measured by the load transducers can be measured as a function of the relative angle between the mounting points of the toe-cup and heel-cup of the binding system, or alternatively, as a function of the flexural curvature that is exhibited by the ski within the vicinity of the boot-binding system. Upon completion of this test, it would then be possible to describe the loads that the boot-binding system imposes upon the ski as a function of the relative angle between the mounting points of the toe-cup and heel-cup of the binding system, or alternatively, as a function of the flexural curvature that is exhibited by the ski within the vicinity of the boot-binding system.

As described above, the inputs of the ski design system 2000 can include some quantitative values that help to describe the skiing technique that is employed by the athlete, such as: the targeted tangential position of the athlete loading centroid along the length of the ski; values of $\theta_{e_{DP}}$, $\theta_{e_{CP1}}$, and $\theta_{e_{CP2}}$; and data to ascertain the values of $F_{nDP}$, $F_{nCP1}$, and $F_{nCP2}$. In some embodiments, some or all of the aforementioned input data can be collected by way of an instrumented experimental test, as follows. An existing pair of skis that is similar to that which is to be designed can be equipped with a portable electronic data acquisition system (data logger) that is connected to a few small instruments and/or sensors, such as: a triaxial accelerometer, a triaxial gyroscope (such as a vibrating structure gyroscope, or Coriolis vibratory gyroscope), and an array of pressure sensors and/or force sensors (such as load cells and/or thin-film force sensitive resistors) mounted in the vicinity of the boot-binding system. The aforementioned instrumentation may be integrated into a binding interface plate system, such that the athlete is not able to perceive (or be disturbed by) its presence while using said skis.

With the data logger collecting data from each of the aforementioned instruments at some predetermined sampling rate, the athlete would then ski on said instrumented skis under conditions that are similar to those for which a new ski design is to be optimized by system 2000. The data that is collected by each instrument may then be smoothed and/or filtered in order to remove noise, and then the resulting data could be processed in order to ascertain meaningful metrics that correspond to each sample time of the logged data; such metrics could include, but would not be limited to: the tangential position of the athlete loading centroid along the length of the ski, the edging angle of the ski ($\theta_e$), and the component of the total force that acts perpendicular to the base surface of the ski ($F_n$).

Figure 15:
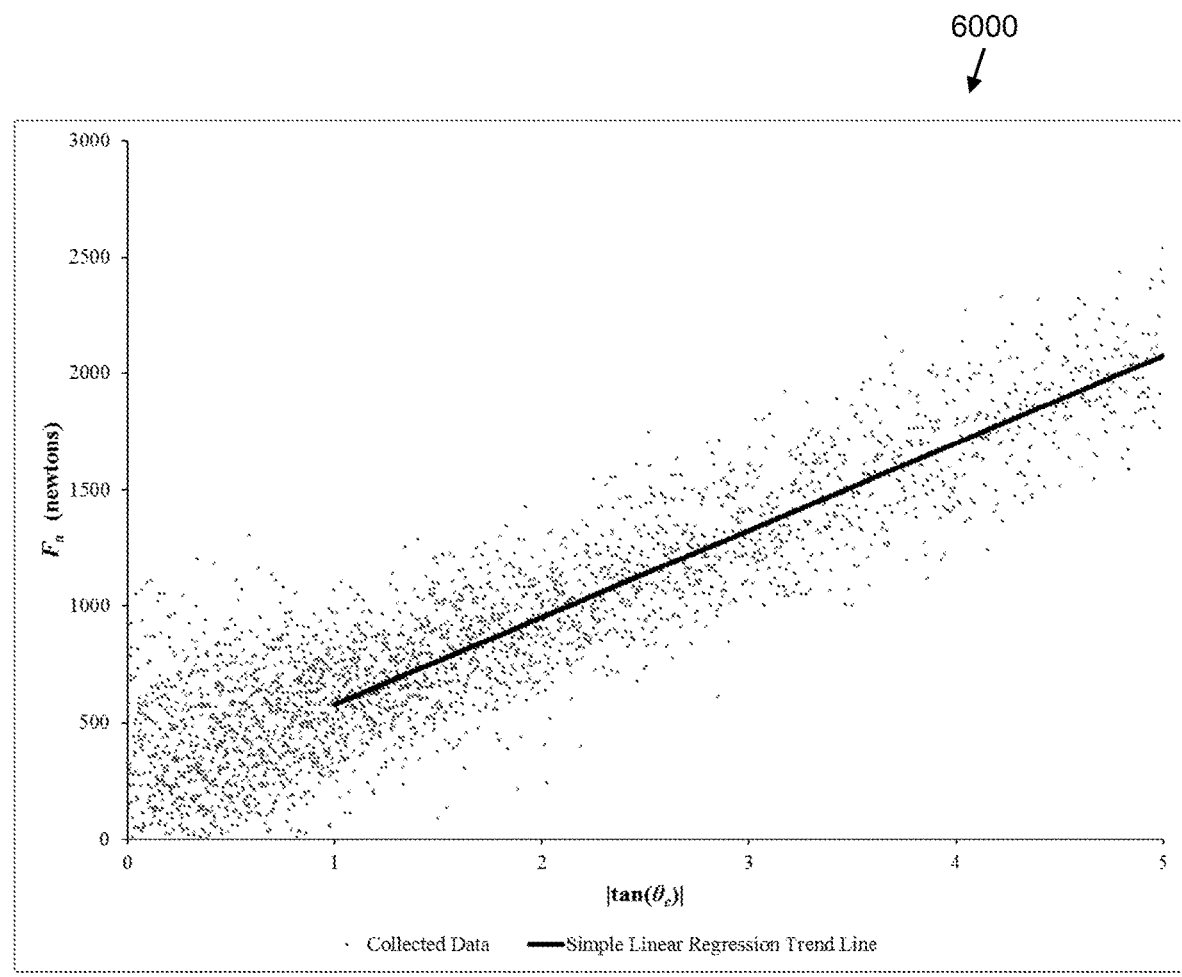
FIG. 15 shows a hypothetical graph illustrating a relationship between normal forces applied to a ski and the absolute value of the tangent of the corresponding edging angles of the ski.

A two-dimensional plot could be created, wherein each $F_n$ value is plotted against the absolute value of the tangent of the corresponding $\theta_e$ value. FIG. 15 depicts a fabricated hypothetical example of such a plot 6000. A simple linear regression trend line can be fitted through the resulting data plot; said trend line could be described by an equation of the form: $F_n = b_{tl} + m_{tl}|\tan(\theta_e)|$, where $m_{tl}$ is the slope of the trend line, and $b_{tl}$ is the intercept of the trend line with the $F_n$-axis. A user could select a value of $\theta_{e_{DP}}$, and the corresponding value of $F_{nDP}$ could be calculated as: $F_{nDP} = b_{tl} + m_{tl}|\tan(\theta_{e_{DP}})|$. Similarly, a user could select a value of $\theta_{e_{CP1}}$, and the corresponding value of could be calculated as: $F_{nCP1} = b_{tl} + m_{tl}|\tan(\theta_{e_{CP1}})|$. Finally, a user could select a value of $\theta_{e_{CP2}}$, and the corresponding value of $F_{nCP2}$ could be calculated as: $F_{nCP2} = b_{tl} + m_{tl}|\tan(\theta_{e_{CP2}})|$.

Referring to FIG. 15, it is expected that $F_n$ values that correspond to edging angles ($\theta_e$) that are close to zero will likely exhibit inclement levels of scatter; this expectation is due, in part, to the fact that an athlete typically conducts a broad variety of manoeuvres with his/her skis oriented approximately flat on the snow. When an athlete is standing still on his/her skis on level terrain, the measured edging angles ($\theta_e$) will be close to zero, and the corresponding $F_n$ values measured by each ski will be approximately equal to half of the static weight of the athlete.

Conversely, when linking multiple carved turns, an athlete often briefly unloads his/her skis while transitioning between the right and left edges of his/her skis; consequently, a ski that is in the process of linking multiple carved turns may undergo relatively low $F_n$ values (less than half of the static weight of the athlete) as its orientation passes through edging angles that are close to zero.

In order to alleviate the influence of inclement scatter exhibited by the $F_n$ values that correspond to edging angles ($\theta_e$) that are close to zero, in some embodiments, the aforementioned simple linear regression trend line may be only fitted through data that correspond to edging angle magnitudes that are greater than some minimum value. This may help to ensure that said trend line is only representative of carved turns, and is not adversely influenced by other manoeuvres. For example, plot 6000 has been constructed with said linear regression trend line fitted through data that correspond to $|\tan(\theta_{e_{CP2}})|$ values that are greater than unity.

It will be appreciated that numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description and the drawings are not to be considered as limiting the scope of the embodiments described herein in any way, but rather as merely describing the implementation of the various embodiments described herein.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that the term "coupled" used herein indicates that two elements can be directly coupled to one another or coupled to one another through one or more intermediate elements. Furthermore, the term "body" typically refers to the body of a patient, a subject or an individual who receives the ingestible device. The patient or subject is generally a human or other animal.

The embodiments of the systems and methods described herein may be implemented in hardware or software, or a combination of both. These embodiments may be implemented in computer programs executing on programmable computers, each computer including at least one processor, a data storage system (including volatile memory or non-volatile memory or other data storage elements or a combination thereof), and at least one communication interface. For example and without limitation, the programmable computers (referred to herein as computing devices) may be a server, network appliance, embedded device, computer expansion module, a personal computer, laptop, personal data assistant, cellular telephone, smart-phone device, tablet computer, a wireless device or any other computing device capable of being configured to carry out the methods described herein.

In some embodiments, the communication interface may be a network communication interface. In embodiments in which elements are combined, the communication interface may be a software communication interface, such as those for inter-process communication (IPC). In still other embodiments, there may be a combination of communication interfaces implemented as hardware, software, and combination thereof.

Program code may be applied to input data to perform the functions described herein and to generate output information. The output information is applied to one or more output devices, in known fashion.

Each program may be implemented in a high level procedural or object oriented programming and/or scripting language, or both, to communicate with a computer system. However, the programs may be implemented in assembly or machine language, if desired. In any case, the language may be a compiled or interpreted language. Each such computer program may be stored on a storage media or a device (e.g. ROM, magnetic disk, optical disc) readable by a general or special purpose programmable computer, for configuring and operating the computer when the storage media or device is read by the computer to perform the procedures described herein. Embodiments of the system may also be considered to be implemented as a non-transitory computer-readable storage medium, configured with a computer program, where the storage medium so configured causes a computer to operate in a specific and predefined manner to perform the functions described herein.

Furthermore, the system, processes and methods of the described embodiments are capable of being distributed in a computer program product comprising a computer readable medium that bears computer usable instructions for one or more processors. The medium may be provided in various forms, including one or more diskettes, compact disks, tapes, chips, wireline transmissions, satellite transmissions, internet transmission or downloadings, magnetic and electronic storage media, digital and analog signals, and the like. The computer useable instructions may also be in various forms, including compiled and non-compiled code.

Various embodiments have been described herein by way of example only. Various modification and variations may be made to these example embodiments without departing from the spirit and scope of the invention, which is limited only by the appended claims.

I claim:

1. A computer-implemented method for generating a design for a gliding board, the method comprising operating a processor to:
   define a desired carved turn of the gliding board, the desired carved turn being defined at least by a nominal edging angle and an athlete load profile, wherein the athlete load profile represents a load that is applied by an athlete to the gliding board during the desired carved turn;
   define a desired global curvature profile, wherein the desired global curvature profile corresponds to a desired snow trace profile for the desired carved turn;
   generate a desired deformed shape of the gliding board during the desired carved turn, the desired deformed shape of the gliding board being defined at least by a desired total curvature profile, wherein the desired total curvature profile is initially set to correspond to the desired global curvature profile;
   generate a sidecut profile of the gliding board;
   generate a width profile of the gliding board based at least on the sidecut profile;
   generate a camber profile of the gliding board;
   generate at least one stiffness design variable profile, wherein the at least one stiffness design variable profile, in conjunction with at least the width profile and at least one gliding board material property, dictates at least a resulting flexural stiffness profile and at least one resulting auxiliary stiffness profile of the gliding board;
   generate a total load profile based at least on the athlete load profile, wherein the total load profile represents a total load that is applied to the gliding board during the desired carved turn, and wherein generating the total load profile comprises generating a desired snow penetration depth profile;
   modify at least the width profile, the sidecut profile and at least one of the at least one stiffness design variable profile at least once by:
      calculating a desired flexural stiffness profile of the gliding board based at least on the total load profile, such that the gliding board approximately achieves the desired total curvature profile during the carved turn;
      modifying at least one of the at least one stiffness design variable profile such that the resulting flexural stiffness profile is approximately equal to the desired flexural stiffness profile;
      calculating at least one auxiliary deformation profile of the gliding board during the carved turn based at least on the total load profile;
      modifying the desired total curvature profile based at least on the at least one auxiliary deformation profile in order to achieve a resulting global curvature profile that is approximately equal to the desired global curvature profile during the carved turn;
      modifying the sidecut profile based at least on the at least one auxiliary deformation profile in order to achieve a resulting snow penetration depth profile that is approximately equal to the desired snow penetration depth profile; and
      modifying the width profile based at least on the modified sidecut profile; and
   define the design for the gliding board based at least on the width profile, the camber profile, and the at least one stiffness design variable profile.

2. The method of claim 1, wherein modifying at least the width profile, the sidecut profile and at least one of the at least one stiffness design variable profile at least once comprises:
   iteratively repeating the steps of calculating the desired flexural stiffness profile, modifying at least one of the at least one stiffness design variable profile, calculating the at least one auxiliary deformation profile, modifying the desired total curvature profile, modifying the sidecut profile, and modifying the width profile until a difference between at least one of the width profile, the sidecut profile, and at least one of the at least one stiffness design variable profile associated with a current iteration and at least one of the width profile, the sidecut profile, and at least one of the at least one stiffness design variable profile associated with the previous iteration is less than a predetermined threshold.

3. The method of claim 1, wherein defining the desired global curvature profile comprises:
defining the desired global curvature profile to correspond to a carved turn that exhibits an approximately constant turning radius.

4. The method of claim 1, wherein each of the desired global curvature profile and the resulting global curvature profile embodies a curvilinear form that can be determined by projecting a curvilinear geometry of a corresponding snow trace profile onto an oblique projection plane that is inclined with respect to the plane on which the respective snow trace profile exists.

5. The method of claim 1, wherein generating the sidecut profile comprises:
defining a desired geometry of a snow penetration depth profile, wherein the snow penetration depth profile represents the penetration depth of the gliding board into snow during the desired carved turn; and
generating the sidecut profile based at least on the desired global curvature profile, the desired geometry of the snow penetration depth profile, and the nominal edging angle.

6. The method of claim 5, wherein defining the desired geometry of the snow penetration depth profile comprises:
defining the desired geometry of the snow penetration depth profile to approximately follow a linear function over a length of an effective base region of the gliding board.

7. The method of claim 1, wherein generating the camber profile comprises:
determining a first total curvature profile of the gliding board and a first load profile of the gliding board corresponding to a first gliding board edging angle;
determining a second total curvature profile of the gliding board and a second load profile of the gliding board corresponding to a second gliding board edging angle; and
generating the camber profile such that it facilitates a gliding board design that is capable of satisfying the first total curvature profile with the first load profile, and is also capable of satisfying the second total curvature profile with the second load profile.

8. The method of claim 1, wherein at least one of the at least one stiffness design variable profile comprises a core thickness profile of the gliding board.

9. The method of claim 1, wherein calculating the desired flexural stiffness profile comprises:
calculating the desired flexural stiffness profile of the gliding board based at least on the camber profile, the desired total curvature profile, and the total load profile.

10. The method of claim 1, wherein modifying at least one of the at least one stiffness design variable profile comprises:
finding the at least one stiffness design variable profile such that the resulting flexural stiffness profile is approximately equal to the desired flexural stiffness profile, wherein the at least one stiffness design variable profile comprises a plurality of local stiffness design variable values, wherein each local stiffness design variable value is limited to a predetermined range of allowable values.

11. The method of claim 10, wherein modifying at least the width profile, the sidecut profile and at least one of the at least one stiffness design variable profile at least once further comprises modifying the camber profile at least once by:
determining a resulting flexural stiffness profile of the gliding board based at least on the at least one stiffness design variable profile, the width profile, and at least one gliding board material property;
determining a resulting flexural curvature profile based at least on the resulting flexural stiffness profile and the total load profile; and
modifying the camber profile based at least on the resulting flexural curvature profile and the desired total curvature profile.

12. The method of claim 1, wherein at least one of the at least one auxiliary deformation profile is a torsional deformation profile and at least one of the at least one resulting auxiliary stiffness profile is a resulting torsional stiffness profile, and wherein calculating the at least one auxiliary deformation profile comprises:
determining the resulting torsional stiffness profile of the gliding board based at least on the at least one stiffness design variable profile, the width profile, and at least one gliding board material property; and
generating the torsional deformation profile based at least on the resulting torsional stiffness profile and the total load profile.

13. The method of claim 1, wherein the total load profile comprises a snow load profile, and wherein generating the total load profile comprises calculating the snow load profile by:
determining a desired snow penetration depth profile such that a total magnitude of the resulting snow load profile is approximately equal to the total magnitude of a relevant component of the athlete load profile, and such that a position of a centroid of the resulting snow load profile is approximately equal to a position of a centroid of the relevant component of the athlete load profile.

14. The method of claim 1, wherein the total load profile comprises the athlete load profile.

15. The method of claim 1, wherein the total load profile comprises at least one binding load profile.

16. The method of claim 1, wherein modifying the desired total curvature profile comprises:
determining a resulting deformed shape of the gliding board during the carved turn based at least on the desired total curvature profile and the at least one auxiliary deformation profile;
determining a position and an orientation for the resulting deformed shape of the gliding board, wherein the position and orientation correspond to the desired snow penetration depth profile;
determining a resulting snow trace profile based at least on the resulting deformed shape of the gliding board and the determined position and orientation;
determining a resulting global curvature profile based at least on the resulting snow trace profile;
comparing the resulting global curvature profile to the desired global curvature profile; and
modifying the desired total curvature profile based at least on the comparison between the resulting global curvature profile and the desired global curvature profile.

17. The method of claim 16, wherein determining the position and the orientation for the resulting deformed shape of the gliding board comprises:
determining at least one anchor point along a length of the gliding board; and
determining the position and the orientation for the resulting deformed shape of the gliding board such that, at each of the at least one anchor point, a resulting snow penetration depth is approximately equal to a corresponding desired snow penetration depth value from the desired snow penetration depth profile.

18. The method of claim 1, wherein modifying the sidecut profile comprises:
   determining a resulting deformed shape of the gliding board during the carved turn based at least on the desired total curvature profile and the at least one auxiliary deformation profile;
   determining a position and an orientation for the resulting deformed shape of the gliding board, wherein the position and orientation correspond to the desired snow penetration depth profile; and
   modifying the sidecut profile such that a resulting snow penetration depth profile is approximately equal to the desired snow penetration depth profile.

19. The method of claim 18, wherein determining the position and the orientation for the resulting deformed shape of the gliding board comprises:
   determining at least one anchor point along a length of the gliding board; and
   determining the position and the orientation for the resulting deformed shape of the gliding board such that, at each of the at least one anchor point, a resulting snow penetration depth is approximately equal to a corresponding desired snow penetration depth value from the desired snow penetration depth profile.

20. The method of claim 1, wherein modifying at least the width profile, the sidecut profile and at least one of the at least one stiffness design variable profile at least once further comprises:
   modifying the total load profile based at least on the athlete load profile.

21. A gliding board having a design that is generated by a computer-implemented method, the method comprising operating a processor to:
   define a desired carved turn of the gliding board, the desired carved turn being defined at least by a nominal edging angle and an athlete load profile, wherein the athlete load profile represents a load that is applied by an athlete to the gliding board during the desired carved turn;
   define a desired global curvature profile, wherein the desired global curvature profile corresponds to a desired snow trace profile for the desired carved turn;
   generate a desired deformed shape of the gliding board during the desired carved turn, the desired deformed shape of the gliding board being defined at least by a desired total curvature profile, wherein the desired total curvature profile is initially set to correspond to the desired global curvature profile;
   generate a sidecut profile of the gliding board;
   generate a width profile of the gliding board based at least on the sidecut profile;
   generate a camber profile of the gliding board;
   generate at least one stiffness design variable profile, wherein the at least one stiffness design variable profile, in conjunction with at least the width profile and at least one gliding board material property, dictates at least a resulting flexural stiffness profile and at least one resulting auxiliary stiffness profile of the gliding board;
   generate a total load profile based at least on the athlete load profile, wherein the total load profile represents a total load that is applied to the gliding board during the desired carved turn, and wherein generating the total load profile comprises generating a desired snow penetration depth profile;
   modify at least the width profile, the sidecut profile and at least one of the at least one stiffness design variable profile at least once by:
      calculating a desired flexural stiffness profile of the gliding board based at least on the total load profile, such that the gliding board approximately achieves the desired total curvature profile during the carved turn;
      modifying at least one of the at least one stiffness design variable profile such that the resulting flexural stiffness profile is approximately equal to the desired flexural stiffness profile;
      calculating at least one auxiliary deformation profile of the gliding board during the carved turn based at least on the total load profile;
      modifying the desired total curvature profile based at least on the at least one auxiliary deformation profile in order to achieve a resulting global curvature profile that is approximately equal to the desired global curvature profile during the carved turn;
      modifying the sidecut profile based at least on the at least one auxiliary deformation profile in order to achieve a resulting snow penetration depth profile that is approximately equal to the desired snow penetration depth profile; and
      modifying the width profile based at least on the modified sidecut profile; and
   define the design for the gliding board based at least on the width profile, the camber profile, and the at least one stiffness design variable profile.

* * * * *